United States Patent
Zhang et al.

(10) Patent No.: US 10,725,853 B2
(45) Date of Patent: Jul. 28, 2020

(54) SYSTEMS AND METHODS FOR MEMORY FAILURE PREVENTION, MANAGEMENT, AND MITIGATION

(71) Applicant: Formulus Black Corporation, Jersey City, NJ (US)

(72) Inventors: Yin Zhang, Jersey City, NJ (US); Nafees Ahmed Abdul, Harrison, NJ (US); Boyu Ni, Weehawken, NJ (US); Gautham Reddy Kunta, Harrison, NJ (US); Andrei Khurshudov, Niwot, CO (US); Stephen J. Sicola, Monument, CO (US)

(73) Assignee: Formulus Black Corporation, Jersey City, NJ (US)

( * ) Notice: Subject to any disclaimer, the term of this patent is extended or adjusted under 35 U.S.C. 154(b) by 0 days.

(21) Appl. No.: 16/730,589

(22) Filed: Dec. 30, 2019

(65) Prior Publication Data

US 2020/0210272 A1    Jul. 2, 2020

Related U.S. Application Data

(60) Provisional application No. 62/787,496, filed on Jan. 2, 2019, provisional application No. 62/834,575, filed on Apr. 16, 2019.

(51) Int. Cl.
*G06F 11/07* (2006.01)
*G06F 12/02* (2006.01)
*G06F 3/06* (2006.01)

(52) U.S. Cl.
CPC ........ *G06F 11/0793* (2013.01); *G06F 3/0688* (2013.01); *G06F 11/073* (2013.01); *G06F 11/076* (2013.01); *G06F 12/0246* (2013.01)

(58) Field of Classification Search
CPC .... G06F 12/0246; G06F 3/0688; G06F 3/064; G06F 11/073; G06F 11/0793; G06F 2212/7201; G06F 2212/7205
See application file for complete search history.

(56) References Cited

U.S. PATENT DOCUMENTS

| 3,016,527 A | 1/1962 | Gilbert et al. |
| 3,739,410 A | 6/1973 | Fortin |

(Continued)

FOREIGN PATENT DOCUMENTS

| CA | 2327998 A1 | 6/2001 |
| CA | 2638672 A1 | 2/2009 |

(Continued)

OTHER PUBLICATIONS

"CleanSync 2.0", CleanSync Team, retireved from http://www.top4download.com/cleansync/xfliyozl.html, dated Feb. 25, 2012, 3 pages.

(Continued)

*Primary Examiner* — Jigar P Patel
(74) *Attorney, Agent, or Firm* — Knobbe Martens Olson & Bear, LLP

(57) ABSTRACT

Some embodiments described herein are directed to memory page or bad block monitoring and retirement algorithms, systems and methods for random access memory (RAM). Reliability issues or errors can be detected for multiple memory pages using one or more retirement criterion. In some embodiments, when reliability errors are detected, it may be desired to remove such pages from operation before they create a more serious problem, such as a computer crash. Thus, bad block retirement and replacement mechanisms are described herein.

20 Claims, 24 Drawing Sheets

(56) References Cited

U.S. PATENT DOCUMENTS

| | | |
|---|---|---|
| 3,926,346 A | 12/1975 | Dub et al. |
| 4,183,464 A | 1/1980 | Babb |
| 4,286,256 A | 8/1981 | Langdon, Jr. et al. |
| D264,844 S | 6/1982 | Tuck |
| 4,420,767 A | 12/1983 | Hodge et al. |
| 4,560,977 A | 12/1985 | Murakami et al. |
| 4,625,710 A | 12/1986 | Harada et al. |
| 4,635,141 A | 1/1987 | Coulter |
| D304,193 S | 10/1989 | Lotz |
| D308,671 S | 6/1990 | Aderman et al. |
| 4,931,340 A | 6/1990 | Baba et al. |
| D319,765 S | 9/1991 | McCord |
| 5,168,171 A | 12/1992 | Tracewell |
| D341,866 S | 11/1993 | Ross |
| 5,300,930 A | 4/1994 | Burger et al. |
| D353,182 S | 12/1994 | Rubin |
| D357,461 S | 4/1995 | Zaplatynsky et al. |
| D362,243 S | 9/1995 | Spechts et al. |
| D366,246 S | 1/1996 | Simek et al. |
| D372,909 S | 8/1996 | Naufel |
| D377,482 S | 1/1997 | Geck |
| D382,880 S | 8/1997 | Cienkus et al. |
| D391,938 S | 3/1998 | D'Agaro et al. |
| D393,455 S | 4/1998 | D'Agaro et al. |
| 5,748,921 A | 5/1998 | Lambrecht et al. |
| 5,751,549 A | 5/1998 | Eberhardt et al. |
| 5,784,611 A | 7/1998 | Thantrakul |
| 5,785,799 A | 7/1998 | Culnane et al. |
| D396,690 S | 8/1998 | Fryers |
| D397,097 S | 8/1998 | McNally |
| 5,797,143 A | 8/1998 | Buxton |
| 5,818,877 A | 10/1998 | Tsai et al. |
| 5,867,180 A | 2/1999 | Katayama et al. |
| 5,872,530 A | 2/1999 | Domyo et al. |
| D407,079 S | 3/1999 | Wu |
| 5,878,240 A | 3/1999 | Tomko |
| 5,890,794 A | 4/1999 | Abtahi et al. |
| D409,171 S | 5/1999 | Wu |
| 5,923,860 A | 7/1999 | Olarig |
| D415,747 S | 10/1999 | Wu |
| D421,428 S | 3/2000 | Wu |
| D422,993 S | 4/2000 | Storti et al. |
| D423,479 S | 4/2000 | Alo et al. |
| 6,052,785 A | 4/2000 | Lin et al. |
| 6,067,227 A | 5/2000 | Katsui et al. |
| D431,241 S | 9/2000 | Armstrong et al. |
| 6,182,601 B1 | 2/2001 | Baatz |
| D439,566 S | 3/2001 | Ohanian |
| 6,243,831 B1 | 6/2001 | Mustafa et al. |
| 6,275,173 B1 | 8/2001 | Wu |
| D447,484 S | 9/2001 | Reznikov et al. |
| 6,297,742 B1 | 10/2001 | Canada et al. |
| 6,297,753 B1 | 10/2001 | Hayami |
| 6,310,564 B1 | 10/2001 | Fujimoto |
| 6,326,781 B1 | 12/2001 | Kunde et al. |
| 6,373,695 B1 | 4/2002 | Cheng |
| 6,396,027 B1 | 5/2002 | Wu |
| 6,401,807 B1 | 6/2002 | Wyler et al. |
| D462,075 S | 8/2002 | Hillyard et al. |
| 6,430,351 B1 | 8/2002 | Takahashi et al. |
| 6,442,031 B1 | 8/2002 | Liu |
| 6,465,969 B1 | 10/2002 | Murasko et al. |
| 6,483,439 B1 | 11/2002 | Vukosic |
| 6,494,780 B1 | 12/2002 | Norbury, Jr. |
| D471,912 S | 3/2003 | Camarota et al. |
| 6,541,921 B1 | 4/2003 | Luciano, Jr. et al. |
| D475,061 S | 5/2003 | Huang |
| 6,560,599 B1 | 5/2003 | Boa et al. |
| 6,605,778 B2 | 8/2003 | Dorfler et al. |
| 6,614,369 B1 | 9/2003 | Widmer |
| 6,621,935 B1 | 9/2003 | Xin et al. |
| 6,626,557 B1 | 9/2003 | Taylor |
| 6,644,481 B2 | 11/2003 | Dean et al. |
| D483,374 S | 12/2003 | Hung |
| D483,378 S | 12/2003 | Mundt |
| 6,658,435 B1 | 12/2003 | McCall |
| 6,674,908 B1 | 1/2004 | Aronov |
| 6,683,545 B2 | 1/2004 | Strasser |
| D490,083 S | 5/2004 | Wu |
| 6,737,299 B1 | 5/2004 | Jiang |
| 6,785,133 B2 | 8/2004 | Barringer et al. |
| 6,785,815 B2 | 8/2004 | Serret-Avila et al. |
| 6,829,695 B1 | 12/2004 | Ross |
| 6,844,824 B2 | 1/2005 | Vukosic |
| D503,717 S | 4/2005 | Kawamura |
| 6,904,484 B1 | 6/2005 | Nelson |
| 6,905,228 B1 | 6/2005 | Takeyasu et al. |
| 6,926,972 B2 | 8/2005 | Jakobi et al. |
| 6,956,745 B2 | 10/2005 | Kerrigan et al. |
| D513,751 S | 1/2006 | Alo et al. |
| 6,999,319 B2 | 2/2006 | Wu et al. |
| 7,030,837 B1 | 4/2006 | Vong et al. |
| 7,064,265 B2 | 6/2006 | Cochrane |
| 7,111,961 B2 | 9/2006 | Trenchard et al. |
| D529,915 S | 10/2006 | Scicluna et al. |
| D530,052 S | 10/2006 | Berti |
| D530,343 S | 10/2006 | Maruyama et al. |
| D530,704 S | 10/2006 | Cortes |
| 7,145,776 B2 | 12/2006 | King, Jr. et al. |
| D535,298 S | 1/2007 | Cochrane |
| 7,164,581 B2 | 1/2007 | Carullo et al. |
| 7,174,436 B1 | 2/2007 | Langendorf et al. |
| 7,231,560 B2 | 6/2007 | Lai et al. |
| 7,246,037 B2 | 7/2007 | Evans |
| 7,290,116 B1 | 10/2007 | Grohoski et al. |
| D555,159 S | 11/2007 | Cox et al. |
| D556,204 S | 11/2007 | Tosh et al. |
| 7,298,535 B2 | 11/2007 | Kuutti |
| D565,573 S | 4/2008 | Alo |
| 7,356,679 B1 | 4/2008 | Le et al. |
| 7,357,530 B2 | 4/2008 | Wang et al. |
| 7,363,331 B2 | 4/2008 | Karasudani et al. |
| D570,851 S | 6/2008 | Gundogan et al. |
| 7,371,975 B2 | 6/2008 | Oettinger et al. |
| D579,455 S | 10/2008 | Chu |
| 7,463,163 B2 | 12/2008 | Wu |
| 7,485,510 B2 | 2/2009 | Zhu et al. |
| 7,492,607 B2 | 2/2009 | Nguyen et al. |
| D590,831 S | 4/2009 | Evans |
| 7,515,413 B1 | 4/2009 | Curtis |
| 7,516,272 B2 | 4/2009 | Felton et al. |
| 7,539,026 B2 | 5/2009 | Finnerty et al. |
| D593,565 S | 6/2009 | Dearborn et al. |
| 7,587,408 B2 | 9/2009 | Snapp et al. |
| 7,620,784 B2 | 11/2009 | Panabaker |
| D609,236 S | 2/2010 | Matsumoto et al. |
| 7,726,837 B2 | 6/2010 | Ewert |
| 7,731,180 B2 | 6/2010 | Ohnishi |
| D619,108 S | 7/2010 | Lin |
| 7,794,124 B2 | 9/2010 | Hulsey et al. |
| 7,822,946 B2 | 10/2010 | Sharma |
| D631,480 S | 1/2011 | Vaughan |
| D631,630 S | 1/2011 | Berti |
| 7,921,088 B1 | 4/2011 | Mittal |
| 7,925,389 B2 | 4/2011 | Bradicich et al. |
| 7,930,473 B2 | 4/2011 | Rajan |
| D643,434 S | 8/2011 | Grady, IV et al. |
| 7,991,941 B2 | 8/2011 | Fortin |
| 7,996,361 B1 | 8/2011 | Shah et al. |
| 8,001,079 B2 | 8/2011 | Lu et al. |
| 8,006,108 B2 | 8/2011 | Brey et al. |
| 8,009,069 B2 | 8/2011 | Chen et al. |
| D646,954 S | 10/2011 | Azelton et al. |
| 8,078,789 B2 | 12/2011 | Hinrichs |
| 8,117,028 B2 | 2/2012 | Murashima |
| D656,250 S | 3/2012 | Forster et al. |
| D656,502 S | 3/2012 | Cacioppo et al. |
| 8,129,742 B2 | 3/2012 | Lin et al. |
| 8,139,945 B1 | 3/2012 | Amir et al. |
| 8,164,490 B2 | 4/2012 | Itani |
| D659,136 S | 5/2012 | Matsumoto |
| D659,137 S | 5/2012 | Matsumoto |
| D659,653 S | 5/2012 | Lin |
| D661,696 S | 6/2012 | Takada |

(56) References Cited

U.S. PATENT DOCUMENTS

| | | |
|---|---|---|
| D662,501 S | 6/2012 | Lohman |
| D662,504 S | 6/2012 | Lohman |
| 8,200,923 B1 | 6/2012 | Healey et al. |
| D663,299 S | 7/2012 | Corke et al. |
| 8,214,425 B2 | 7/2012 | Provencal |
| 8,229,898 B1 | 7/2012 | Pype |
| 8,237,594 B2 | 8/2012 | Suzuki et al. |
| 8,238,091 B2 | 8/2012 | Chang et al. |
| 8,238,840 B2 | 8/2012 | Lio et al. |
| 8,245,235 B1 | 8/2012 | Belady |
| 8,265,323 B2 | 9/2012 | Stiehl et al. |
| 8,281,013 B2 | 10/2012 | Mundkur et al. |
| 8,290,160 B1 | 10/2012 | Steeger |
| 8,310,830 B2 | 11/2012 | Zheng et al. |
| 8,314,555 B2 | 11/2012 | Huang et al. |
| 8,322,040 B2 | 12/2012 | Jimenez |
| 8,334,838 B2 | 12/2012 | Sadahiro et al. |
| D676,039 S | 2/2013 | Wallace et al. |
| D676,852 S | 2/2013 | Lohman |
| 8,366,464 B1 | 2/2013 | Figuerado et al. |
| D678,273 S | 3/2013 | Kuehn et al. |
| D681,635 S | 5/2013 | Wang |
| D682,267 S | 5/2013 | Mase |
| 8,458,696 B2 | 6/2013 | Park et al. |
| 8,470,388 B1 | 6/2013 | Zsinko et al. |
| D685,373 S | 7/2013 | Santos et al. |
| 8,474,994 B2 | 7/2013 | Campman |
| 8,508,928 B2 | 8/2013 | Killen et al. |
| 8,547,825 B2 | 10/2013 | Armstrong et al. |
| 8,560,501 B2 | 10/2013 | Deetz |
| 8,566,288 B1 | 10/2013 | Deetz |
| 8,570,738 B2 | 10/2013 | Fan et al. |
| D694,240 S | 11/2013 | Cho |
| 8,583,194 B2 | 11/2013 | Lio et al. |
| 8,589,643 B2 | 11/2013 | Meyer et al. |
| D694,758 S | 12/2013 | Muller |
| 8,601,201 B2 | 12/2013 | Scannell et al. |
| 8,639,849 B2 | 1/2014 | Achler |
| D699,212 S | 2/2014 | Tanaka |
| D702,650 S | 4/2014 | Reed et al. |
| 8,701,108 B2 | 4/2014 | Sekiguchi et al. |
| 8,704,771 B2 | 4/2014 | Shigeta |
| D705,836 S | 5/2014 | Huschka |
| 8,715,127 B2 | 5/2014 | Beutler et al. |
| 8,717,764 B2 | 5/2014 | Sun |
| D706,780 S | 6/2014 | Abdollahi et al. |
| 8,782,463 B1 | 7/2014 | Singh |
| 8,793,684 B2 | 7/2014 | Breitgand et al. |
| D711,382 S | 8/2014 | Eriksen |
| 8,806,480 B2 | 8/2014 | Araujo, Jr. et al. |
| 8,832,352 B2 | 9/2014 | Tsirkin et al. |
| 8,839,112 B2 | 9/2014 | Neerudu et al. |
| 8,847,797 B1 | 9/2014 | Barr |
| 8,856,255 B2 | 10/2014 | Ramakrishnan et al. |
| 8,868,860 B2 | 10/2014 | Beeken |
| 8,880,470 B2 | 11/2014 | Mashtizadeh et al. |
| D719,128 S | 12/2014 | Teulie |
| D719,571 S | 12/2014 | Sugilhara et al. |
| D720,353 S | 12/2014 | Nakamura |
| D720,357 S | 12/2014 | Kwon et al. |
| 8,904,383 B2 | 12/2014 | Bash et al. |
| 8,909,884 B2 | 12/2014 | Fleming et al. |
| 8,930,647 B1 | 1/2015 | Smith |
| 8,938,643 B1 | 1/2015 | Karmarkar et al. |
| D722,060 S | 2/2015 | Kwon et al. |
| D722,995 S | 2/2015 | Moreau |
| 8,954,645 B2 | 2/2015 | North et al. |
| 8,964,385 B2 | 2/2015 | Lam et al. |
| D723,554 S | 3/2015 | Choo et al. |
| D723,555 S | 3/2015 | Choo et al. |
| 8,988,821 B2 | 3/2015 | Li |
| D726,180 S | 4/2015 | Roat et al. |
| 9,003,144 B1 | 4/2015 | Hayes et al. |
| D729,242 S | 5/2015 | Kim et al. |
| D729,809 S | 5/2015 | Akana et al. |
| D730,307 S | 5/2015 | Tang et al. |
| 9,035,786 B2 | 5/2015 | Clifford et al. |
| D731,010 S | 6/2015 | Levitt et al. |
| D731,484 S | 6/2015 | Olsson et al. |
| D733,137 S | 6/2015 | Kawai |
| 9,053,068 B2 | 6/2015 | Tsirkin et al. |
| D734,754 S | 7/2015 | Ficacci |
| D735,726 S | 8/2015 | Chen |
| 9,106,020 B2 | 8/2015 | Cohen et al. |
| 9,141,625 B1 | 9/2015 | Thornewell et al. |
| D740,817 S | 10/2015 | Ignomirello |
| D740,818 S | 10/2015 | Ignomirello |
| D741,333 S | 10/2015 | Aoyagi et al. |
| 9,170,831 B2 | 10/2015 | Robinson et al. |
| D742,876 S | 11/2015 | Ignomirello |
| D742,883 S | 11/2015 | Akana et al. |
| D742,887 S | 11/2015 | Ignomirello |
| D743,404 S | 11/2015 | Ignomirello |
| 9,183,158 B2 | 11/2015 | O'Loughlin et al. |
| 9,195,401 B2 | 11/2015 | Li et al. |
| 9,195,491 B2 | 11/2015 | Zhang et al. |
| 9,201,674 B2 | 12/2015 | Rogel et al. |
| 9,280,380 B2 | 3/2016 | Tsirkin |
| 9,304,703 B1 | 4/2016 | Ignomirello |
| 9,317,326 B2 | 4/2016 | Ramanathan et al. |
| 9,336,042 B1 | 5/2016 | Brennerman et al. |
| 9,336,050 B2 | 5/2016 | Nakata et al. |
| 9,354,918 B2 | 5/2016 | Gupta et al. |
| 9,377,963 B2 | 6/2016 | Colbert et al. |
| 9,389,937 B2 | 7/2016 | Ackaret et al. |
| 9,438,534 B2 | 9/2016 | Xia et al. |
| D768,135 S | 10/2016 | Ignomirello |
| D768,136 S | 10/2016 | Ignomirello |
| 9,467,294 B2 | 10/2016 | Ignomirello |
| 9,552,217 B2 | 1/2017 | Tarasuk-Levin et al. |
| 9,558,005 B2 | 1/2017 | Sathyanarayana |
| 9,582,303 B2 | 2/2017 | Shu et al. |
| 9,582,319 B2 | 2/2017 | Ayala et al. |
| 9,584,312 B2 | 2/2017 | Ignomirello |
| 9,603,251 B1 | 3/2017 | Ignomirello |
| 9,628,108 B2 | 4/2017 | Ignomirello |
| D786,258 S | 5/2017 | Ignomirello |
| 9,672,054 B1 | 6/2017 | Gupta et al. |
| 9,715,347 B2 | 7/2017 | Ryu et al. |
| 9,753,768 B2 | 9/2017 | Chandrasekaran |
| 9,766,945 B2 | 9/2017 | Gaurav et al. |
| 9,817,728 B2 | 11/2017 | Lgnormirello et al. |
| 9,870,834 B2 | 1/2018 | Li et al. |
| 9,977,719 B1 | 5/2018 | Ignomirello et al. |
| 10,061,514 B2 | 8/2018 | Ignomirello |
| 10,120,607 B2 | 11/2018 | Ignomirello |
| 10,133,636 B2 | 11/2018 | Ignomirello |
| 10,346,047 B2 | 7/2019 | Ignomirello |
| 10,572,186 B2 | 2/2020 | Sicola et al. |
| 2002/0056031 A1 | 5/2002 | Skiba et al. |
| 2002/0122597 A1 | 9/2002 | Kikuchi et al. |
| 2002/0145545 A1 | 10/2002 | Brown |
| 2002/0172203 A1 | 11/2002 | Ji et al. |
| 2003/0018759 A1 | 1/2003 | Baumann |
| 2003/0115447 A1 | 6/2003 | Pham et al. |
| 2003/0122694 A1 | 7/2003 | Green |
| 2003/0212883 A1 | 11/2003 | Lee |
| 2004/0017651 A1 | 1/2004 | Gan et al. |
| 2004/0143733 A1 | 7/2004 | Ophir et al. |
| 2004/0262409 A1 | 12/2004 | Crippen et al. |
| 2005/0091440 A1 | 4/2005 | Isa et al. |
| 2005/0099319 A1 | 5/2005 | Hutchison et al. |
| 2005/0191520 A1 | 9/2005 | Guntermann et al. |
| 2005/0198076 A1 | 9/2005 | Stata et al. |
| 2005/0210314 A1 | 9/2005 | Iguchi |
| 2005/0288800 A1 | 12/2005 | Smith et al. |
| 2006/0006517 A1 | 1/2006 | Lee et al. |
| 2006/0049956 A1 | 3/2006 | Taylor et al. |
| 2006/0171050 A1 | 8/2006 | Hanson et al. |
| 2006/0174140 A1 | 8/2006 | Harris et al. |
| 2006/0212644 A1 | 9/2006 | Acton et al. |
| 2006/0212692 A1 | 9/2006 | Ueno et al. |
| 2006/0248273 A1 | 11/2006 | Jernigan, IV |
| 2006/0256866 A1 | 11/2006 | Ziauddin et al. |

(56) References Cited

U.S. PATENT DOCUMENTS

| | | |
|---|---|---|
| 2006/0285287 A1 | 12/2006 | Chen et al. |
| 2007/0081320 A1 | 4/2007 | Gilbert |
| 2007/0087586 A1 | 4/2007 | Karamooz |
| 2007/0101074 A1 | 5/2007 | Patterson |
| 2007/0164875 A1 | 7/2007 | Fredericks et al. |
| 2007/0180207 A1 | 8/2007 | Garfinkle |
| 2007/0206375 A1 | 9/2007 | Piepgras et al. |
| 2007/0236334 A1 | 10/2007 | Borovoy et al. |
| 2007/0291934 A1 | 12/2007 | Volkovs et al. |
| 2008/0005380 A1 | 1/2008 | Kawasaki et al. |
| 2008/0054845 A1 | 3/2008 | Wang |
| 2008/0059702 A1 | 3/2008 | Lu et al. |
| 2008/0062020 A1 | 3/2008 | Lakus-Becker |
| 2008/0077586 A1 | 3/2008 | Lam |
| 2008/0133835 A1 | 6/2008 | Zhu et al. |
| 2008/0148254 A1 | 6/2008 | Hofer |
| 2008/0243992 A1 | 10/2008 | Jardetzky et al. |
| 2008/0291664 A1 | 11/2008 | Pesenti |
| 2008/0307128 A1 | 12/2008 | Amron et al. |
| 2008/0310628 A1 | 12/2008 | Fujioka et al. |
| 2009/0006640 A1 | 1/2009 | Brouwer et al. |
| 2009/0040032 A1 | 2/2009 | Gerber |
| 2009/0055593 A1 | 2/2009 | Satoyama et al. |
| 2009/0061756 A1 | 3/2009 | Germagian |
| 2009/0100236 A1 | 4/2009 | Puig |
| 2009/0112880 A1 | 4/2009 | Oliveira et al. |
| 2009/0115646 A1 | 5/2009 | Duxbury |
| 2009/0119468 A1 | 5/2009 | Taylor et al. |
| 2009/0129691 A1 | 5/2009 | Luttmer et al. |
| 2009/0141435 A1 | 6/2009 | Kreiner et al. |
| 2009/0169001 A1 | 7/2009 | Tighe et al. |
| 2009/0193161 A1 | 7/2009 | Yoshida |
| 2009/0208221 A1 | 8/2009 | Sasai |
| 2009/0231153 A1 | 9/2009 | Hauenstein et al. |
| 2009/0300301 A1 | 12/2009 | Vaghani |
| 2009/0303709 A1 | 12/2009 | Weatherley |
| 2009/0307251 A1 | 12/2009 | Heller et al. |
| 2010/0076527 A1 | 3/2010 | Hammond et al. |
| 2010/0162039 A1 | 6/2010 | Goroff et al. |
| 2010/0169287 A1 | 7/2010 | Klose |
| 2010/0211737 A1 | 8/2010 | Flynn et al. |
| 2010/0245665 A1 | 9/2010 | Chrnega et al. |
| 2010/0250501 A1 | 9/2010 | Mandagere et al. |
| 2010/0253617 A1 | 10/2010 | Lio et al. |
| 2010/0257269 A1 | 10/2010 | Clark |
| 2010/0306294 A1 | 12/2010 | Schneider |
| 2011/0035361 A1 | 2/2011 | Soga |
| 2011/0107112 A1 | 5/2011 | Resch |
| 2011/0137519 A1 | 6/2011 | Christie |
| 2011/0170872 A1 | 7/2011 | Shin et al. |
| 2011/0276771 A1 | 11/2011 | Tajima et al. |
| 2011/0289294 A1 | 11/2011 | Maeda et al. |
| 2012/0076298 A1 | 3/2012 | Bolotov et al. |
| 2012/0110236 A1* | 5/2012 | Ali ............... G06F 12/1009 711/6 |
| 2012/0124282 A1 | 5/2012 | Frank et al. |
| 2012/0131293 A1 | 5/2012 | Benhase et al. |
| 2012/0159282 A1 | 6/2012 | Ito |
| 2012/0166448 A1 | 6/2012 | Li et al. |
| 2012/0166757 A1 | 6/2012 | Volvovski et al. |
| 2012/0191982 A1 | 7/2012 | Levin |
| 2012/0209448 A1 | 8/2012 | Brower |
| 2012/0209559 A1 | 8/2012 | Brower |
| 2012/0239860 A1 | 9/2012 | Atkisson et al. |
| 2012/0246472 A1 | 9/2012 | Berengoltz |
| 2012/0278382 A1 | 11/2012 | Faith |
| 2012/0278553 A1 | 11/2012 | Mudhiganti et al. |
| 2012/0285738 A1 | 11/2012 | Cochrane et al. |
| 2012/0303359 A1 | 11/2012 | Mizuguchi et al. |
| 2012/0330894 A1 | 12/2012 | Slik |
| 2013/0007507 A1* | 1/2013 | Raj ............... G06F 11/0715 714/5.11 |
| 2013/0013618 A1 | 1/2013 | Heller et al. |
| 2013/0019076 A1 | 1/2013 | Amidi et al. |
| 2013/0106297 A1 | 5/2013 | Yeh |
| 2013/0111166 A1 | 5/2013 | Resch et al. |
| 2013/0138764 A1 | 5/2013 | Satapathy |
| 2013/0148457 A1 | 6/2013 | Sweere |
| 2013/0211608 A1 | 8/2013 | Farrell et al. |
| 2013/0212161 A1 | 8/2013 | Ben-Shaul et al. |
| 2013/0268812 A1 | 10/2013 | Liu et al. |
| 2013/0283038 A1 | 10/2013 | Kulkarni et al. |
| 2014/0062307 A1 | 3/2014 | Spencer et al. |
| 2014/0082324 A1 | 3/2014 | Elhamias et al. |
| 2014/0119028 A1 | 5/2014 | Sato et al. |
| 2014/0146514 A1 | 5/2014 | Yahata |
| 2014/0211423 A1 | 7/2014 | Nguyen et al. |
| 2014/0223118 A1 | 8/2014 | Ignomirello |
| 2014/0258533 A1 | 9/2014 | Antony |
| 2014/0259014 A1 | 9/2014 | Watanabe et al. |
| 2014/0281257 A1 | 9/2014 | Hochberg et al. |
| 2014/0297938 A1 | 10/2014 | Puthiyedath et al. |
| 2014/0313043 A1 | 10/2014 | Heydron |
| 2014/0313700 A1 | 10/2014 | Connell et al. |
| 2014/0333449 A1 | 11/2014 | Thiesfeld et al. |
| 2015/0015405 A1 | 1/2015 | Bark et al. |
| 2015/0026516 A1 | 1/2015 | Yong et al. |
| 2015/0052282 A1 | 2/2015 | Dong |
| 2015/0058543 A1 | 2/2015 | Chan et al. |
| 2015/0084270 A1 | 3/2015 | Lo et al. |
| 2015/0095443 A1 | 4/2015 | Yang et al. |
| 2015/0098205 A1 | 4/2015 | Keranen et al. |
| 2015/0117019 A1 | 4/2015 | Kuenzler et al. |
| 2015/0131965 A1 | 5/2015 | Yoshioka |
| 2015/0143054 A1* | 5/2015 | Ackaret ............... G06F 11/073 711/133 |
| 2015/0163060 A1 | 6/2015 | Tomlinson et al. |
| 2015/0211916 A1 | 7/2015 | McGinn et al. |
| 2015/0212263 A1 | 7/2015 | Tzeng |
| 2015/0254092 A1 | 9/2015 | Chandrasekran |
| 2015/0309839 A1 | 10/2015 | Lu |
| 2015/0324388 A1 | 11/2015 | Benke et al. |
| 2016/0011802 A1 | 1/2016 | Berke |
| 2016/0043484 A1 | 2/2016 | Brodsky et al. |
| 2016/0085022 A1 | 3/2016 | Yang et al. |
| 2016/0092203 A1 | 3/2016 | Filali-Adib et al. |
| 2016/0196158 A1 | 7/2016 | Nipane et al. |
| 2016/0232839 A1 | 8/2016 | Ignomirello |
| 2016/0283390 A1 | 9/2016 | Coulson |
| 2016/0378547 A1 | 12/2016 | Brouwer et al. |
| 2017/0220498 A1 | 8/2017 | Ignomirello |
| 2017/0221322 A1 | 8/2017 | Ignomirello |
| 2018/0267865 A1 | 9/2018 | Ignomirello et al. |
| 2019/0146881 A1 | 5/2019 | Ignomirello |

FOREIGN PATENT DOCUMENTS

| | | |
|---|---|---|
| CN | 201426214 Y | 3/2010 |
| CN | 102611560 A | 7/2012 |
| CN | 203327301 U | 12/2013 |
| EP | 0 403 232 | 12/1990 |
| EP | 2 393 009 | 12/2011 |
| EP | 2 897 018 | 7/2015 |
| GB | 2407427 A | 4/2005 |
| JP | H07-504541 A | 5/1995 |
| JP | 2000-31831 A | 1/2000 |
| JP | 2007-272826 | 10/2007 |
| JP | 2007-281763 A | 10/2007 |
| JP | 2008-107615 A | 5/2008 |
| JP | 2008-165293 | 7/2008 |
| JP | 2009-059096 | 3/2009 |
| JP | 2009-524882 | 7/2009 |
| JP | 2009-251725 | 10/2009 |
| JP | 2010-072740 | 4/2010 |
| JP | 2010-512057 A | 4/2010 |
| JP | 2011-203842 | 10/2011 |
| JP | 2012-027587 | 2/2012 |
| JP | 2012-80470 A | 4/2012 |
| JP | 2012-129785 A | 7/2012 |
| WO | WO 06/042019 | 4/2006 |
| WO | WO 06/042041 | 4/2006 |
| WO | WO 09/009719 | 1/2009 |
| WO | WO 10/138824 | 12/2010 |
| WO | WO 12/117658 | 7/2012 |

(56) References Cited

FOREIGN PATENT DOCUMENTS

| WO | WO 14/121102 | 8/2014 |
|---|---|---|
| WO | WO 14/170617 | 10/2014 |
| WO | WO 15/039181 | 3/2015 |
| WO | WO 16/168007 | 10/2016 |
| WO | WO 17/176523 | 10/2017 |

OTHER PUBLICATIONS

"Disk Cloning and Mass System Deployment" retrieved from http://www.drive-image.com/Disk_Cloning_and_Mass_System_Deployment.shtml, 21 pages.
"Enabling Memory Reliability, Availability, and Serviceability Features on Dell PowerEdge Servers," http://citeseerx.ist.psu.edu/viewdoc/download?doi=10.1.1.692.4199&rep=rep1&type=pdf, Dell Power Solutions, Aug. 2015.
"IBM TotalStorage Enterprise Server Model 800", IBM, retrieved from http://ps-2.kev009.com/rs6000/manuals/SAN/ESS/ESS800_Product_Data_sheet.pdf, dated 2003, 6 pages.
"Lenovo Servers RAS Features," https://youtu.be/zZyDxnCUE4c, Jan. 11, 2016.
"Memory RAS technologies for HPE ProLiant/Synergy/Blade Gen10 servers with Intel Xeon scalable processors", retrieved from https://www.hpe.com/h20195/V2/GetPDF.aspx/4AA4-3490ENW.pdf, Hewlett Packard Enterprises, Oct. 2017, 9 pages.
"Ntfsclone—Efficiently clone, image, restore or rescue an NTFS", Ubuntu, retrieved from http://manpages.ubuntu.com/manpages/gutsy/man8/ntfsclone.8.html, 4 pages.
"Restore A System Image BackUp to Computer with Dissimilar Hardware", AOMEI, retrieved from http://www.backup-utility.com/features/dissimilar-hardware-restore.html, 5 pages.
"Revisiting Memory Errors in Large-Scale Production Data Centers: Analysis and Modeling of New Trends from the Field" by Justin Meza, Qiang Wu, Sanjeev Kumar, and Onur Mutlu, Carnegie Mellon University and Facebook, Inc., 2015 {Facebook fleet analysis over 14 months}.
Alibaba, "new arrival fashion design zinc alloy metal U shap handle for leather of bag accessories qifeng f-994", retrieved on Jul. 18, 2015 from http://alibaba.com/product-detail/new-arrival-fasion-design-zinc-alloy_1402892576.html?smToken=f4543babcb5440fda870ba4c2a621f1c&smSign=2q%Bp5jXRBjWkFnOu62%2Fy%2Fw%3D%3D, 1 page.
Aliexpress, "F238F 3.5" Hot-Swap SAS/SATA Hard Disk Drive Caddy/Tray, retrieved on Jul. 14, 2015 from http://www.aliexpress.com/store/product/F238F-3-5-Hot-Swap-SAS-SATA-Hard-Disk-Drive-Caddy-Tray/1129178_1677183967.html, 1 Page.
All Data Parts, "Icy Dock ToughArmor MB992SK", retrieved on Jan. 29, 2016 from http://www.alldataparts.com/index.php?main_page=product_info&cPath=59_699_714&products_id=659 14&zenid=c7a2e4f22f81deb6482a7df9318ad922, 2 pages.
American Standard Circuits, Inc., "High Temperature Organic Adhesive Bonding Films", retrieved from http://www.asc-i.com/preview/technology/thermal-management/, on May 26, 2015, 5 pages.
Anonymous: "Find Seed from Random Numbers", Blitz Research Programming Forums, Dec. 4, 2011 (Dec. 4, 2011), XP055297586, retrieved from the Internet: http://web.archive.org/web/20111204053405/http://blitzbasic.com/Community/posts.php?topic=61025 (5 pages total).
Anonymous: "Huffman Coding", Wikipedia, the free encyclopedia, Jan. 18, 2013 (Jan. 18, 2013), pp. 1-10, XP055303125, Retrieved from the Internet: http://en.wikipedia.org/w/index.phptitle=Huffmancoding&oldid=533661878 [retrieved on Sep. 15, 2016] (10 pages total).
Anonymous: "Zero suppression", Wikipedia, the free encyclopedia, Jul. 25, 2012 (Jul. 25, 2012), XP055303438, Retrieved from the Internet: http://en.wikipedia.org/w/index.php?title=Zerosuppression&oldid=504088023 (retrieved on Sep. 16, 2016) (2pages total).

Backblaze, "Backblaze Faceplates", Sep. 8, 2015, retrieved on Jan. 29, 2016 from hllps://www.backblaze.com/blog/the-next-backblaze-face-plate/, 9 pages.
Cclonline, "Cougar MX300 Gamer Case, ATX, No PSU, Max 7 Fans, 7 PCI Cards, USB 3.0, Honeycomb Front", retrieved on Jul. 14, 2015 from http://www.cclonline.com/product/167472/MX300/Cases/Cougar-MX300-Gamer-Case-ATX-No-PSU-Max-7-Fans-7-PCI-Cards-USB-3-0-Honeycomb-Front/CAS1679/, 2 pages.
Chapter 15. "Cooling Of Electronic Equipment", retrieved from http://highered.mheducation.com/sites/dl/free/0073398128/835451/Chapter15.pdf, 70 pages.
Checkline Europe, "ZT-DPU Digital Force Guage with luminescent display & remote sensor," retrieved on Jul. 17, 2015 from http://www.checkline-eurpe.co.uk/digital_force_gauges1/ZT-DPU, 6 pages.
Chung et al., "Low Tg Epoxy Adhesives for Thermal Management", retrieved from www.aitechnology.com/uploads/pdf/WHITE%20PAPER/lowTgEpoxy.pdf, 14 pages.
Cisco, "10 Gigabit Ethernet Switching for High-Performance, Rack-Optimized Server Switiching", retrived on Jul. 18, 2015 from http://www.cisco.com/c/en/us/products/collateral/switches/catalyst-4900-series-switches/product_data_sheet0900aecd80246552.html, 14 pages.
Cisco, "Cisco Catalyst 4948 10 Gigabit Ethernet Switch Data Sheet", retrieved on Jul. 20, 2015 from http://www.cisco.com/c/en/us/products/collateral/switches/catalyst-4900-series-switches/product_data_sheet0900aecd80246552.html, 14 pages.
Cisco, "Cisco HDT Network Storage Hard Drive Trays Cisco Small Business Network Storage Systems", retrieved on Jul. 20, 2015 from http://www.cisco.com/c/en/us/products/collateral/storage-networking/hdt-network-storage-hard-drive-trays/data_sheet_c78-502733.pdf, 3 pages.
Cisco, "Replacing Cisco ASR 9000 Series Router Components", retrieved on Jan. 29, 2016 from http://www.cisco.com/c/en/us/td/docs/routers/asr9000/hardware/installation/guide/asr9kHIGbk/asr9k1Gmaintaining.html, 15 pages.
Cisco, "Replacing the Cisco 3745 Faceplate/Fan Tray", manual, retrieved on Jul. 14, 2015 from http://www.cisco.com/public/scc/compass/3700/tasks-task_3745_faceplate_replace.htm, 1 Page.
Colo Advisor, "High Density Colocation—Planning Pays Off", retrieved on Jul. 18, 2015 from http://www.coloadvisor.com/blog/high-density-colocation-planning-pays-off/, 5 Pages.
D. Tang et al., "Assessment of the Effect of Memory Page Retirement on System RAS Against Hardware Faults," DSN, 2006.
Delcom Products, "USB Visual Signal Indicator RGB", retrieved on Apr. 4, 2016 from https://www.delcomproducts.com/productdetails.asp?prodcutnum=804000, 2 pages.
Dell, "Hard Disk Drive Caddy or Tray", retrieved on Jan. 29, 2016 from http://www.aliexpress.com/store/producl/F238F-3-5-Hot-Swap-SAS-SATA-Hard-Disk-Drive-Caddy-Tray/1129178_1677183967.html, 4 Pages.
Dell, "Installing Enclosure Components", retrieved on Jul. 18, 2015 from http://ftp.respmech.com/pub/MD3000/en/MD3000_0wners_Manual/install.htm, 11 Pages.
Dhgate, 120mm Apexi 3 in 1 Guage hu's Store Dhgate, retrieved on Jul. 17, 2015 from http://webcache.googleusercontent.com/search?q=cache:YpQK9gy7APQJ:www.dhgate.com/store/product/120mm-apexi-3-in-1-guage-tachometer-rpm-water/141993290.html+&cd=6&hl=en&ct=clnk&gl=in, 3 pages.
Dictionary Techniques, C.M. Liu, National Chiao-Tung University Website, Dec. 31, 2010, website: http://people.cs.nctu.edu.tw/~cmliu/Courses/Compression/chap5.pdf, 137 pages.
DRAM errors in the wild: a large-scale field study, Bianca Schroeder, Eduardo Pinheiro, Wolf-Dietrich Weber, Sigmetrics/Performance'09, Jun. 15-19, 2009, Seattle, WA, USA {largescale Google study for 2.5 years}.
Ebay, "Dell PowerEdge M610 Server 2XQUAD Core 2.8GHz/X5560 64GB 2X300GB Raid Rails", retrieved on Jul. 18, 2015 from http://www.ebay.ca/itm/271899179228?rmvSB=true, 3 pages.
Ebay, "Vintage VGC Chrome Chevron Boomerang Drawer Cabinet Door Pulls Washington", retrieved on Jul. 18, 2015 from http://www.ebay.com/itmNintage-VGC-CHROME-Chevron-Boomerang-DRAWER-Cabinet-Door-Pulls-Washington/200818869564?trksid=p2047675.c100005.m1851&_trkparms=aid%3D222007%26algo%

(56) References Cited

OTHER PUBLICATIONS

3DSIC.MBE%D26ao%3D1%26asc%3D32298%26meid%3D3280c5c9af794a00afd5a1a69fc33f59%26pid%3D, 1 Page.
Edwards Signaling, "125XBRi Series XTRA-BRITE", Data Sheet ES001-0114, No. 1, retrieved on Apr. 4, 2016 from https://edwards-signals.com/files/125XBRI_Series_datasheet_v10.pdf, 2 pages.
EZ-PC, "Infrastructure and Networking", retrieved on Jul. 18, 2015 from http://www.ez-pc.org/services/infrastruture, 3 pages.
Frostytech, "Copper Honeycomb Concept Heatsink—BBHS Thermal Solutions Corp", retrieved on Jul. 14, 2015 from http://www.frostytech.com/permalinkArch.cfm?NewsID=88219, 1 Page.
Gilbert, "The Bus (PCI and PCI-Express)", retrieved from hppt://www.yale.edu/pclt/PCHW/BUS.htm on Apr. 28, 2015 dated Jan. 4, 2008, 5 pages.
Hague Registration No. DM/056877, retrieved on Jul. 18, 2015 from http://www.wipo.int/designdb/hague/en/showData.jsp?SOURCE=HAGUE&KEY=DM056877, 3 page.
Hardware Secrets, "Everything You Need to Know About the PCI Express", retrieved from http://www.hardwaresecrets.com/article/EverythingYouNeedtoKnowAboutthePCIExpress/190 on Jul. 12, 2012, 3 pages.
Hewlett Packard (HP), "Best Practices for HP BladeSystem Deployments using HP Serviceguard Solutions for HP-UX 11i", HP Publication No. 5697-0470, May 2010, pp. 1-26.
Highly Reliable Systems, "RAIDFrame DAS 5000", retrieved on Jan. 29, 2016 from https://www.high-rely.com/products/raidframe5bay/ 1 page.
Highly Reliable Systems, "MPac-G2 Media Tray", retrieved on Jan. 29, 2016 from https:lwww.high-rely.com/products/mpac-media/, 1 page.
IDOTPC, "BR-0804 4pc/set Rackmount Half-1 U Joint Plate Kit", retrieved on Jul. 18, 2015 from http://www.idotpc.com, thestore/pc/BR-0804-4pc-set-Rackmount-Half-1U-Joint-Plate-Kit-p1343. htm, 1 Page.
Intel, "Intel 64 and IA-32 Architectures Optimization Reference Manual", Manual, Sep. 2014, 642.
International Computer Concepts Inc, "PCI & PCIe Overview/Comparision", retrieved from http://www.iccusa.com/comparepci/ on Apr. 28, 2015, 5 pages.
Koike et al. Analyse validity of dedup technology, Information Processing Association Reports, 2011, 6, "DVD-ROM", Japan, General Legal Entity, Information Processing Society, May 1, 2012, vol. 2012-EVA-37, No. 1, pp. 1 to 6.
Lillibridge, M., Eshghi, K., Bhagwat, D., Deolalikar, V., Trezise, G., and Camble, P. 2009. Sparse indexing: Large scale, inline deduplication using sampling and locality. In Proceedings of the 7th USENIX Conference on File and Storage Technologies (FAST). USENIX Association, Berkely, CA, 111-123.
Mactech, "NES Cartridge External Hard Drive", retrieved on Jul. 18, 2015 from http://www.mactech.com/category/ type-article/macmod-web-site/miscellaneous-mods, 2 Pages.
Makatos, Thano, et al., ZBD: Using Transparent Compression at the Block Level to Increase Storage Space Efficiency, IEEE Computer Society pp. 61-70 (2010).
McCabe, "How to Add a Hard Drive to Your Windows Home Server", Information Week Network Computing, retrieved on Jul. 14, 2015 from http://www.networkcomputing.com/storage/how-to-add-a-hard-drive-to-your-windows-home-server-/d/d-id/1098397?, 3 Pages.
Oracle Corp, "I/O Domains and PCI Express Buses", retrieved from docs.oracle.com/cd/E1960401/8210406/configurepciexpressbusesacrossmultipledoms/index.html on Apr. 28, 2015, 3 pages.
Philips, "Philips AZ302/98 CD Sound Machine", retrieved on Feb. 5, 2016 from http://www.naaptol.com/portable-speakers/philips-az302/p/641367.html, 3 pages.
Saduqulla et al., "Threshold Proxy Re-Encryption in Cloud Storage System", International Journal of Advanced Research in Computer Science and Software Engineering, vol. 3, Issue 11, retrieved from http://www.ijarcsse.com/docs/papers/Volume_3/11_November2013/V3/11-0332.pdf, dated Nov. 2013, 5 pages.
Samsung Memory DDR4 SDRAM, http://www.samsung.com/us/dell/pdfs/DDR4_Brochure_2015.pdf, Samsung Electronic Co., 2 pages, 2015.
Seagate, SCSI Commands Reference Manual (Feb. 14, 2006).
Smith, Steven W. Data Compression Tutorial: Part 1,: EE Times, Jun. 14, 2007.
Startech, "Hot Swap Hard Drive Tray for SATSASBAY3BK", retrieved on Feb. 1, 2016 from http://www.startech.com/HDD/Mobile-Racks/Extra-25inch-or-35inch-Hot-Swap-Hard-Drive-Tray-for-SATSASBAY3BK~SATSASTRAYBK, 3 pages.
Sun Microsystems, Best Practices for Sun StorEdge 6920 System (Nov. 2004).
Tate, Jon, et al., Real-time Compression in SAN Volume Controller and the Storwize V 7000, IBM (Aug. 17, 2012).
Weil, Sage A., CRUSH: Controlled, Scalable, Decentralized Placement of Replicated Data; IEEE—2006; p. 1-12.
Wylie et al., "Selecting the right data distribution scheme for a survivable storage system", CMU-CS-01-120, Carnegie Mellon University, retrieved from http://www.pdl.cmu.edu/PDL-FTP/Storage/CMU-CS-01-120.pdf, dated May 2001, 23 pages.
Xilinx, Inc., Virtex-5 Family Overview, Feb. 6, 2009, 13 pages.
"Elastic Online Analytical Processing on RAMCloud4," Tinnefeld et al., EDBT/ICDT (Mar. 18-22, 2013), available at https://openproceedings.org/2013/conf/edbt/TinnefeldKGBRSP13.pdf.
"RamCloud Project", accessed Apr. 3, 2018, available at https://ramcloud.atlassian.net/wiki/spaces/RAM/overview.
"Breakthrough Nonvalatile Memory Technology," Micron, 3D Xpoint Technology, accessed Apr. 3, 2018, available at https://www.micron.com/products/advanced-solutions/3d-xpoint-technology.
International Search Report and Written Opinion dated Aug. 20, 2014 issued in connection with International Application No. PCT/US2014/014209, 5 pages.
International Preliminary Report on Patentability dated Aug. 13, 2015 issued in connection with International Application No. PCT/US2014/014209, 8 pages.
European Search Report dated Sep. 19, 2016 issued in connection with corresponding EP Application No. 14745861.6 (9 pages total).
International Search Report and Written Opinion dated Jan. 16, 2015 issued in connection with International Application No. PCT/US2014/014225, 2 pages.
International Preliminary Report on Patentability dated Aug. 13, 2015 issued in connection with International Application No. PCT/US2014/014225, 7 pages.
European Search Report dated Aug. 10, 2016 issued in connection with corresponding EP Application No. 14745756.8 (9 pages total).
Japanese Office Action dated Apr. 9, 2019, issued in related JP Application No. 2018-099121 (8 pages).
International Search Report and Written Opinion dated May 3, 2016, for PCT/US16/25988, 8 pages.
International Search Report for International Application No. PCT/US17/24692 dated Jul. 27, 2017.
European Search Report dated Sep. 5, 2016 in connection with corresponding EP Patent Application No. 16165443.9 (9 pages total).
Extended European Search Report dated Oct. 16, 2019 in patent application No. 17779550.7.
Japanese Office Action dated Sep. 20, 2016, issued in connection with corresponding Japanese Patent Application No. 2016-080683 with English Language translation (8 pages total).
Japanese Office Action dated Mar. 14, 2017, issued in connection corresponding JP Application No. 2016-080683 (9 pages total).
International Search Report and Written Opinion dated Apr. 14, 2017, issued in connection with corresponding International Application No. PCT/US2017/015544 (13 pages total).
International Search Report and Written Opinion dated Apr. 26, 2019, issued in connection with corresponding International Application No. PCT/US2018/066076 (9 pages total).

\* cited by examiner

Figure 6

| Available Positions | Page Number | Retirement Criteria Count | Rank | Purpose |
|---|---|---|---|---|
| 1 | 444 | 152 | 0 | retired page |
| 2 | 343 | 58 | 0 | retired page |
| 3 | 25 | 172 | 0 | retired page |
| 4 | 8534 | 202 | 1 | retired page |
| 5 | 90234 | 120 | 1 | retired page |
| 6 | 6 | 144 | 0 | retired page |
| 7 | 235 | 88 | 0 | retired page |
| 8 | 64566 | 67 | 0 | retired page |
| 9 | 3 | 180 | | retired page |
| 10 | 54 | 44 | | retired page |
| ... | ... | ... | | retired page |
| N-2 | | | | watched page |
| N-1 | | | | watched page |
| N | | | | watched page |

Figure 7

| Available Positions | Page Number | Retirement Criteria Count | Rank | Purpose |
|---|---|---|---|---|
| 1 | 8534 | 202 | 0 | retired page |
| 2 | 3 | 180 | 0 | retired page |
| 3 | 25 | 172 | 0 | retired page |
| 4 | 444 | 152 | 1 | retired page |
| 5 | 6 | 144 | 1 | retired page |
| 6 | 90234 | 120 | 0 | retired page |
| 7 | 235 | 88 | 0 | retired page |
| 8 | 53 | 75 | 0 | retired page |
| 9 | 64566 | 67 | 0 | retired page |
| 10 | 343 | 58 | 0 | retired page |
| ... | 54 | 44 | 0 | retired page |
| N-3 | 23455 | 9 | 0 | retired page |
| N-2 | 345 | 7 | 0 | watched page |
| N-1 | | | | watched page |
| N | | | | watched page |

Figure 8

| Available Positions | Page Number | Retirement Criteria Count | Rank | Purpose |
|---|---|---|---|---|
| 1 | 8534 | 202 | 0 | retired page |
| 2 | 3 | 180 | 0 | retired page |
| 3 | 25 | 172 | 0 | retired page |
| 4 | 444 | 152 | 0 | retired page |
| 5 | 6 | 144 | 1 | retired page |
| 6 | 90234 | 120 | 1 | retired page |
| 7 | 235 | 88 | 0 | retired page |
| 8 | 53 | 75 | 0 | retired page |
| 9 | 64566 | 67 | 0 | retired page |
| 10 | 343 | 58 | 0 | retired page |
| ... | 54 | 44 | 0 | retired page |
| N-3 | 23455 | 9 | 0 | retired page |
| N-2 | 345 | 7 | 0 | watched page |
| N-1 | 64545 | 2 | 0 | watched page |
| N | 45 | 1 | 0 | watched page |

| Available Positions | Page Number | Retirement Criteria Count | Rank | Purpose |
|---|---|---|---|---|
| 1 | 8534 | 202 | 0 | retired page |
| 2 | 3 | 180 | 0 | retired page |
| 3 | 25 | 172 | 0 | retired page |
| 4 | 444 | 152 | 0 | retired page |
| 5 | 6 | 144 | 1 | retired page |
| 6 | 90234 | 120 | 1 | retired page |
| 7 | 235 | 88 | 0 | retired page |
| 8 | 53 | 75 | 0 | retired page |
| 9 | 64566 | 67 | 0 | retired page |
| 10 | 343 | 58 | 0 | retired page |
| ... | 54 | 44 | 0 | retired page |
| N-3 | 23455 | 9 | 0 | retired page |
| N-2 | 345 | 17 | 0 | watched page |
| N-1 | 64545 | 2 | 0 | watched page |
| N | 45 | 1 | 0 | watched page |

602 — Available Positions
604 — Page Number
606 — Retirement Criteria Count
608 — Rank
610 — Purpose
206 / 208

Figure 10

| Available Positions | Page Number | Retirement Criteria Count | Rank | Purpose |
|---|---|---|---|---|
| 1 | 8534 | 202 | 0 | retired page |
| 2 | 3 | 180 | 0 | retired page |
| 3 | 25 | 172 | 0 | retired page |
| 4 | 444 | 152 | 1 | retired page |
| 5 | 6 | 144 | 1 | retired page |
| 6 | 90234 | 120 | 0 | retired page |
| 7 | 235 | 88 | 0 | retired page |
| 8 | 53 | 75 | 0 | retired page |
| 9 | 64566 | 67 | 0 | retired page |
| 10 | 343 | 58 | 0 | retired page |
| ... | 54 | 44 | 0 | retired page |
| N-3 | 345 | 17 | 0 | retired page |
| N-2 | 23455 | 9 | 0 | watched page |
| N-1 | 64545 | 2 | 0 | watched page |
| N | 45 | 1 | 0 | watched page |

Figure 11

| Available Positions | Page Number | Retirement Criteria Count | Rank | Purpose |
|---|---|---|---|---|
| 1 | 8534 | 202 | 0 | retired page |
| 2 | 3 | 180 | 0 | retired page |
| 3 | 25 | 172 | 0 | retired page |
| 4 | 444 | 152 | 0 | retired page |
| 5 | 6 | 144 | 1 | retired page |
| 6 | 90234 | 120 | 1 | retired page |
| 7 | 235 | 88 | 0 | retired page |
| 8 | 53 | 75 | 0 | retired page |
| 9 | 64566 | 67 | 0 | retired page |
| 10 | 343 | 58 | 0 | retired page |
| ... | 54 | 44 | 0 | retired page |
| N-3 | 345 | 17 | 0 | retired page |
| N-2 | 23455 | 9 | 0 | watched page |
| N-1 | 64545 | 2 | 0 | watched page |
| N | 45 | 1 | 0 | watched page |
| NEWLY DETECTED | 2345 | 5 | 1 | |

Figure 12

| Available Positions | Page Number | Retirement Criteria Count | Rank | Purpose |
|---|---|---|---|---|
| 1 | 8534 | 202 | 0 | retired page |
| 2 | 3 | 180 | 0 | retired page |
| 3 | 25 | 172 | 0 | retired page |
| 4 | 444 | 152 | 0 | retired page |
| 5 | 6 | 144 | 1 | retired page |
| 6 | 90234 | 120 | 1 | retired page |
| 7 | 235 | 88 | 0 | retired page |
| 8 | 53 | 75 | 0 | retired page |
| 9 | 64566 | 67 | 0 | retired page |
| 10 | 343 | 58 | 0 | retired page |
| ... | 54 | 44 | 0 | retired page |
| N-3 | 345 | 17 | 0 | retired page |
| N-2 | 23455 | 9 | 0 | watched page |
| N-1 | 64545 | 2 | 0 | watched page |
| N | 2345 | 5 | 1 | watched page |

Figure 13

| Available Positions | Page Number | Retirement Criteria Count | Rank | Purpose |
|---|---|---|---|---|
| 1 | 8534 | 202 | 0 | retired page |
| 2 | 3 | 180 | 0 | retired page |
| 3 | 25 | 172 | 0 | retired page |
| 4 | 444 | 152 | 0 | retired page |
| 5 | 6 | 144 | 1 | retired page |
| 6 | 90234 | 120 | 1 | retired page |
| 7 | 235 | 88 | 0 | retired page |
| 8 | 53 | 75 | 0 | retired page |
| 9 | 64566 | 67 | 0 | retired page |
| 10 | 343 | 58 | 0 | retired page |
| ... | 54 | 44 | 0 | retired page |
| N-3 | 345 | 17 | 0 | retired page |
| N-2 | 23455 | 9 | 0 | watched page |
| N-1 | 2345 | 5 | 0 | watched page |
| N | 64545 | 2 | 1 | watched page |

Figure 14

| Available Positions | Page Number | Retirement Criteria Count 1 | Retirement Count 2 | Rank |
|---|---|---|---|---|
| 1 | | | | |
| 2 | | | | |
| 3 | | | | |
| 4 | | | | |
| 5 | | | | |
| 6 | | | | |
| 7 | | | | |
| 8 | | | | |
| 9 | | | | |
| 10 | | | | |
| ... | | | | |
| N-7 | | | | |
| N-6 | | | | |
| N-5 | | | | |
| N-4 | | | | |
| N-3 | | | | |
| N-2 | | | | |
| N-1 | | | | |
| N | | | | |

Figure 15

| Available Positions | Page Number | Retirement Criteria Count 1 | Retirement Count 2 | Rank |
|---|---|---|---|---|
| 1 | 3 | 180 | 55 | 0 |
| 2 | 8534 | 202 | 23 | 0 |
| 3 | 25 | 172 | 33 | 0 |
| 4 | 444 | 152 | 22 | 0 |
| 5 | 90234 | 144 | 65 | 1 |
| 6 | 6 | 120 | 8 | 1 |
| 7 | 235 | 88 | 33 | 0 |
| 8 | 64566 | 67 | 6 | 0 |
| 9 | | | | |
| 10 | | | | |
| ... | | | | |
| N-7 | | | | |
| N-6 | | | | |
| N-5 | | | | |
| N-4 | | | | |
| N-3 | | | | |
| N-2 | | | | |
| N-1 | | | | |
| N | | | | |

| Available Positions | Page Number | Retirement Criteria Count 1 | Retirement Count 2 | Rank |
|---|---|---|---|---|
| 1 | 3 | 180 | 55 | 0 |
| 2 | 8534 | 202 | 23 | 0 |
| 3 | 25 | 172 | 33 | 0 |
| 4 | 444 | 152 | 22 | 0 |
| 5 | 90234 | 144 | 65 | 1 |
| 6 | 6 | 120 | 8 | 1 |
| 7 | 235 | 88 | 33 | 0 |
| 8 | 64566 | 67 | 6 | 0 |
| 9 | 343 | 58 | 23 | 0 |
| 10 | 54 | 44 | 5 | 0 |
| ... | ... | ... | ... | |
| N-7 | 345 | 11 | 3 | 0 |
| N-6 | 23455 | 45 | 5 | 0 |
| N-5 | | | | |
| N-4 | | | | |
| N-3 | | | | |
| N-2 | | | | |
| N-1 | | | | |
| N | | | | |

| Available Positions | Page Number | Retirement Criteria Count 1 | Retirement Count 2 | Rank |
|---|---|---|---|---|
| 1 | 8534 | 202 | 23 | 0 |
| 2 | 3 | 180 | 55 | 0 |
| 3 | 25 | 172 | 33 | 0 |
| 4 | 444 | 152 | 22 | 0 |
| 5 | 90234 | 144 | 65 | 1 |
| 6 | 6 | 120 | 8 | 1 |
| 7 | 235 | 88 | 33 | 0 |
| 8 | 64566 | 67 | 6 | 0 |
| 9 | 343 | 58 | 23 | 0 |
| 10 | 23455 | 45 | 5 | 0 |
| ... | ... | ... | ... | |
| N-7 | 54 | 44 | 5 | 0 |
| N-6 | 345 | 11 | 3 | 0 |
| N-5 | | | | |
| N-4 | | | | |
| N-3 | | | | |
| N-2 | | | | |
| N-1 | | | | |
| N | | | | |

Figure 18

| Available Positions | Page Number | Retirement Criteria Count 1 | Retirement Count 2 | Rank |
|---|---|---|---|---|
| 1 | 8534 | 202 | 23 | 0 |
| 2 | 3 | 180 | 55 | 0 |
| 3 | 25 | 172 | 33 | 0 |
| 4 | 444 | 152 | 22 | 0 |
| 5 | 90234 | 144 | 65 | 1 |
| 6 | 6 | 120 | 8 | 1 |
| 7 | 235 | 88 | 33 | 0 |
| 8 | 343 | 58 | 23 | 0 |
| 9 | 64566 | 67 | 6 | 0 |
| 10 | 54 | 44 | 5 | 0 |
| ... | ... | ... | ... | |
| N-7 | 345 | 11 | 5 | 0 |
| N-6 | 23455 | 45 | 5 | 0 |
| N-5 | | | | |
| N-4 | | | | |
| N-3 | | | | |
| N-2 | | | | |
| N-1 | | | | |
| N | | | | |

| Available Positions | Page Number | Retirement Criteria Count 1 | Retirement Count 2 | Rank |
|---|---|---|---|---|
| 1 | 8534 | 202 | 23 | 0 |
| 2 | 3 | 180 | 55 | 0 |
| 3 | 25 | 172 | 33 | 0 |
| 4 | 444 | 152 | 22 | 0 |
| 5 | 90234 | 144 | 65 | 1 |
| 6 | 6 | 120 | 8 | 1 |
| 7 | 235 | 88 | 33 | 0 |
| 8 | 343 | 58 | 23 | 0 |
| 9 | 64566 | 67 | 6 | 0 |
| 10 | 54 | 44 | 5 | |
| ... | ... | ... | ... | |
| N-7 | 345 | 11 | 5 | 0 |
| N-6 | 23455 | 45 | 5 | 0 |
| N-5 | 64545 | 8 | 2 | 0 |
| N-4 | 64546 | 8 | 2 | 0 |
| N-3 | 645 | 1 | 2 | 0 |
| N-2 | 45 | 1 | 1 | 0 |
| N-1 | 4500 | 1 | 1 | 0 |
| N | 4501 | 1 | 1 | 0 |

SYSTEMS AND METHODS FOR MEMORY FAILURE PREVENTION, MANAGEMENT, AND MITIGATION

INCORPORATION BY REFERENCE TO ANY PRIORITY APPLICATIONS

This application claims priority to U.S. Provisional Patent Application 62/787,496, which is titled "SYSTEMS AND METHODS FOR MANAGING MEMORY FAILURES" and was filed on Jan. 2, 2019, and to U.S. Provisional Patent Application 62/834,575, which is titled "SYSTEMS, DEVICES AND METHODS FOR BAD BLOCK RETIREMENT DESIGN AND IMPLEMENTATION IN MEMORY" and was filed on Apr. 16, 2019. The above-recited applications are incorporated herein by reference in their entirety.

Any and all applications for which a foreign or domestic priority claim is identified in the Application Data Sheet as filed with the present application are hereby incorporated by reference under 37 CFR 1.57.

BACKGROUND

Field of the Invention

This disclosure herein relates to computer memory and, in particular, to the detection and remediation of memory defects or failures.

Description of the Related Art

Memory failures are some of the most frequent types of compute server failures, aside from storage-related and software-related failures. Memory errors, unless prevented or managed properly, can be a significant source of system crashes and customer satisfaction issues. Therefore, ensuring reliable memory operation and managing possible memory errors is a task of the highest priority.

SUMMARY

For purposes of this summary, certain aspects, advantages, and novel features of the invention are described herein. It is to be understood that not all such advantages necessarily may be achieved in accordance with any particular embodiment of the invention. Thus, for example, those skilled in the art will recognize that the invention may be embodied or carried out in a manner that achieves one advantage or group of advantages as taught herein without necessarily achieving other advantages as may be taught or suggested herein.

The embodiments herein relate to systems and methods for preventing, managing, and mitigating memory failures. Certain embodiments relate to systems and methods for memory page or memory block monitoring and retirement.

Some embodiments herein relate to a computer-implemented method of monitoring and retiring memory pages in random access memory (RAM), the computer implemented method comprising: monitoring, by a computer system, correctable error statistics for each of a plurality of memory pages, wherein the correctable error statistics comprise one or more page retirement criteria, wherein the one or more page retirement criteria comprise a correctable error count, correctable error rate, or a time since a most recent correctable error; detecting, by the computer system, a high-risk page, wherein detecting the high-risk page comprises determining whether the page retirement criteria of the high-risk page has exceeded a retirement criteria threshold; placing, by the computer system, page information associated with the high-risk page on a retired page list, wherein the retired page list has a size corresponding to a number of spare pages stored in a reserved space of RAM; storing, by the computer system, identical data to data stored in the high-risk page in a spare page; and identifying, by the computer system in a mapping of the plurality of memory pages, the high-risk page such that one or more references to the high-risk page in the mapping are rerouted to the spare page, wherein the computer system comprises a processor and the RAM.

In some embodiments, the one or more page retirement criteria comprise a single page retirement criterion.

In some embodiments, the retirement criteria threshold comprises a predetermined, static threshold. In some embodiments, the retirement criteria threshold comprises a dynamically calculated threshold. In some embodiments, the dynamically calculated threshold is determined by calculating an outlier value based on a statistical distribution of the one or more page retirement criteria. In some embodiments, the statistical distribution comprises a normal distribution. In some embodiments, the outlier value is calculated using a formula comprising a mean and a standard deviation of the one or more page retirement criteria of the plurality of memory pages. In some embodiments, the outlier value comprises $M+V\sigma$, wherein M comprises the mean, wherein V comprises a variable number, and wherein $\sigma$ comprises the standard deviation.

In some embodiments, the monitoring the correctible error statistics and the detecting a high-risk page are completed by a Central Faults Tolerance Manager (CFTM) of the computer system.

In some embodiments, the one or more page retirement criteria comprises a plurality of page retirement criterion.

In some embodiments, the method further comprises reserving, by the computer system, the reserved space of RAM. In some embodiments, the reserved space comprises: a spare pages space comprising the spare pages; and the retired page list.

In some embodiments, the RAM comprises: a watched page list, wherein the page information associated with the high risk page is placed on the watched page list prior to placing the page information on the retired page list.

In some embodiments, the high-risk page is available for data allocation by the computer system prior to placing the page information on the retired page list.

In some embodiments, each of the plurality of pages comprises a 4 KB block of memory.

In some embodiments, the computer system comprises a RAM-based computer system without a hard disk drive or solid state drive.

In some embodiments, the one or more references to the high-risk page in the mapping are rerouted to the spare page, the high-risk page is moved to the reserved space of RAM.

In some embodiments, the computer system does not allocate data to pages in the reserved space of RAM.

In some embodiments, the spare page is moved to an available space of RAM after the computer system stores the identical data in the spare page.

Some embodiments herein relate to a computing system comprising: one or more computer readable storage devices configured to store a plurality of computer executable instructions; and one or more hardware computer processors in communication with the one or more computer readable storage devices and configured to execute the plurality of computer executable instructions in order to cause the system to: monitor correctable error statistics for each of a plurality of memory pages, wherein the correctable error statistics comprise one or more page retirement criteria, wherein the one or more page retirement criteria comprise a correctable error count, correctable error rate, or a time since a most recent correctable error; detect a high-risk page, wherein detecting the high-risk page comprises determining whether the page retirement criteria of the high-risk page has exceeded a retirement criteria threshold; place page information associated with the high-risk page on a retired page list, wherein the retired page list has a size corresponding to a number of spare pages stored in a reserved space of a RAM; store identical data to data stored in the high-risk page in a spare page; and identify, in a mapping of the plurality of memory pages, the high-risk page such that one or more references to the high-risk page in the mapping are rerouted to the spare page.

BRIEF DESCRIPTION OF THE DRAWINGS

The drawings are provided to illustrate example embodiments and are not intended to limit the scope of the disclosure. A better understanding of the systems and methods described herein will be appreciated upon reference to the following description in conjunction with the accompanying drawings, wherein:

FIG. 6 illustrates an example retired list and watched list of high-risk memory pages according to some embodiments herein.

FIG. 7 illustrates another example retired list and watched list of high-risk memory pages according to some embodiments herein.

FIG. 8 illustrates another example retired list and watched list of high-risk memory pages according to some embodiments herein.

FIG. 9 illustrates another example retired list and watched list of high-risk memory pages according to some embodiments herein.

FIG. 10 illustrates another example retired list and watched list of high-risk memory pages according to some embodiments herein.

FIG. 11 illustrates another example retired list and watched list of high-risk memory pages according to some embodiments herein.

FIG. 12 illustrates another example retired list and watched list of high-risk memory pages according to some embodiments herein.

FIG. 13 illustrates another example retired list and watched list of high-risk memory pages according to some embodiments herein.

FIG. 14 illustrates an example retired list and watched list of high-risk memory pages using multiple retirement criteria according to some embodiments herein.

FIG. 15 illustrates another example retired list and watched list of high-risk memory pages using multiple retirement criteria according to some embodiments herein.

FIG. 16 illustrates another example retired list and watched list of high-risk memory pages using multiple retirement criteria according to some embodiments herein.

FIG. 17 illustrates another example retired list and watched list of high-risk memory pages using multiple retirement criteria according to some embodiments herein.

FIG. 18 illustrates another example retired list and watched list of high-risk memory pages using multiple retirement criteria according to some embodiments herein.

FIG. 19 illustrates another example retired list and watched list of high-risk memory pages using multiple retirement criteria according to some embodiments herein.

DETAILED DESCRIPTION

Figure 1:
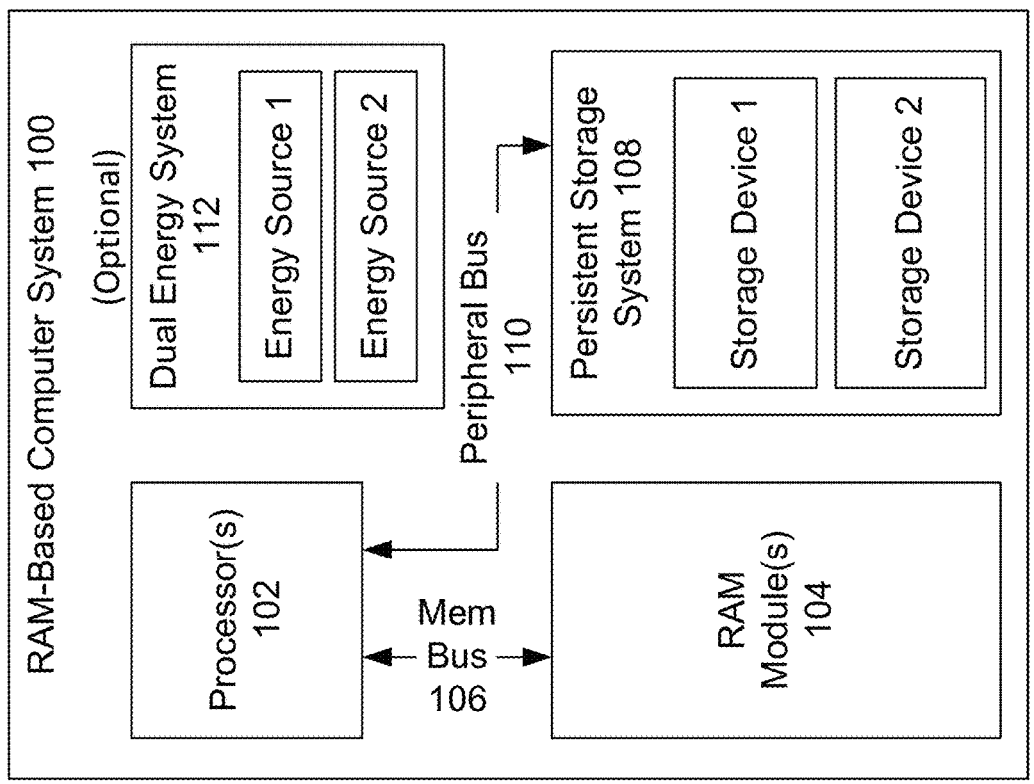
FIG. 1 is a block diagram representing one example of a RAM-based computer system.

Although certain preferred embodiments and examples are disclosed below, inventive subject matter extends beyond the specifically disclosed embodiments to other alternative embodiments and/or uses and to modifications and equivalents thereof. Thus, the scope of the claims appended hereto is not limited by any of the particular embodiments described below. For example, in any method or process disclosed herein, the acts or operations of the method or process may be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any particular embodiment. Thus, for example, various embodiments may be carried out in a manner that achieves or optimizes one advantage or group of advantages as taught herein without necessarily achieving other aspects or advantages as may also be taught or suggested herein.

This disclosure describes memory page or bad block monitoring and retirement algorithms, systems and methods for random access memory (RAM). In some embodiments, reliability issues or errors can be detected for multiple memory pages using one or more retirement criterion. In some embodiments, when reliability errors are detected, it may be desired to remove such pages from operation before they create a more serious problem, such as a computer crash.

As used herein, random-access memory (RAM) refers to any memory device that can be accessed randomly, such that a byte of memory can be accessed without touching the preceding bytes. RAM can be a component of any hardware device, including, for example, servers, personal computers (PCs), tablets, smartphones, and printers, among others. Typically, RAM allows data items to be read or written in almost the same amount of time irrespective of the physical location of data inside the memory. Generally, RAM takes the form of integrated circuit (IC) chips with MOS (metal-oxide-semiconductor) memory cells. RAM may refer generally to volatile types of memory, such as any type of dynamic RAM (DRAM) modules, high-bandwidth-memory (HBM), video RAM (VRAM) or static RAM (SRAM). In some embodiments, RAM may refer generally to non-volatile RAM, including, for example, read-only memory (ROM) or NOR-flash memory. Thus, as used herein, RAM is a generic term to generally refer to high-speed memory, including but not limited to SRAM, DRAM, MRAM and/or the like. This includes any commercially available RAM, such as those manufactured by Intel, Samsung, and others.

As used herein, operating system (OS) refers to software that manages the computer's memory and processes, as well as all of its software and hardware. Most modern operating systems employ a method of extending RAM capacity, known as virtual memory. A portion of the computer's hard drive is set aside for a paging file or a scratch partition, and the combination of physical RAM and the paging file form the system's total memory. When the system runs low on physical memory, it can "swap" portions of RAM to the paging file to make room for new data, as well as to read previously swapped information back into RAM. Excessive use of this mechanism results in thrashing and generally hampers overall system performance, mainly because hard drives are far slower than RAM.

In some embodiments herein, computers may be configured to operate without a traditional hard drive, such that paging information is stored in RAM. For example, an OS herein may comprise Forsa OS, developed and marketed by Formulus Black Corporation. Forsa OS enables any workload to run in memory, without modification. Furthermore, Forsa OS enables memory to be provisioned and managed as a high performance, low latency storage media. Thus, in some embodiments, substantially all computer data may be stored on RAM using, for example, forms of data amplification or compression. In some embodiments, an OS, middleware, or software can "partition" a portion of a computer's RAM, allowing it to act as a much faster hard drive. Generally, RAM loses stored data when the computer is shut down or power is lost. However, in some embodiments, RAM is arranged to have a standby battery source or other mechanisms for persisting storage are implemented to protect data stored in RAM. For example, methods and systems herein may be combined with data retention mechanisms, such as those described in U.S. Pat. No. 9,304,703 entitled METHOD AND APPARATUS FOR DENSE HYPER IO DIGITAL RETENTION, U.S. Pat. No. 9,628,108 entitled METHOD AND APPARATUS FOR DENSE HYPER IO DIGITAL RETENTION, and U.S. Pat. No. 9,817,728 entitled FAST SYSTEM STATE CLONING, each of which is hereby incorporated herein by reference in its entirety.

The bad-block detection and remediation systems and methods described herein may therefore be utilized in RAM-based computer systems, such as those described in U.S. patent application Ser. No. 16/222,543, which is incorporated herein by reference in its entirety. Furthermore, bad block remediation may be used in combination with data amplification systems and methods such as those described in U.S. Pat. No. 10,133,636 entitled DATA STORAGE AND RETRIEVAL MEDIATION SYSTEM AND METHODS FOR USING SAME, U.S. Pat. No. 9,467,294, entitled METHODS AND SYSTEMS FOR STORING AND RETRIEVING DATA, and U.S. patent application Ser. No. 13/756,921, each of which is hereby incorporated herein by reference in its entirety.

In some embodiments, RAM-based computer systems, devices, and methods may include and/or utilize specialized computer architectures. Specialized computer architectures may enable or facilitate one or more of the advantages associated with RAM-based computer systems, devices, and methods. For example, in some embodiments, specialized computer architectures can virtually increase the storage capacity of the RAM such that the RAM-based computer system, device, or method can store in RAM an equivalent amount of raw data that is greater than, and in many cases, substantially greater than the actual capacity of the RAM. In some embodiments, this can allow the RAM to be used as the primary storage for the entire system and allow all of the data to be accessed at high speeds over the memory bus. As another example, in some embodiments, specialized computer architectures can allow the data to be stored in a non-volatile manner such that if the system loses power, the data will be preserved. Additionally, in some embodiments, specialized computer architectures can allow the RAM-based computer system systems to be fault tolerant and highly available.

In some embodiments, an architecture for RAM-based computer system can comprise a single node system. In some embodiments, an architecture for RAM-based computer system can comprise a multi-node system.

In some embodiments, a computer architecture of a single node RAM-based computer system can comprise a fault tolerant, RAM-based computer architecture. FIG. 1 is a block diagram representing one example of a RAM-based computer system 100. In the illustrated example, the system 100 includes one or more processors 102 and one or more RAM modules 104. In some embodiments, the processors 102 are connected to the RAM modules by a memory bus 106. In some embodiments, the system 100 also includes a persistent storage system 108. In some embodiments, the persistent storage system 108 can include one or more persistent storage devices. In the illustrated example, the persistent storage system 108 includes two storage devices: storage device 1 and storage device 2. In some embodiments, the persistent storage system 108 is connected to the processors 102 by a peripheral bus 110. In some embodiments, the peripheral bus is a Peripheral Component Interconnect Express (PCIe) bus, although other types of peripheral buses may also be used. In some embodiments, the system 100 also includes a dual energy system 112. The dual energy system 112 can include at least two energy sources, for example, as illustrated energy source 1 and energy source 2. In some embodiments, the energy sources can each be a battery, a super capacitor, or another energy source.

In some embodiments, the system 100 can be configured to store substantially all of the data of the system 100 in the RAM modules 104. By way of comparison, conventional computer systems generally store a limited amount of data in RAM and rely on conventional storage devices for mass data storage. The system 100 can be configured to use the RAM modules 104 for even the mass data storage. In some embodiments, this advantageously allows all of the data to be quickly accessible to the processor over the high-speed memory bus 106 and dramatically increases the operating speed of the system 100.

Some types of RAM modules (e.g., DRAM) are generally volatile. Accordingly, to prevent data loss and make data storage non-volatile, in some embodiments, the system 100 includes the persistent storage system 108 and the dual energy system 112. In some embodiments, these components work together to make the system 100 essentially non-volatile. For example, the dual energy system 112 can be configured to provide backup power to the system 100 in case of power loss. The backup power provided by the dual energy system 112 can hold up the system for sufficient time to copy the contents of the RAM modules 104 to the persistent storage system 108. The persistent storage system 108 can include non-volatile, persistent storage devices (e.g., SSDs or HDDs) that safely store the data even with no power.

In some embodiments, the system 100 constantly mirrors the contents of the RAM modules 104 into the persistent storage system 108. In some embodiments, such mirroring is asynchronous. For example, the contents of the persistent storage system 108 can lag slightly behind the contents of the RAM modules 104. In some embodiments, in the event of power failure, the dual energy system 112 can hold up the system 100 for long enough to allow the remaining contents of the RAM modules 104 to be mirrored to the persistent storage system 108. In some embodiments, the system 100 only transfers the contents of the RAM modules to the persistent storage system 108 in the event of a power failure.

Although the illustrated embodiment of the system 100 includes both RAM modules 104 and a persistent storage system 108 that includes persistent storage devices, such as HDDs and SSDs, in some embodiments, the system 100 uses these components in a substantially different way than conventional computer systems. For example, as noted previously, conventional computer systems rely on RAM to quickly access a small portion of the data of the system and rely on conventional storage devices for long term and persistent data storage. Thus, in general, the entire amount of data used by conventional systems is only stored in the conventional storage devices. In contrast, in some embodiments of the system 100, substantially all of the data of the system 100 is stored in the RAM. This can allow all of the data to be quickly accessible by the processors 102 over the high-speed memory bus 106. In some embodiments, a second copy of the data (or an asynchronous copy of the data) can be provided in the persistent storage system 108 with the purpose of preserving the data in case of power loss to the system 100. Thus, through use of the persistent storage system 108 and the dual energy system 112 the system 100 can provide a solution to one of the disadvantages generally associated with RAM: its data volatility.

In some embodiments, the system 100 can provide a solution to another of the disadvantages generally associated with RAM: its limited capacity. In some embodiments, the system 100 can include a data reduction engine that can greatly reduce the data actually stored on the system 100. In some embodiments, the data reduction engine can use various techniques and methods for reducing the amount of data stored, including utilizing bit marker technology. The data reduction engine and data reduction methods will be described in detail below. In the system 100, in some embodiments, the data reduction engine can be executed on the one or more processors 102. In some embodiments, the data reduction engine is executed on an additional circuit of the system 100, such as an FPGA, ASIC, or other type of circuit. In some embodiments, the data reduction engine can use bit marker technology.

In some embodiments, the data reduction engine intercepts write requests comprising raw data to be written to a storage medium. In some embodiments, the data reduction engine can compress, de-duplicate, and/or encode the raw data such that it can be represented by a smaller amount of reduced or encoded data. In some embodiments, the smaller amount of reduced or encoded data can then be written to the RAM module(s). In some embodiments, the data reduction engine also intercepts read requests. For example, upon receipt of a read request, the data reduction engine can retrieve the smaller amount of compressed or encoded data from the RAM modules 104 and convert it back into its raw form.

In some embodiments, through implementation of the data reduction engine, the system 100 can be able to store an equivalent or raw data that exceeds, and in some instances, greatly exceeds the physical size of the RAM modules. In some embodiments, because of the data reduction engine, reliance on conventional storage devices for mass data storage can be eliminated or at least substantially reduced and mass data storage can be provided in the RAM modules 104.

In some embodiments, because the mass data storage is provided in the RAM modules 104, all of the data is quickly accessible over the high-speed memory bus 106. This can provide a solution to the disadvantage that is common in conventional computer systems that data retrieved from mass data storage must go over a slower peripheral bus. Because, in some embodiments, the system 100 does not need to access data from a conventional storage device over the peripheral bus, the overall speed of the system can be greatly increased.

In some embodiments, the system 100 includes a single processor 102. In some embodiments, the system 100 includes more than one processor 102, for example, two, three, four, or more processors. In some embodiments, the system can include one or more sockets. In some embodiments, the one or more processors 102 comprise multiple cores. In some embodiments, the processors comprise Intel processors, such as Intel's, Skylake or Kaby Lake processors, for example. Other types of processors can also be used, e.g., AMD processors, ARM processors, or others. In general, the system 100 can be configured for use with any type of processors currently known or that will come to be known without limitation.

In some embodiments, the system comprises one or more RAM modules 104. In some embodiments, the RAM modules 104 can be DIMMs (dual in-line memory modules) configured to connect to DIMM slots on a motherboard or on other components of the system 100. In some embodiments, the system 100 may include the maximum amount of RAM supported by the processors 102. This need not be the case in all embodiments, for example, the system 100 can include anywhere between 1 GB and the maximum amount of RAM supportable by the processors 102. In some embodiments, one or more individual RAM modules 104 in the system 100 can be the largest size RAM modules available. Currently, this is 128 GM or 256 GB. As larger sized RAM modules are developed, the system 100 can use the larger sized modules. In some embodiments, the system 100 can use smaller sized individual RAM modules, e.g., 1 GB, 2 GB, 4 GB, 8 GB, 16 GB, 32 GB, or 64 GB RAM modules. In some embodiments, the system includes between 1 GB and 3 TB or 6 TB of RAM. In some embodiments, the more memory (RAM) the system includes, the greater the possibility of greater data reduction, more processing power, and overall computer value.

In some embodiments, the RAM modules comprise DRAM, although other types of RAM modules can also be used. In some embodiments, the system uses NV-DRAM. In some embodiments in which NV-DRAM is used, the persistent storage system 108 and the dual energy system 112 can be omitted, as the NV-DRAM is already non-volatile.

In some embodiments, the computing system is configured to operate with only a processor and NVDIMMs (or NVRAMs or RERAMs) without the need for use of a conventional storage device. In some embodiments, the NVDIMMs utilizes cross-point memory (a faster version of flash memory based storage but still only accessible in block format, vs RAM which is random access down to bytes; further there are other versions of this faster flash being developed as well as others, but none are as fast, dense, or capable of small byte access such as RAM which is required by all applications and CPUs). In some embodiments, the NVDIMMMs are block addressable and/or can be configured to be inserted into a DIMM socket. In general, DIMMs can refer to the form factor of the memory in how such memory plugs into a motherboard or other interface. In some embodiments, the NVDIMMs comprise RAM (volatile memory) and flash memory (non-volatile memory) wherein the NVDIMMs use volatile memory during normal operation for speed and dump the data contents into non-volatile memory if the power fails, and does so by using an on-board backup power source to be described in more detail below. In some embodiments, the foregoing system operates at a slower processing speed than a computing system configured to operate with only a processor and RAM. In some embodiments, the computing system operating a processor with NVDIMMs can be more expensive to manufacturer due in part to the expense of NVDIMMs. In some embodiments, NVDIMMs require super caps and/or modification to the motherboard to provide energy to the NVDIMMs such that when the power goes down or while it was alive, it would then be able to retire the RAM to the flash without losing data. In some embodiments, NVDIMMs, using bit marker technology, can only store much less than, e.g., about $\frac{1}{10}^{th}$ to $\frac{1}{4}^{th}$, the amount of data that RAM (and at slower speeds than DRAM) is capable of storing by using bit marker technology. In some embodiments, NVDIMMs do not have very high storage density as compared to RAM or DRAM.

In some embodiments, utilizing only a processor and RAM, the system can comprise RAM that is configured to be plugged into an interface mechanism that can be coupled to a DIMM slot, wherein the interface mechanism comprises a power source. In some embodiments, the interface mechanism having a power source enables the data that is stored in the RAM to be persistently stored in the RAM in the event that there is a disruption in the supply of power to the RAM. In some embodiments, the back-up power source is not integrated into the interface mechanism, in which there would be some cases where there would be no need for an interface mechanism, but rather there is a power source(s) integrated into and/or coupled to the motherboard (or main CPU/RAM board) to supply back-up power to the entire motherboard which in turn would supply power to the RAM in the event there is a disruption in the supply of power to the computer system. Supplying power to the motherboard and/or RAM, in some embodiments, can ensure that the data stored in RAM persists in the event there is a disruption to the power supply.

In particular, referring back to FIG. 1, in some embodiments, the system 100 can be considered a merger of a server and an array controller with regard to data protection, high availability, and fault tolerance. In some embodiments, the system 100 fuses or combines two generally separated computer system functions: compute and storage. In some embodiments, the system 100 makes the RAM modules 100 the only storage media for applications to run against and thus all I/O requests remain on the very fast memory bus. Further, in some embodiments, the persistent storage system 108 and the dual energy system 112 provide that the data is nonvolatile. The persistent storage system 108 and the dual energy system 112 will now be described in detail.

Referring again to FIG. 1, in some embodiments, the system 100 can include a dual energy system 112 configured to provide sufficient backup power to allow the data stored in the RAM modules 104 to be copied to the persistent storage system 108 in the event of a power event, such as a loss of power to the system 100. Thus, the dual energy system 112 can be configured to provide that the data stored in the system 100 is effectively nonvolatile. In some embodiments, the dual energy system 112 provides sufficient energy to hold up the RAM modules 104 and/or the entire system 100 for a period of time after a power failure. In some embodiments, the period of time is at least 1 minute, at least 5 minutes, at least 10 minutes, at least 15 minutes, at least 30 minutes, at least 45 minutes, at least 1 hour, at least 1.5 hours, at least 2 hours, at least 2.5 hours, at least 3 hours, at least 3.5 hours, at least 4 hours, at least 5 hours, at least 8 hours, at least 12 hours, or longer.

In some embodiments, the dual energy system 112 is configured to provide power to the system 100 to save the contents of the RAM to persistent storage (e.g., persistent storage system 108). In some embodiments, transferring the data from the RAM to persistent storage can take 1 minute, 5 minutes, 10 minutes, 15 minutes, 30 minutes, 45 minutes, 1 hour, 1.5 hours, 2 hours, 2.5 hours, 3 hours, 3.5 hours, 4 hours, 5 hours, 8 hours, 12 hours, or longer, and as such, the dual energy system can be configured to provide enough power to keep the system powered on to allow for the data transfer, for example, at least 1 minute, at least 5 minutes, at least 10 minutes, at least 15 minutes, at least 30 minutes, at least 45 minutes, at least 1 hour, at least 1.5 hours, at least 2 hours, at least 2.5 hours, at least 3 hours, at least 3.5 hours, at least 4 hours, at least 5 hours, at least 8 hours, at least 12 hours, or longer.

In some embodiments, the dual energy system 112 includes two energy sources: for example, energy source 1 and energy source 2 as illustrated in the example embodiment of FIG. 1. In some embodiments, more than two energy sources are provided. In some embodiments, providing at least two energy sources increases the fault tolerance of the system 100. For example, it can avoid having a single point of failure for the system 100. In some embodiments, if one of the energy sources fails, the other can continue to provide power to the system 100. This can allow the system 100 to have a high availability, data protection, and fault tolerance.

In some embodiments, the energy sources 1 and 2 comprise batteries, super capacitors, or any other type of energy source configured to supply power or back up power to the system. For example, the batteries could be lead-acid batteries or any other type of battery. In some embodiments, the super capacitors could be super capacitors, electric double-layer capacitors (EDLCs), ultra-capacitors or Goldcaps, for example.

In some embodiments, the energy sources 1 and 2 are built within the system 100 itself, for example, attached to the motherboard or some other internal component of the system. In some other embodiments, the system 100 includes two power supplies and the power supplies are connected to external energy sources. In some embodiments, the external energy sources can comprise uninterruptable power supplies (UPSs) connected to the power supplies of the system 100. The uninterruptable power supplies may include backup energy sources, such as batteries, super capacitors, flywheels, etc. for providing backup energy in the event of a power loss.

In some embodiments, each of energy sources 1 and 2 can include features for remanufacturing and recalibrating the energy sources in some situations. The features may be implemented in software running on the UPSs. In some embodiments, these features may be controlled based on commands received from the system 100 or another system (e.g., a manager). In some embodiments, the commands can be sent to the UPS for example, over a network connection, such as an Ethernet connection.

In some embodiments, the dual energy 108 are configured to be able to remanufacture/recalibrate one of the energy sources while the other back up energy source remains engaged to protect the system from power loss. In some embodiments, the ability to remanufacture/recalibrate the energy source allows the energy source to last longer and/or be more accurate in the information that provides the system as to its charge level. For example, in some embodiments, system 100 or the dual energy system 112 is configured to allow and/or instruct one backup energy sources to go through the remanufacture/recalibration process and be taken offline.

In some embodiments, the remanufacture/recalibration process can comprise discharging the backup energy source (for example a lead-acid battery) to a threshold level, for example, 10%, 15%, 20%, 21%, 22%, 23%, 24%, 25% or the like. In some embodiments, the remanufacture/recalibration process can comprise performing a recalibration of the energy source such that when device comes back online, it not only extends the life of the backup energy source, but also it ensures that the backup energy source's health meter or charge meter is accurate. In some embodiments, this can be particularly advantageous because if a backup energy source inaccurately informs the system that it has a higher percentage of available energy in the system than it actually has, then the system could be in danger of not having enough energy to copy or mirror data from the RAM into a conventional storage device and/or other computing system during a power supply failure situation.

In some embodiments, the system (e.g., the system 100, the dual energy system 112, or another system) is configured to send an electronic communications signal to the backup energy source device to perform the remanufacture/recalibration process. In some embodiments, the backup energy source device itself (e.g., without receiving a command from another device.

In some embodiments, the remanufacture/recalibration process is performed on a periodic basis (for example, every several hours, every several days, every several months, or every several years). In some embodiments, the remanufacture/recalibration process is preformed when an energy source reaches a threshold level (for example, number of days since last remanufacture, or a low percentage of available energy in the energy source device, or any other threshold level). In some embodiments, the remanufacture/recalibration process is after detection of a power event (for example, a loss of power or a power surge). In some embodiments, the energy sources themselves (e.g., the UPSs), the dual energy system 112, the system 100, or another system is configured to detect power events. In some embodiments, detection of a power event may also cause the system 100 to copy the contents of the RAM 104 to the persistent storage system 108.

In some embodiments, when the remanufacture/recalibration process is performed, it is first performed on one of the energy sources while the other remains online. In some embodiments, when the remanufacture/recalibration process is complete on the first energy source, the second energy source may perform the remanufacture/recalibration process.

Although this disclosure refers to a "dual" energy system, it will be appreciated that, in some embodiments, a system can include only a single power source. For example, a system could include a single power supply connected to an AC power outlet. In such a system, in the event of a power loss, data in the RAM modules 104 may be lost. To alleviate the risk of data loss, in some embodiments, the system may continuously asynchronously copy the contents of the RAM modules 104 to the persistent storage system 108; however, it will be appreciated that due to the asynchronous copying method, some data may be lost in the even to of a loss of power. In another example embodiment, a system can include a single power supply connected to a single uninterruptable power supply (UPS), which includes, for example, its own battery backup. In the case of a power failure, in some embodiments, the UPS may provide sufficient backup power to copy the contents of the RAM modules 104 to the persistent storage device 112. However, it will be appreciated that if the single UPS also fails, data likely will be lost.

As noted above, in some embodiments, the system 100 can include a persistent storage system 108. In some embodiments, the persistent storage system 108 is configured to provide nonvolatile storage of data in the even to of a loss of power to the system 100. In some embodiments, as shown in FIG. 1, the persistent storage system 108 can include two storage devices: storage device 1 and storage device 2. In some embodiments, the persistent storage system 108 include at least two storage devices. Each of the storage devices can be a persistent storage device (i.e., a nonvolatile storage device that retains data even when unpowered). For example, each storage device can be an SSD, HDD, or the like.

In some embodiments, the multiple storage devices of the persistent storage system 108 can be configured in a mirrored or RAID configuration. For example, in some embodiments, the system includes two NVMe SSDs in a dual-write RAID-1 configuration. In this configuration, data can be written identically to two drives, thereby producing a "mirrored set" of drives. In some embodiments, a RAID configuration of the persistent storage system 108 can provide improved fault tolerance for the system 100. For example, if either storage device fails, the data is preserved in the other storage device. In some embodiments, other RAID levels can be used (e.g., RAID 2, RAID 3, RAID 4, RAID 5, RAID 6, etc.).

Although FIG. 1 illustrates the persistent storage system 108 with only two storage devices, in some embodiments more than two can be included, for example, two, three, four, five, six or more. In some embodiments, up to 16 storage devices are included. In some embodiments, up to 32 storage devices are included.

In some embodiments, as noted previously, the persistent storage system 108 can be used to provide an asynchronous backup of the data stored in the RAM modules 104. Thus, in some embodiments, in the event of a power failure, data related to transactions not yet completed can be lost. In general, this amount of data can be minimal. Accordingly, in some embodiments, the persistent storage system 108 provides a nonvolatile method for backing up the data in the RAM modules 104.

In some embodiments, data is continually backed up to the persistent storage device 108. For example, in some embodiments, the initial state of the data in the RAM modules 104 is copied to the persistent storage device 108, and then the system 100 continues to copy any changes in the data (i.e., the deltas) to the persistent storage device 108. In some embodiments, the system may not continuously copy data to the persistent storage device 108. For example, not continuously copying the data can allow the system to run at an even higher performance. In these systems, data may only be copied to the persistent storage device 108 when a power event is detected.

In some embodiments, the system persistent storage system 108 includes sufficient capacity to back up all of the RAM modules 104. Thus, in some embodiments, the size of the persistent storage system 108 is at least as large as the total size of the RAM modules 104. For example, if the system includes 3 TB of RAM, the persistent storage system 108 may include at least 3 TB of space. In RAID configurations, for example, the mirrored RAID 1 configuration described above, if the system includes 3 TB of RAM, each storage device of the persistent storage system 108 may include at least 3 TB of space.

In some embodiments, the persistent storage system 108 is not used for user data in the conventional sense. For example, in some embodiments, a user could not decide to save data to the persistent storage system 108. Rather, in some embodiments, user data is saved and accessed from the RAM modules 104. In some embodiments, a back-up copy of the customer data may be provided in the persistent storage system 108 but may generally not be visible to the user.

Although this disclosure refers to the persistent storage system 108 include two storages devices, it will be appreciated that, in some embodiments, a system can include only a storage. For example, a system could include an SSD backup. In such a system, in the event of a failure of the single drive, data may be lost.

Bad Blocks in RAM

As used herein, a bad block or page is an area of storage media that is no longer reliable for storing and retrieving data because it has been physically damaged or corrupted. A bad block comprises a size defined memory page aligned with a virtual address space, which may trigger an uncorrectable error. A bad block may be identified by CFTM with a specific algorithm and may be sent to an OS core engine with a virtual addressing identifier. In some embodiments, the core engine procedure may be based on the virtual addressing identifiers and perform the BBR procedure. However, the CFTM may comprise an obligation to continue tracking the corresponding physical location of the bad blocks (e.g. physical memory address, DIMM slot, etc.).

Bad blocks may also be referred to as bad sectors herein. There are two types of bad blocks: a physical, or hard, bad block comes from damage to the storage medium. A soft, or logical, bad block occurs when the operating system (OS) cannot access the bad block of memory or perform any type of read/write operations on the bad block.

In some embodiments, a bad block may comprise a physical bad block, wherein the physical bad block results from damage to the physical memory or storage medium itself. In the case of a physical bad block, the OS generally cannot access the bad block of memory or perform any type of read/write operations on the bad block. Generally, physical bad blocks cannot be repaired by software. Instead, for hard disk drives (HDDs) or solid state drives (SSDs), the bad block can generally be mapped such that the operating system avoids the block when reading data from or writing data to storage medium. However, for memory (RAM), such a solution does not exist. The hardware configuration and volatile nature of RAM have previously made bad block detection and remediation of memory particularly problematic.

In other embodiments, a bad block may comprise a soft or logical bad block that follows when the OS is unable to read data from a sector. Logical bad blocks may develop on computer memory or hard drives for a variety of reasons including, for example, virus/malware infection and improper shut down of the storage medium. As discussed below, software solutions exist for repairing logical bad blocks in hard disks. However, software for detection and remediation of logical bad blocks in memory have not been developed. Therefore, for novel computer systems, such as those that utilize RAM as a storage device using Real-Time Memory (RTM) to mimic traditional storage media, new systems, methods, and devices for resolving memory hardware failures are critical.

Examples of soft bad blocks in magnetic HDDs or SSDs include when the cyclic redundancy check (CRC), or error correction code (ECC), for a particular storage block does not match the data read by the disk. When a block is damaged or corrupted, the data stored at the block may be become inaccessible to the OS. Thus, if OS or application files are stored in a damaged block, that can cause OS errors or result in application failure. As the number of bad blocks increases, they can diminish the capacity and performance of the storage medium and eventually cause hardware failure. HDDs, SSDs, and other non-volatile storage mediums may manage bad blocks through OS disk utility software or through firmware of a controller on the hardware itself. These mechanisms may scan storage media and mark the damaged or error-prone blocks as unusable by the OS. This generally occurs when a block is being overwritten with new data. The controller may automatically remap bad blocks to a different sector, which is not used in future operations of the OS.

The bad block detection and remediation methods described above with respect to HDDs and SSDs are made possible because of integrated drive electronics including controllers capable of diagnosing bad blocks, as well as OS software designed to identify and mark bad blocks as unusable. In contrast, RAM does not include integrated controllers and OS's have previously lacked bad block management software for RAM. The hardware configuration and volatile nature of RAM have previously made bad block detection and remediation of memory particularly problematic. In particular, a physical memory device, such as a dual in-line memory modules (DIMM) controller may not comprise integrated bad block replacement functionality. Instead, memory devices may comprise an error-correcting code (ECC) feature of the memory device and an integrated memory controller (IMC), which may simply report single single-bit errors to the OS to correct those single-bit errors automatically. However, in the case of double-bit errors or multi-bit errors, the system may fail directly because of deficient bad block remediation functionality. Furthermore, a traditional OS may simply record and report single-bit errors to a user according to the machine check architecture. Those single bit errors may be marked as correctable errors, while for multi-bit errors, the OS may be unable resolve the error, resulting in critical failure. Finally, the approach that an OS may take to handle correctable errors may only be applicable on the System RAM, which is the normally usable RAM by all applications. However, in a system that provisions a specific range of memory as storage, as in an RTM system, since the RAM control ad management may bypass the traditional operating layer and be directed to supplemental software of an OS such as Forsa OS, a corresponding correction mechanism must be deployed to handle the hardware error and protect the system.

Further complications with bad block management in RAM arise from the volatile nature of RAM. For example, information about bad blocks, such as their location in virtual memory, must be stored persistently, such that the information is continuously available to the OS. Thus, if bad block information is to be stored in RAM, backup power and/or persistent memory mechanisms must be used to preserve the data upon power loss or computer/server shutdown. The bad block detection and remediation systems and methods described herein are compatible with mechanisms for persistent RAM, as discussed above.

OS Integration

Generally, the OS configures RAM to control how much memory is used by each application, including the OS itself. In some embodiments, the OS may reserve part or the entirety of a host physical memory, such as RAM, wherein the reserved space serves as storage space to higher-level applications. Thus, in some embodiments, it is the obligation of the operating system to maintain the healthy status of the corresponding physical memory and to prevent runtime exceptions caused by hardware failures such as bad blocks.

According to some embodiments herein, a bad block detection and remediation system may comprise a Central Faults Tolerance Manager (CFTM), which may assist the OS in identifying hardware failures in memory. The CFTM may identify, for example, a page comprising a defined range of compromised physical memory that may cause system level catastrophic failure in the future using one or more retirement criteria. In some embodiments, the defined range may comprise memory of about 4 KB (i.e. 4096 bytes) in size, which matches the traditional page size. However, the size of the compromised range of physical may be smaller or larger than 4 KB, depending on the particular application and computer processor architecture. For example, in some embodiments, the defined range may comprise about $2^2$ to about $2^{32}$ bytes. For example, defined range may comprise about $2^2$ bytes, about $2^3$ bytes, about $2^4$ bytes, about $2^5$ bytes, about $2^6$ bytes, about $2^7$ bytes, about $2^8$ bytes, about $2^9$ bytes, about $2^{10}$ bytes, about $2^{11}$ bytes, about $2^{12}$ bytes, about $2^{13}$ bytes, about $2^{14}$ bytes, about $2^{15}$ bytes, about $2^{16}$ bytes, about $2^{17}$ bytes, about $2^{18}$ bytes, about $2^{19}$ bytes, about $2^{20}$ bytes, about $2^{21}$ bytes, about $2^{22}$ bytes, about $2^{23}$ bytes, about $2^{24}$ bytes, about $2^{25}$ bytes, about $2^{26}$ bytes, about $2^{27}$ bytes, about $2^{28}$ bytes, about $2^{29}$ bytes, about $2^{30}$ bytes, about $2^{31}$ bytes, about $2^{32}$ bytes, or any value between the aforementioned values. The page size may be determined based on the desired page table size, as smaller page sizes will require a larger page table, which will in turn require more reserved space in RAM. However, page table size consideration must be balanced against internal fragmentation, as large page sizes will result in more wasted memory. This occurs because smaller page sizes ensure a closer match to the actual amount of memory required in any given memory allocation.

Therefore, in some embodiments, a specified portion of memory at the end of an RTM data segment is reserved as a substitution for bad blocks. This may be referred to as the reserved space. In some embodiments, the reserved blocks may only be used for a BBR procedure and may be unavailable for us by the OS core data path. In some embodiments, once all substitution blocks are exhausted, the CFTM may notify a user in order to replace bad DIMMs or perform other forms of memory cleanup.

In some embodiments, the CFTM module does not directly operate with the core engine data path of the OS, such that it cannot adequately protect the system alone. For example, the input/output (I/O) through the data path may trigger an unrecoverable failure once it targets at bad block, which the CFTM cannot control. Thus, in some embodiments, the core engine of the OS is designed and implemented to integrate with the CFTM and with specific mechanisms that cause the avoidance of an unrecoverable failure from the data path by preventing user inputs/outputs from transferring either from or to the bad block. In some embodiments, the mechanism may be defined as core engine Bad Block Retirement (BBR) methods.

Figure 2:
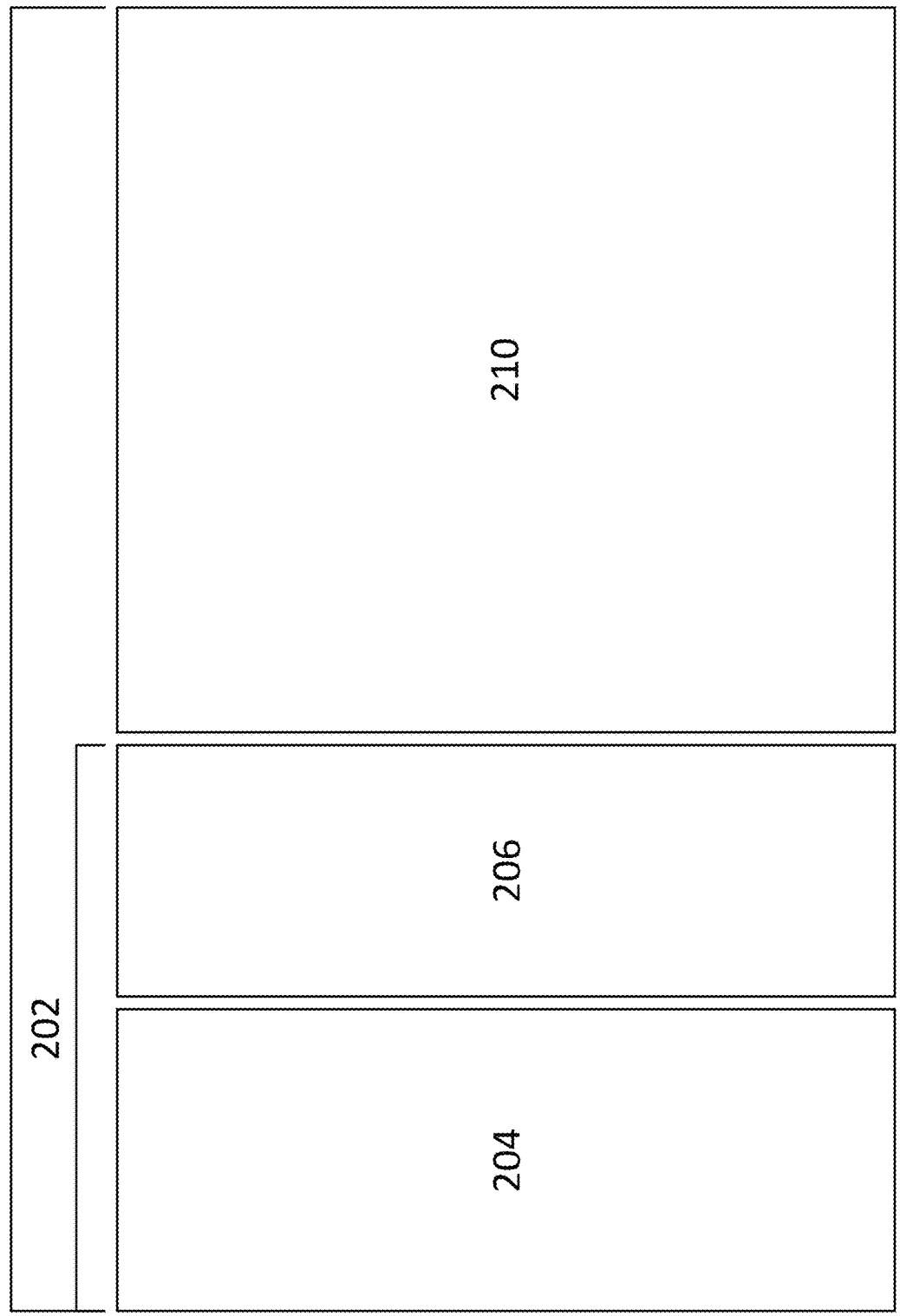
FIG. 2 illustrates an example RAM space allocation according to some embodiments herein.

FIG. 2 illustrates an example RAM space allocation according to some embodiments herein. Total RAM capacity 200 may comprise the cumulative available memory available to be allocated by the OS. Total RAM capacity 200 may represent the available memory of a portion of a DIMM, an entire DIMM, a plurality of DIMMs, a memory server, or a plurality of memory servers. In some embodiments, a portion of the total RAM capacity 200 is reserved space 202 comprising a page spares space 204 and a retired pages list space 206. In some embodiments, the reserved space 202 comprises memory reserved for bad block remediation mechanisms. In particular, the page spares space 204 comprises memory page spares that are made initially unavailable to the operating system, and can be used to replace retired pages as they are detected and identified by the CFTM and the OS. Thus, the memory page spares initially comprise empty memory pages that can be allocated data that was previously allocated to retired pages when the pages are retired. The retired pages list space 206 comprises a list of the retired pages and related information, such as the retired page number, retirement rank, and retirement criteria count, among others. The retirement rank may comprise a rank of the relative risk of the retired page compared to other retired, unretired, watched, or available pages based on the one or more retirement criteria. The retirement criteria count may comprise a count based on the application retirement criteria, such the number of total CEs, rate of CEs, or time since last error. Referring again to FIG. 2, available memory 210 may comprise the portion of RAM that is made available to the OS for OS and application processes of the core engine data path.

Figure 3:
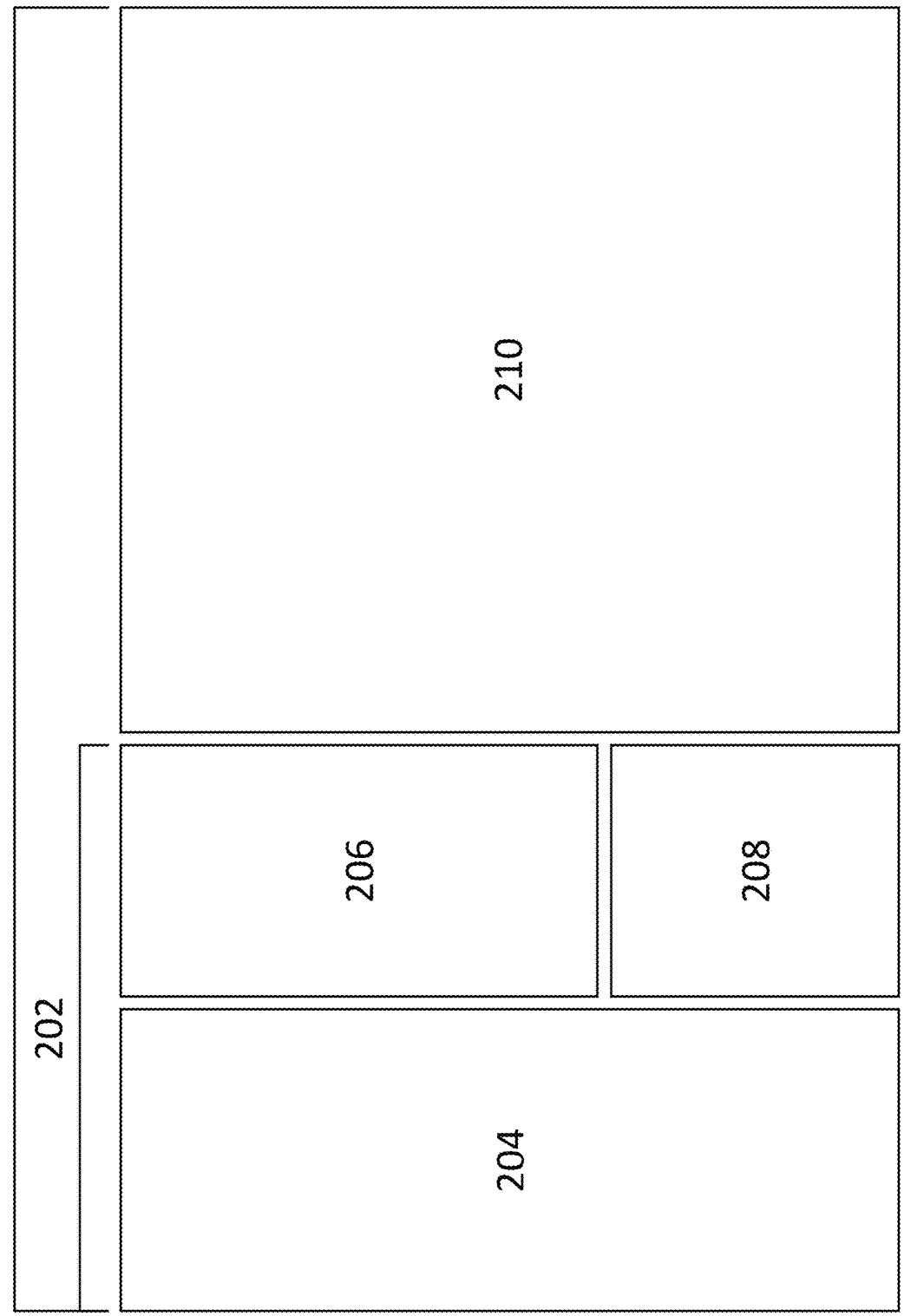
FIG. 3 illustrates another example RAM space allocation according to some embodiments herein.

FIG. 3 illustrates another example RAM space allocation according to some embodiments herein. As in the embodiment of FIG. 2, Total RAM capacity 200 may comprise a reserved space 202 comprising page spares space 204 and a retired pages list space 206. In addition, reserved space 202 may further comprise a watched pages list 208 comprising a list of watched pages, which are pages that are being monitored by the CFTM and/or OS, but are still available for use by the OS.

In some embodiments, the retired pages list size corresponds exactly to the capacity of pages in the page spares space 204. In other words, the retired pages list can list exactly the number of pages that correspond to the size of the page spares space 204. For example, if pages of size 4 KB are used for a given RAM architecture, and the page spare space 204 allocated is 4 MB in size, then, the number of records on the retired page list should be exactly equal to the allocation divided by the page size (e.g. 4 MB/4 KB=1000 records).

It will be appreciated that there can be many selected retirement criteria for deciding which page should be retired. Some of the retirement criteria are cumulative by nature (e.g. counters) and some others are not cumulative (e.g. rates). The time since last error, for example, is a cumulative counter and could be used as a possible retirement criterion in some embodiments when either pages with the oldest errors or the newest errors are considered as high-risk by the CFTM and listed as either retired or watched. The total number of errors per page is another example of a cumulative criterion. Alternatively, the rate of errors per unit time or a simple error detector (e.g. detecting the first error of a page) may be considered as short-term counters to calculate the rate of events or just a simple threshold-like criterion that may not necessarily need to keep track of event history. Additionally, in some embodiments, different combinations of different measurements could be used to form the new retirement criterion. In other words, various numeric measures of RAM failure risks could be used with the systems and methods described herein.

Several trusts and assumptions may be implemented for the core engine data path and BBR mechanisms to function more efficiently. Firstly, within the fully addressable virtual memory space, which is referred to as the real-time memory (RTM) address space or superblock herein, it may be assumed that there are critical reference counter and hash value areas within RAM that comprise relatively small ranges (e.g. less than 0.3 percent of the RTM). These ranges are not factored into the reserved space or available space of RAM discussed with respect to FIGS. 1 and 2. Thus, in some embodiments, the BBR functions may not apply on those ranges. Instead, in some embodiments, the CFTM will track errors that occur in those critical regions and notify a user of any errors.

In some embodiments, the BBR mechanism is not necessary in these critical regions, as these regions may not contain user data. Instead, in some embodiments, these regions may majorly participate in core algorithm operations. In some embodiments, these critical regions only comprise about 0.3% of the entire memory storage space, which may mean that the error occurrence within such region is relatively low. Furthermore, in some embodiments, these regions may be performance critical, such that applying BBR over these regions may introduce small performance overhead in the data path, which may be significant in those regions. Thus, in some embodiments, instead of performing BBR in these regions, the traditional operating system approach may be used to record and report errors that occur over those regions to the user, and let the user to decide whether the system should continue operating.

Secondly, in some embodiments, it may be assumed that the appearance of bad blocks in memory is not a frequent event. As such, in some embodiments, the OS may reserve a relatively small number of blocks from the RTM space as substitutions for bad blocks. As discussed above, in some embodiments, about 4096 bytes may be reserved from RTM virtual address space for spare pages. This may be referred to as the reserved space and may represent the space within the user data portion of the entire memory storage that is reserved for replacing bad blocks. This reserved space is limited. Thus, once the number of bad blocks reach the number of reserved blocks, the CFTM may notify the user in a proper way and may suggest replacement of physical memory. In some embodiments, the BBR function may not apply to the reserved blocks since those blocks are not used in the OS core engine data path.

Finally, in some embodiments, the systems and methods described herein may be designed to classify all bad blocks that are identified by CFTM as "highly suspected" or high-risk bad blocks, rather than confirmed bad blocks. In some embodiments, the core engine of the OS may frequently or substantially always have enough time to retire the high-risk blocks via the BBR mechanism as well as replace the bad block with a substitution spare block. However, in some embodiments, if an unrecoverable failure occurs during replacement of the bad block, the system may fail due to a machine check exception (MCE). An MCE is a type of computer hardware error that occurs when a computer's central processing unit detects an unrecoverable hardware error in the processor itself, the memory, the I/O devices, or on the system bus. In some embodiments, accessing a bad block will cause a transient or a hard/uncorrectable error. In general, an MCE that is caused by the uncorrectable cell is trapped by the OS kernel. Ideally, such an MCE should be trapped by a CFTM interrupt handler before reaching the OS. In some embodiments, this comprises a first step of BBR, which helps to detect and identify the hardware error or bad blocks.

Thus, even with the CFTM and BBR methods described herein, it may not be possible to permanently eliminate the occurrence of unrecoverable failure in an OS runtime because of memory hardware failure, especially in the event of sudden physical damage to RAM. However, the systems and methods herein may restrict the possibility of the appearance of a catastrophic exception to a reasonable and acceptably low level.

There are several additional challenges in designing and implementing BBR mechanisms for RAM, especially in RAM-based computer systems. For example, in some embodiments, the data path that handles I/O requests in the OS core engine may comprise a typical concurrent reference counting system. Thus, in some embodiments, one block in the RTM space may be referred to by a huge number of a logical block addressing (LBA) scheme from the provisioning layer of memory. In other words, there may multiple references to a bad block within the virtual memory address scheme of the OS. In some embodiments, this means that once a memory block in the RTM space is identified as a bad block and needs to be replaced, in some cases, multiple blocks from multiple devices may need to be concurrently marked as a bad block and need to be concurrently replaced from an OS or application perspective. Furthermore, each device may also contain multiple bad blocks in this case which must be repaired concurrently. Without concurrent repair and replacement of the multiple references to bad blocks, errors may still occur.

As discussed above, in some embodiments, a single bad block might be referenced by multiple storage devices provisioning according to an OS core engine algorithm. For example, one memory block may contain bytes comprising commonly used data, such that it may be used by multiple devices, as provisioned from the OS core engine. While inside the memory storage space, only one copy of the commonly used block may be needed, such that, if the block is being identified as a bad block, the system may have multiple bad references to the block within the memory-addressing scheme (e.g. LBA scheme). Thus, in some embodiments, when one block in the RTM space is identified as a bad block, some or all of the virtual block table (VBT) entries that point to the bad block may be defined as a bad reference. In some embodiments, the VBT contains a mapping of logical block addresses to the actual physical block address of a specific memory storage device. Each entry in the VBT may point to a specific physical storage block. Correction of each VBT entries corresponding to the bad block may be required.

In some embodiments, the number of bad references for a single bad block may correspond to a reference counter value for the block at the time when it is being marked. This reference counter value may be stored in t. In some embodiments, the CFTM may also track the number of bad references at a device level and/or system level. In some embodiments, once the number of bad references reach a predetermined specific threshold value, the CFTM may make a decision regarding further operations of the device and/or system with regard to the bad block to avoid memory failure.

Similar to blocks in the available RTM data block, each reserved block may have a corresponding reference counter in a reference counter segment and hash register at the critical reference counter and hash value areas within RAM. However, in some embodiments, the RTM new block allocating will not access the reserved region. In addition, in some embodiments, the BBR mechanism will not apply to the reserved space.

Because of the technical complexity associated with the LBA scheme of a RTM, the BBR mechanism for marking and replacing bad blocks may need to be designed to satisfy the concurrency requirement, especially in relation to real-time, active I/O operations. Furthermore, the concurrency design should not result in an apparent performance overhead to preserve a quality user experience. In some embodiments, benchmarks may be required to measure the overhead due to extra I/O operation branching and comparison operations within the existing I/O processing procedure that may be required by BBR.

Another challenge and design consideration involves the level of transparency of the BBR operations from the CFTM to an OS, the application level, and/or users. In some embodiments, the CFTM may not expose the execution details of the BBR mechanism to the application level of the OS. In other words, in some embodiments, the user may not and will not be aware of the existence of bad blocks and corresponding replacement operations, unless they monitor the bad block information from CFTM interfaces.

Thus, in some embodiments, the OS core engine will reroute I/O processing when it is remediating the bad blocks, without affecting user processes if the BBR procedure is performed successfully. However, in some embodiments, the CFTM may be configured to collect some or all of the bad block information and provide feedback to the user as an essential healthy status report. In some embodiments, the CFTM may allow a user to make a decision on whether the system should continually run as in normal state, regardless of the existence of bad blocks.

Bad Block Identification in the Core Data Path

Discussed below are various algorithms for marking and retiring bad blocks via the CFTM. However, once a bad block is identified and marked for the OS, it must be removed from the core engine data path to avoid referencing the retired bad block. Thus, mechanisms for removing retired bad blocks from the data path are needed.

As discussed above, in some embodiments, each data block in an RTM data segment has one reference counter in the reference counter segment and one hash register in the hash value segment. In some embodiments, the reference counter and the hash register comprise meta-words that may serve as bad block identifiers to the OS.

In some embodiments, a reference counter value for a normal data block is in a specified range, for example [0:65535]. In some embodiments, the CFTM BBR mechanism may set the reference counter to the maximal number of $(2^{16}-1)=65535$ to indicate that the corresponding block is a bad block. 65535 is the maximal value that a 16-bit unsigned word can present. In some embodiments, the system may mandatorily pick up the maximal value of an integer to indicate the error block. However, it will be appreciated that any reference counter value may be used to indicate a bad block. The maximal number may be used for convenience. In this example, all the reference counter value numbers below the max value indicates that the block is not a bad block. Using this mechanism, and because the reference counter value for a normal data block will range from 0 to 65534, a counter above this value may indicate that the data block is a bad block. In some embodiments, the bad block will be marked as a hotspot in RTM by the OS core engine and will not be utilized in future I/O processing.

In some embodiments, when a block is marked as a bad block, the corresponding hash register in the hash value segment may be immediately destroyed or otherwise removed, such that the hash register can be used as an I/O reroute gateway. In some embodiments, each hash register is a 64-bit word. In some embodiments, the highest 48 bits can be used to contain a replacement block or spare page LBA in the reserved space, while the lowest 16 bits can be used to contain the current reference counter value as the number of bad references.

In some embodiments, marking a block as a bad block may follow an extremely strict memory order. In some embodiments, the core engine may sometimes or substantially always first mark the reference counter value to 65534, which may fix the block at a specific location in the RTM space. In some embodiments, once the replacement of the bad block by a spare page is completed and the reroute gateway is setup and is visible to the OS, the core engine may issue a retirement command to set the bad block reference counter to 65535 to complete the retirement procedure. In some embodiments, after retirement, future I/O processing can be based on the reference counter value 65535 to avoid accessing the bad block. Instead, references to the bad block are rerouted to the spare page.

Bad Block Retirement Algorithms

Retirement of high-risk RAM memory pages may be advantageous. High-risk RAM memory pages may comprise bad blocks or blocks that are determined to be at risk of failure. A significant problem in high-risk pages in RAM is that RAM buffer space that can allocated for "page spares" may be limited. As used herein, page spares refer to pages that are reserved upon memory allocation, such that those pages are not available for the OS or applications for writing data. Instead, these pages are saved to replace pages that are detected by the CFTM to be high-risk pages. The methods and systems proposed herein are configured for handling high-risk pages under the constraints of the limited reserve space of RAM.

In some embodiments, reserved space is allocated in RAM for a plurality of spare pages that may replace pages that are determined to have a high risk of failure. The determination of risk may be based on one or more page retirement criteria. In some embodiments, the page retirement criteria may comprise the overall correctable error (CE) count, the CE rate (e.g. errors/time or errors/operation), or the time since last CE, among others. In some embodiments, these high-risk pages may be removed from operation and their data may be copied to spare pages that replace the high-risk pages.

In some embodiments, every such high-risk page meeting the one or more retirement criteria may be retired. This may represent the lowest-risk solution. However, in some embodiments, retiring every high-risk page may be impractical because each retired page must be immediately replaced with a spare page that is allocated from the reserved space of RAM. In some embodiments, this allocated reserved space has a limited size. Otherwise, the reserved space would be prohibitively large such that it may inhibit the primary functionality of the RAM.

Thus, in some embodiments, a list of retired pages may be created and updated over time as new high-risk pages are added to the retirement list. In some embodiments, high-risk pages may be removed or unretired from the retirement list, such that they may become available for use by the operating system again. In some embodiments, retired pages may be unretired based on one or more unretirement criteria. In some embodiments, the unretirement criteria may comprise the retirement age of a page, which may comprise the length of time for which the page has been on the retirement list, such that the "oldest" retired page may be unretired first. In some embodiments, once the allocated reserve space for the retirement list has been completely filled with retired pages, retired pages may be unretired when a new page meets the one or more retirement criteria. In some embodiments, the new high-risk page may replace the "oldest" retired page on the retirement list. In this case, the "unretired" page is added to the RAM available to the OS and can be used to store new data again, while the newly detected high-risk page becomes unavailable for use by the OS.

A potential drawback of using page retirement age as an unretirement criterion is that such an approach may result in some higher-risk pages being made available simply because their reliability issues manifested earlier than that for some other high-risk pages. Thus, another approach according to some embodiments is to prioritize memory pages in terms of their level of risk and make retirement decisions according to relative risk. Thus, in some embodiments, the retirement and unretirement criteria may be designed to assess the risk of page failure not only by the age of errors, but alternatively, by one or many criteria that are relevant to page's reliability.

As discussed below, the systems and methods described herein can be configured, in some embodiments, to maintain the list of retired pages as well as maintain a list of "watched" pages and dynamically re-arrange the pages in the retired list and watched list to minimize the overall risk of failure of one or more DIMMs, computer memory, or server memory as a whole.

In some embodiments, every page that meets the retirement criteria may be placed on a retirement list. In other embodiments, pages that meet the retirement criteria may be initially placed on a watch list, such that the pages are not immediately removed from use once the retirement criteria is met. Allocating pages to the watch list may allow for continuous or periodic collection of page statistics and comparison of watched pages to retired pages without utilizing the limited reserved space of the retirement list.

In some embodiments, a list is to be created to track both retired pages and watched pages. In some embodiments, the main difference between the above two categories is that each retired page is replaced with a spare page that is allocated from the reserved space of RAM, which has a limited size. On the other hand, watched pages may be those for which health statistics are being tracked, but the pages remain available for use by the OS, such that the reserved space of RAM is not reduced by placing pages on the watch list.

Single Page Retirement Criterion

In some embodiments, pages may be retired or watched based on a single retirement criteria, such as the overall correctable error (CE) count, the CE rate (e.g. errors/time or errors/operation), or the time since last CE for each page.

Figure 4:
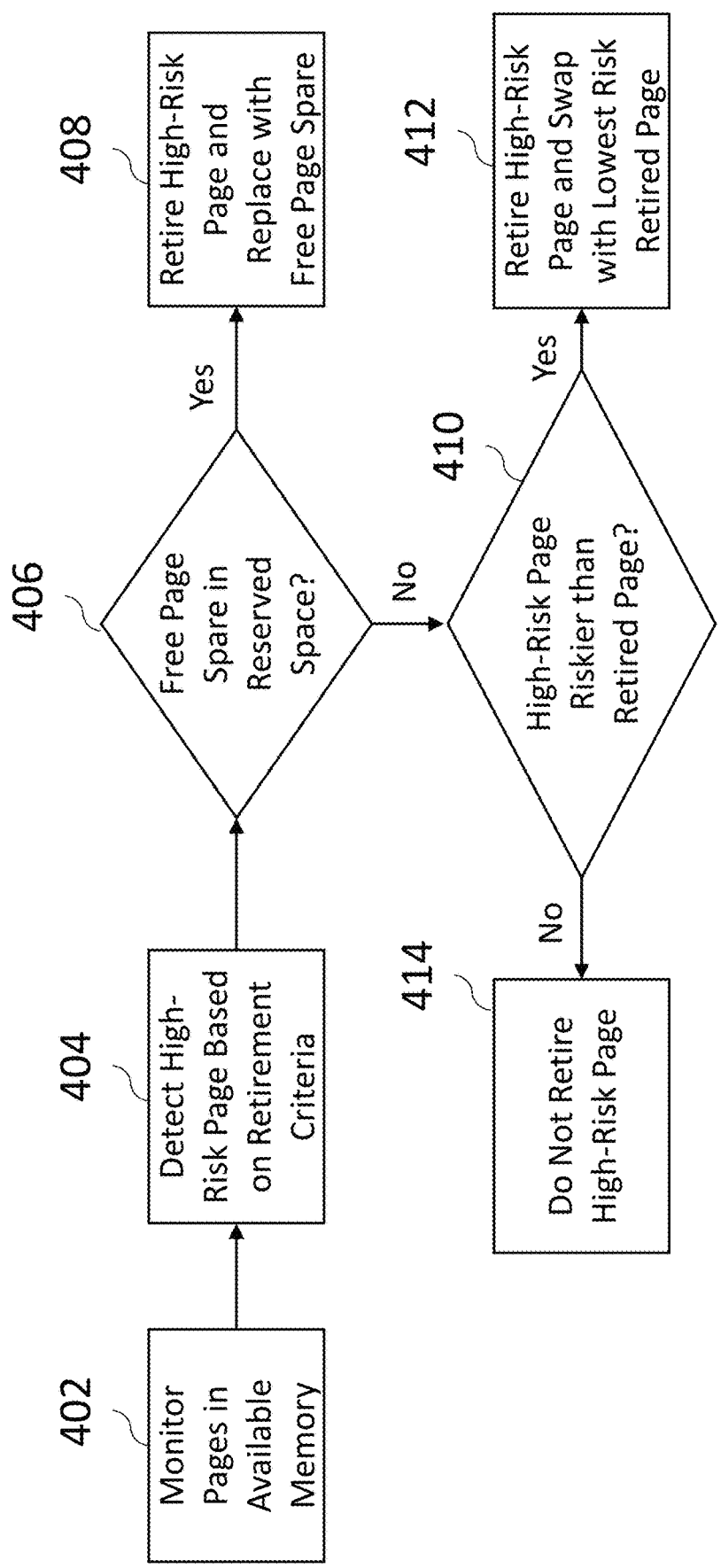
FIG. 4 illustrates a flowchart of an example process for bad block identification and retirement according to some embodiments herein.

FIG. 4 illustrates a flowchart of an example BBR algorithm using a single retirement criteria. First, pages in available memory may be continuously or periodically monitored for errors by the CFTM at 402. In some embodiments, the CFTM may comprise a configurable period parameter to scan memory pages for errors at the end of each period. In some embodiments, the period may comprise about 15 seconds. In some embodiments, the period may comprise about 0 s, about 1 s, about 2 s, about 3 s, about 4 s, about 5 s, about 10 s, about 15 s, about 20 s, about 25 s, about 30 s, about 35 s, about 40 s, about 50 s, about 1 min, about 2 min, about 3 min, about 4 min, about 5 min, about 10 min, about 20 min, about 30 min, about 40 min, about 50 min, about 1 h, about 2 h, about 3 h, about 4 h, about 5 h, about 10 h, about 1 day, about 2 days, about 3 days, about 4 days, about 5 days, about 6 days, about 7 days, about 8 days, about 9 days, about 10 days, about 1 month, about 6 months, about 1 year, or between any of the aforementioned values.

In some embodiments, one or more high-risk pages may be detected by the CFTM based on a selected single retirement criteria at 404. In some embodiments, once the CFTM has identified a high-risk page, the CFTM may notify the OS of the high-risk page. In some embodiments, the OS or CFTM may determine if there is a free page spare in reserved space 202 that can be used to replace the high-risk page at 406. In some embodiments, if the OS or CFTM determines that there is a free page spare, the detected high-risk page may be retired and replaced with a page spare at 408. Thus, initially, when the page spares space 204 is full of available or free page spares, every detected high-risk page exceeding a single selected page retirement criteria threshold may be deemed high-risk and/or retired until all free page spares have been used and the retired pages list has been filled. If, on the other hand, the retired page list has reached its size limit and, therefore, the page spares space becomes filled up completely with retired pages, the CFTM or OS may complete a risk assessment to compare the relative risk levels of the detected high-risk page and the previously retired pages at 410. In some embodiments, the detected high-risk page may compared to all of the pages on the retired pages list. Alternatively, the high-risk page may be compared to only a subset of the pages on the retired pages list.

In some embodiments, the CFTM or OS may determine if the high-risk page represents a higher level of risk of memory failure than the pages on the retired pages list at 410. In some embodiments, if the detected high-risk page is determined to be higher risk than at least one previously retired page based on the single retirement criteria, the high-risk page may swap the lowest risk retired page for the detected high-risk page at 412. Alternatively, if the detected high-risk page is determined to be a lower risk than all previously retired pages at 410, the high-risk page may not be retired at 414.

Using the above algorithm, there may be a risk that unretired high-risk pages will avoid retirement if historical cumulative retirement criteria counts are not preserved.

Thus, for embodiments that use cumulative counts as the single retirement criteria, such as the total number of errors or the time passed since last error, the cumulative counts for each page may need to be preserved as soon as the page is removed from the retired list. For example, if cumulative CEs are used as the page retirement criteria and a page that was initially retired with 66 cumulative CEs may be unretired from the list to accommodate a detected high-risk page with 67 cumulative CE. If not tracked, the unretired page will have its cumulative CE count reset to zero because it is impossible to store an error list of an unlimited size to track cumulative CEs for every page in the available space. Thus, in order for the unretired page to be retired again, it would need to accumulate at least 66 additional CEs if the cumulative count is not preserved.

Figure 5:
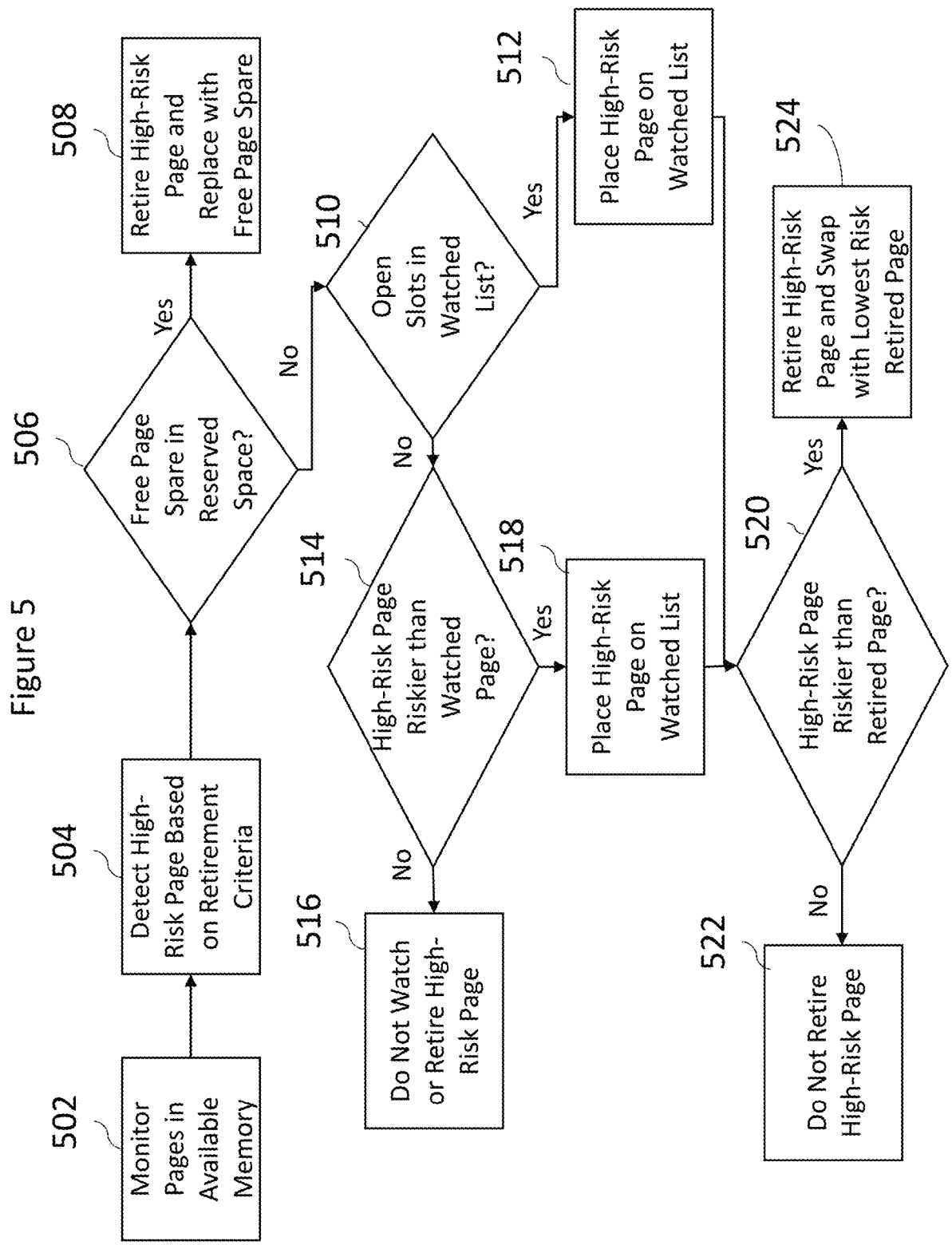
FIG. 5 illustrates a flowchart of an example process for bad block identification and retirement according to some embodiments herein.

To avoid the above issue, an alternative BBR algorithm may be used. FIG. 5 illustrates a flowchart of another example BBR algorithm using a single retirement criteria. First, pages in available memory may be continuously or periodically monitored for errors by the CFTM at 502. In some embodiments, one or more high-risk pages may be detected by the CFTM based on a selected single retirement criteria at 504. In some embodiments, once the CFTM has identified a high-risk page, the CFTM may notify the OS of the high-risk page. In some embodiments, the OS or CFTM may determine if there is a free page spare in reserved space 202 that can be used to replace the high-risk page at 506. In some embodiments, if the OS or CFTM determines that there is a free page spare, the detected high-risk page may be retired and replaced with a page spare at 508. Thus, initially, when the page spares space 204 is full of available or free page spares, every detected high-risk page exceeding a single selected page retirement criteria threshold may be retired until all free page spares have been used and the retired pages list has been filled. If, on the other hand, the retired page list has reached its size limit and, therefore, the page spares space becomes filled up completely with retired pages, the CFTM or OS may determine if there are any open slots in the watched pages list 208. If the OS or CFTM determines that there is an open space, the detected high-risk page may be placed on the watched page list 208 at 512. Thus, when all the page spares in reserve space 202 have been used, a newly detected high-risk page may be placed initially in the watch list for further monitoring and comparative analysis.

Upon placement on the watch list at 512, the high-risk page may be compared with pages on the retired list at 520 to determine if it is a higher-risk page than any of the retired pages based on the retirement criteria. If the high-risk page on the watch list is a lower risk page than all of the retired pages, it may remain on the watch list and may not be retired at 522. If, however, the watched page is determined to be riskier than at least one retired page based on the retirement criteria at 520, it may be retired and replaced with the unretired page at 524, while the unretired page will become available for use by the OS again. In some embodiments, the least risky retired page, based on the retirement criteria, may be unretired.

Referring again to FIG. 5, if the CFTM or OS instead determines, at 510, that there are no open slots in the watched list 208, then the CFTM or OS may complete a comparative analysis, based on the selected retirement criteria, of the high-risk age and the existing watched pages at 514. If the high-risk page is determined to be of lower risk than all watched pages, it will not be placed on the watched list 208 or the retired list 206 at 516. If, however, the high-risk page is determined to be riskier than at least one page on the watch list, it replaces the least risky page on the watched pages list 208 based on the retirement criteria at 518. Once placed on the watched pages list 208, the risk level of the high-risk page may be periodically or continuously compared to pages on the retired list 206 at 520. If the high-risk page on watched list 208 is determined to be less risky than every page on retired list 206, it may not be retired and may remain on the watched list 208 at 522. Alternatively, if the watched page is determined to be riskier than at least one retired page based on the retirement criteria at 520, it may be retired and replaced with the unretired page at 524, while the unretired page will become available for use by the OS again. In some embodiments, the least risky retired page, based on the retirement criteria, may be unretired.

In some embodiments, all of the high-risk pages not on the retirement list are first moved to the watched list, which is also limited in size and represents the user-defined fraction of the total list available. Ideally, the CFTM and OS could keep track of every page meeting at least one retirement criterion even after removal from the retired page list. However, this is impractical due to a limited size of the reserved space 202 of memory.

High-risk pages thus become watched pages and stay on watched pages list 208 until either of the following situations occur. First, if another high-risk page that has not yet been placed on either the retired list 206 or the watched list 208 having riskier retirement criteria statistics is detected, it will replace the high-risk page on the watch list having the least risky retirement criteria statistics. In this case, the new high-risk page is swapped with the page on the watch list. However, both pages remain available for the OS and applications to use, since watch list pages are not removed from utilization. Second, if a watched page's retirement criteria statistic subsequently exceed the retirement criteria statistic of a retired page, the watched page and the retired page are swapped and the retired page gets unretired, which means that its capacity becomes available for new data again. In this case, the unretired page remains on the watch list until one of the above two situations occurs.

An example retired list 206 and watched list 208 of high-risk memory pages according to some embodiments herein is illustrated in FIG. 6. As discussed above, a RAM buffer is allocated to hold a list of N high-risk DRAM pages. In some embodiments, K positions at the end of the list are reserve for the watched list 208. Therefore, in some embodiments, (N–K) positions are allocated for (N–K) retired pages in a retired list 206 and this number of (N–K) pages multiplied by page size corresponds exactly to the capacity of the page spares space 204. In the illustrated example of FIG. 6, K=3. Therefore, the watched page list could contain up to three (3) records only in the illustrated embodiment. It will be appreciated that the watched pages list 206 could contain any desired number of records. As discussed above, watched list 208 includes pages that are not retired but have already show some health issues based on one or more retirement criteria and may need to be monitored. In the illustrated embodiment, the list is being filled with the records as errors appear over time and remains unsorted. FIG. 6 shows the unsorted lists that are only partially filled with retired pages, including the available positions 602 up to N, page numbers 604, their relevant retirement criteria statistics 606 (e.g. total CE errors) and the page RAM rank 608. The purpose 610 is shown for exemplary purposes and may not be stored in retired list 206 and watched list 208. Thus, additional high-risk pages could be added to the retired list 206 without unretiring any retired pages. In this case, every new retired page and its info is added to the next available row below. In some embodiments, no list sorting is needed until the limit of the retired page spares space is reached. The numerical values of the example lists provided herein are exemplary in nature and are not meant to be limit the scope of this disclosure.

FIG. 7 illustrates another example retired list 206 and watched list 208 according to some embodiments herein. In the illustrated embodiment of FIG. 7, the retired page list 206 is completely full. This corresponds to the situation in which when page spares space 204 has been filled completely with retired pages. At this point, in some embodiments, newly detected high-risk pages are added to the watched list 208 until the watched list 208 is also full, as described with reference to the flowchart of FIG. 5. In the illustrated embodiment of FIG. 7, the lists have not yet been sorted FIG. 8 illustrates another example retired list 206 and watched list 208 according to some embodiments herein. In the illustrated embodiment of FIG. 8, both lists have been completely filled with high-risk pages. In some embodiments, when both the retired list 206 and the watched list 208 have been filled, both lists may be sorted by the retirement criterion to perform a risk assessment and comparative analysis of the pages. In some embodiments, the pages are sorted from highest risk to lowest risk page based on retirement criteria count, as shown in FIG. 8. For example, in FIG. 8, the highest risk page (Page Number 8534) has a retirement criteria count of 202 and the lowest risk page (Page Number 45) has a retirement criteria count of 1. In some embodiments, when a new entry is added to the watched list 208 or any other change is made to a completely filled retired list 206 or watched list 208 such as a change in the retirement criteria count of any page in either list, the lists may be re-sorted. In some embodiments, this re-sorting ensures that the highest risk pages are always retired and the corresponding page entries are moved to the retired list 206.

FIG. 9 illustrates another example retired list 206 and watched list 208 according to some embodiments herein. The lists of FIG. 9 correspond to the case of a watched list page that has generated a retirement criteria count (e.g. cumulative CEs) at levels exceeding a retired page on the retired list 208. For example, in FIG. 9, Page Number 345 of watched list 208 has generated a retirement criteria count of 17, while Page Number 23455 of retired list 206 has generated a retirement criteria count of 9. The above situation may occur if pages are monitored periodically and, for example, Page Number 345 had 7 CEs generated and Page 23455 had 9 CEs generated prior to the most recent periodic memory check, and Page 345 generated 10 CEs and Page 23455 generated 0 CEs in the period between a previous periodic memory check and the most recent periodic memory check. Thus, the illustrated embodiment may represent the lists prior to a new sorting of the list pages.

FIG. 10 illustrates another example retired list 206 and watched list 208 according to some embodiments herein. The illustrated embodiment of FIG. 10 may represent the table of FIG. 9 with a newly sorted retired list 206 and watched list 208. Since Page Number 345 has a higher retirement criterion count 606 than Page Number 23455, it may added to the retired list 206, while Page Number 23455 is moved to the watched list 208. In the illustrated embodiments, Page Number 23455 was the retired page with the lowest retirement criteria count and was therefore unretired in favor of the higher risk Page 345. Effectively, the data of page 345 may be moved to the newly available capacity space offered by page 23455, which is now considered as lower reliability risk than the page 345. Meanwhile, Page 345 is now retired and removed from the available RAM capacity space 210.

FIG. 11 illustrates another example retired list 206 and watched list 208 according to some embodiments herein. In the illustrated example, the CFTM has detected a new high-risk page (Page Number 2345), which has a higher retirement criteria count 606 than one or more pages in the watched pages list 206. In the illustrated embodiment, a comparative analysis and re-sorting of the watched list 208 and retired list 206 has not yet occurred. Page 2345 has not yet been added to either list and thus remains available for use by OS and applications. In this case, the retirement criteria count 606 for the newly detected page may compared to the last (Nth) page in the table. As discussed with reference to the flowcharts of FIGS. 4 and 5, if the retirement criteria count 606 for the newly detected page is lower than every page in the retired list 206 and the watched list 208, it is rejected and ignored. However, in the illustrated embodiment, Page 2345 has a retirement criteria count 606 that is higher than at least one page in the watched list 208. Thus, the Page 2345 may be placed on the watched list 208 and a page from the watched list 208 will be removed.

FIG. 12 illustrates another example retired list 206 and watched list 208 according to some embodiments herein. FIG. 11 illustrates the results of resorting the table of FIG. 11. In particular, since Page Number 2345 has a retirement criteria count 606 that is higher than at least one page in the watched list 208, it is swapped for the Nth page in the table. In some embodiments, the Nth page is removed from the watched list 208. In the illustrated example, memory Page Number 45 is removed.

FIG. 13 illustrates another example retired list 206 and watched list 208 according to some embodiments herein. In the illustrated example, the retired list 206 and watched list 208 of FIG. 12 have been re-sorted according to the retirement criteria count 606. It is noted that after the entire lists are sorted, Page Number 2345 has moved higher on the list than Page Number 6454. In the illustrated embodiment, the records are sorted according to the retirement criteria count 606 in in the order of declining risk. Newly detected high-risk pages are added and the lists are re-sorted according to the processes described in FIGS. 6-13.

To summarize, the above disclosure addresses RAM memory page retirement after a high risk of failure is detected for a given memory page. Systems, methods, and algorithms are proposed to handle such high-risk RAM pages in the case of a single page retirement criterion such as the cumulative CE count, CE rate, or time since last CE, among others. Two different and complementary ways to manage high-risk pages can include retiring a page that met the retirement criterion or placing a page meeting a retirement criterion on a watched list 208. In some embodiments, the systems, methods, and algorithms may include one list of limited size to manage high-risk pages, or separate lists comprising all the retired pages and watched pages. The size of retired list 206 may correspond exactly to the number of page spares in the page space 204. The watched list 208 may contain those high-risk pages that are not retired yet but need to be monitored.

This disclosure proposes systems, methods, and algorithms that can retire RAM memory pages that meet a specific retirement criterion, monitor those pages that also meet the retirement criteria but represent a lower risk level of failure at the moment of testing according to the retirement criterion, and manage all of the above when either the retired page list 206 and/or the watched list 208 is also filled.

In addition, this disclosure proposes systems, methods, and algorithms to add new pages to the retired list 206, add new pages to the watch list 208, swap pages between the lists, remove a page from either list, and to terminate monitoring of some pages altogether.

Dynamic Page Retirement

This section relates to systems and methods for managing memory failures. Certain embodiments relate to a systems, methods, and devices for dynamic page retirement for RAM. In some embodiments, the systems and methods proposed below do not rely on a constant, fixed decision-making threshold and processes, but rather estimate retirement criteria thresholds in real time based on the available data and the statistics about correctable memory errors (CEs).

As discussed above, a static, fixed threshold for a retirement criterion may be used to determine whether a memory page is deemed high-risk, watched, and/or retired. However, in some embodiments, using a static, fixed, unchanging threshold for CE retirement decisions may be too simplistic and inflexible. For example, if such a threshold remains fixed over time, it is unlikely that it will work equally well for different RAM suppliers (e.g. Samsung vs Intel), different DRAM types (e.g. DDR3 vs. DDR4, 128 GB vs. 256 GB, etc.), and different server types, all having different characteristics, design, and reliability levels. Furthermore, CE cumulative count and CE rate may increase over time but have a non-linear effect on the rate of unrecoverable memory errors. Finally, any mistake in setting such a static threshold could result is a higher than necessary replacement rates for very expensive RAM DIMM units if set too low or, in missing potential reliability issues if set too high. Therefore, this disclosure describes using server health monitoring to calculate such a retirement criteria threshold dynamically to decide which pages should be retired in response to changing environments and RAM behaviors over time.

In certain embodiments, an algorithm can be used to dynamically calculate such a page retirement threshold and make page retirement decisions differently over time. These algorithms should allow a reduction in RAM replacement rate without sacrificing reliability.

In some embodiments, multiple different retirement threshold definitions for the same memory page can include, for example, a first retirement criteria and a second retirement criteria. In some embodiments, the first or second retirement criteria may comprise the rate of CEs or the number of CEs per a selected time period. In some embodiments, the other retirement criteria may comprise a cumulative count of CEs since the start of page use. However, it will be appreciated that other retirement criteria definitions are possible as well as their combinations.

In some embodiments, a statistical distribution of all the correctable errors and their counts across the memory pages can be used to dynamically calculate retirement criteria thresholds. In some embodiments, the statistical distribution may be assumed or dynamically determined by monitoring a subset or all of the memory pages of the system. In some embodiments, a normal destruction of CEs may be assumed. In some embodiments, the upper boundary for the majority (e.g. about 99.7%) of all the possible values in the population equals the MEAN+3σ, wherein σ is the standard deviation of the distribution. For the normally distributed data set, only 0.3% of all the population values would be found outside of this boundary as 97.3% of them is located between the population MEAN and 3×Sigma.

In some embodiments, a dynamic retirement criteria threshold can be constantly calculated as equal to the mean+3σ upper boundary using, for example, the most recent CE rate values and cumulative CE error counts observed across a subset of the memory space to the entire memory space from all the available RAM pages and to set the threshold according to the following formula: Threshold=Max (1, population mean+3σ).

In other words, per the formula above, the retirement criteria threshold cannot be less than one, which will be its starting value, but over time could be set at nearly any value depending on the CE count and rate statistics. In some embodiments, the mean and the standard deviation are calculated for a configurable time period that is configurable. In some embodiments, the time period may be about 24 hours. In some embodiments, the time period may be about 0 s, about 1 s, about 2 s, about 3 s, about 4 s, about 5 s, about 10 s, about 15 s, about 20 s, about 25 s, about 30 s, about 35 s, about 40 s, about 50 s, about 1 min, about 2 min, about 3 min, about 4 min, about 5 min, about 10 min, about 20 min, about 30 min, about 40 min, about 50 min, about 1 h, about 2 h, about 3 h, about 4 h, about 5 h, about 10 h, about 1 day, about 2 days, about 3 days, about 4 days, about 5 days, about 6 days, about 7 days, about 8 days, about 9 days, about 10 days, about 1 month, about 6 months, about 1 year, or between any of the aforementioned values.

As a result of periodically or continuously calculating a dynamic retirement criteria threshold for the memory, the threshold may change over time. In some embodiments, the threshold starts at one (1) but changes over time and may rise and fall, depending on how the statistical population of pages in memory behaves over time.

Two examples approaches are described below to estimate the health risk for memory pages: by the rate of CEs measured in CE count per unit time, or by the total or cumulative count of CEs since a specified time such as the beginning of operation of the page. In some embodiments, a page retirement decision can be made, for example, if either CE rate or CE cumulative count is above the threshold, indicating that a page is anomalous. In some embodiments, this may represent a reliability-focused decision, since it requires an anomalous indicator using only one retirement criteria. Alternatively, a retirement decision can be made if both CE rate and CE cumulative count for a single page are both above the static or dynamically calculated threshold. This approach may be employed when page preservation in usable memory is of a high priority. In some embodiments, once a page has been retired, it may be removed from the statistical population for which the dynamic threshold is calculated.

In some embodiments, if a reliability-focused decision is used such that a page is retired if any retirement criteria threshold is exceeded, then all retirement criteria must be monitored concurrently because they are not necessarily correlated. For example, it is possible that some pages can exhibit a slow increase or drift in CE cumulative count, such that no individual CE ever causes the page to have a CE rate over the threshold. Thus, tracking cumulative CE count may be used to retire pages that consistently produce CEs at a relatively low rate. In some embodiments, the opposite phenomenon is also possible, wherein some pages may exhibit a sharp increase in CE rate for short periods of time, but the CE cumulative count never exceeds the threshold. In this case, the pages may nonetheless be retired for exceeding the CE rate threshold despite never crossing the CE cumulative count threshold.

Finally, the above method for calculating a dynamic threshold is not limited to the equation shown above (population mean+3σ) but could be modified to better suit the shape of the realistic statistical distribution of CE cumulative counts, rates, and other statistics across the memory pages.

For example, the population median or other statistical measures could be used instead of the mean. Furthermore, other multipliers rather than three (3) could be used in combination with the standard deviation depending on the desired retirement characteristics. As the shape of the distribution changes, for example from symmetric to asymmetric with a long tale, the calculation could be changed to achieve desired retirement rates and low risk of memory failure. However, in some embodiments, the goal of the dynamic threshold calculation may be to describe mathematically some very small fraction of the page population that is statistically unlikely and, therefore, when observed, can be identified as outliers to be retired.

In summary, the method proposed above does not rely on a constant, fixed decision-making threshold but rather calculates the retirement threshold or thresholds dynamically over time based on collected data about CEs. In certain embodiments, multiple dynamic thresholds are calculated concurrently for different retirement criteria. It will be appreciated that other retirement criteria are possible as well as their combinations. In some embodiments, an algorithmic statistical method is used to calculate a page retirement threshold over time and make page retirement decisions differently over time. This may result in a reduction in the replacement rate without sacrificing RAM reliability. To set the threshold, the following formula, for example, might be used: Threshold=Max (1, mean+3σ). The exact formula for the threshold calculation can be changed depending on the shape of the realistic data distribution, for example for normal and non-normal distributions.

Multiple Retirement Criteria

As discussed above, in some embodiments, multiple retirement criteria may be used to determine whether memory pages should be watched or retired. This section introduces lists with multiple retirement criteria, the lists comprising a retired list 206 and a watched list 208. In some embodiments, retired pages are those pages with data real-located to spare pages and watched pages are those suspected high-risk pages not yet retired.

In some implementations, this approach involves list sorting by the multiple retirement criteria used. However, sorting the retired list 206 and the watched list 208 by two or more retirement criteria simultaneously becomes difficult. Thus, proposed herein are possible approaches to dealing with the problem of sorting lists by multiple retirement criteria. The proposed approaches may lead to higher-reliability memory at the cost of potentially greater implementation complexity and resource demand than a single retirement criteria list. It will be appreciated that the illustrated embodiments are exemplary in nature and other multi-criteria algorithms are possible within the scope of this disclosure.

As described with respect to FIGS. 2 and 3, typically, some extra reserved space 202 is allocated using RAM space for page spares and determined high-risk pages are watched or removed from operation while its data is copied to a spare page that replaces the original page. In some embodiments, a practical approach of prioritizing retirement of memory pages in terms of their risk of failure and make decisions according to these priorities is used. In some embodiments, a BBR mechanism involves evaluating risk of page failure by one or many independent criteria that are relevant to a page's reliability. Therefore, methods proposed below include a CFTM to both maintain the list of retired pages as well as maintain the list of watched pages and dynamically re-arrange these lists using multiple criteria.

Described herein are methods and systems to handle high-risk RAM pages using multiple independent page retirement criteria concurrently such as the overall CE count, CE rate, or time since last error, among others. As discussed above with respect to a single retirement criteria, a RAM buffer is allocated to hold a list of N high-risk RAM pages. In some embodiments, when two or more retirement criteria are used (M=2, 3, . . . ), the size of the watched list 208 may be increased proportionally. For example, the size of the watch list may become equal to K*M. Therefore, in some embodiments, K*M positions at the end of the list are reserve for the watched list 208. Furthermore, in some embodiments, N−K*M positions are allocated for the retired list 206 and this number should correspond exactly to the number of page spares in page spares space 204. For example, if K=3 and M=2, the amount of space allocated for watched list 208 may be 6. In some embodiments, the lists are filled with the records of high-risk pages as they appear over time and remains unsorted until needed (i.e. until the lists are full).

Figure 14:
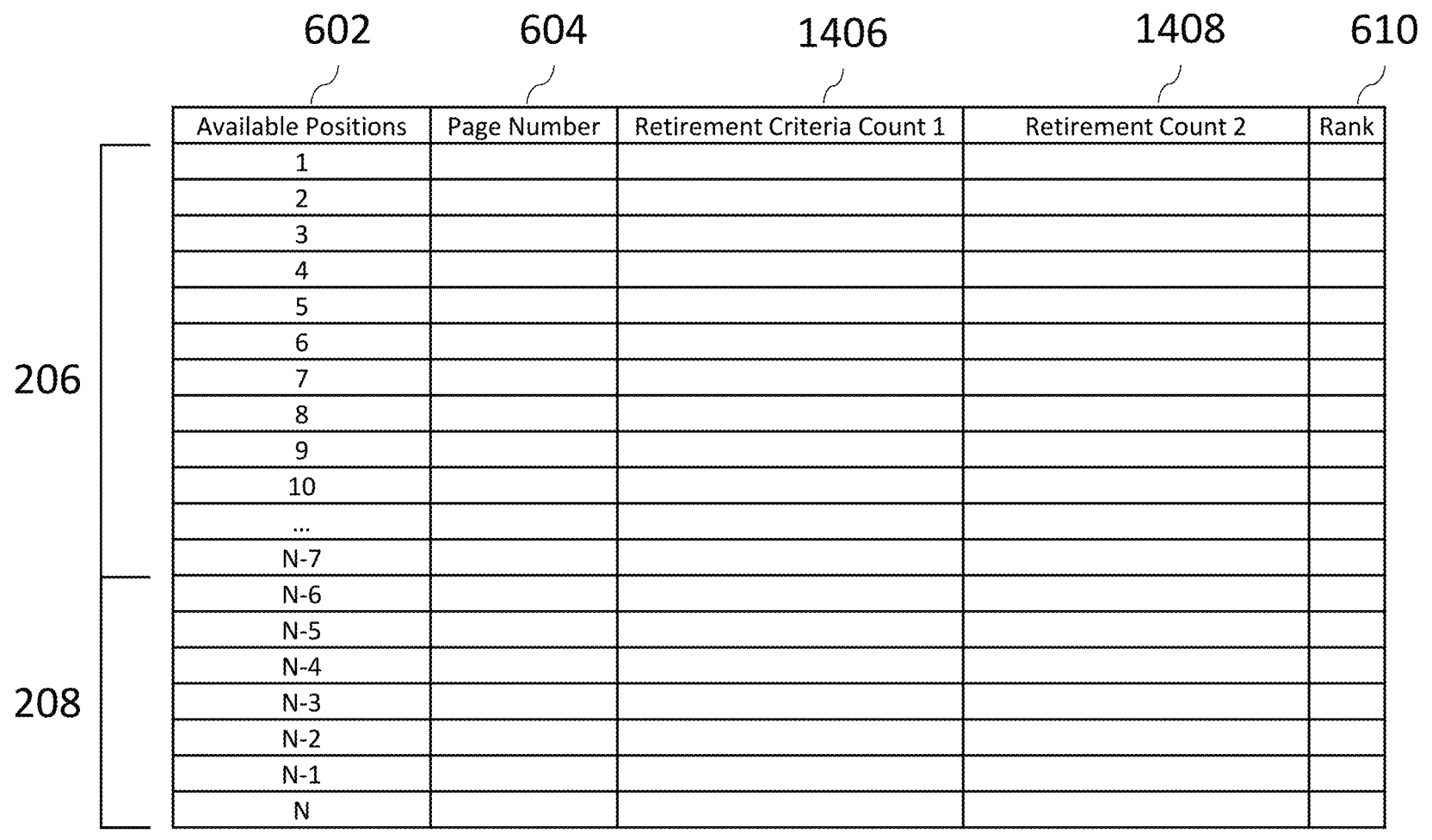

FIG. 14 illustrates an example retired list 206 and watched list 208 comprising multiple retirement criteria. The illustrated embodiment shows the lists before any high-risk pages have been identified by the CFTM. Thus, the lists are currently empty. FIG. 14 shows the unsorted lists, including the available positions 602 up to N, page numbers 604, a first retirement criteria 1406 (e.g. total CE errors), a second retirement criteria 1408 (e.g. CE rate), and the page RAM rank 608. The numerical values of the example lists provided herein are exemplary in nature and are not meant to be limit the scope of this disclosure.

In some embodiments, when multiple retirement criteria are used, or both of the retired page list 206 and the watched page list 208 are divided into M parts. Thus, for the lists of FIG. 14, which represents the case of K=3 and M=2, first retirement criteria 1406 may be allocated the upper half of the retired list 206, for example at available positions 1 to 6 and the upper half of watched list 208, for example at available positions N−6 to N−4. Similarly, second retirement criteria 1408 may be allocated the bottom half of the retired list 206, for example at available positions 7 to N−7, and the bottom half of the watched list 208, for example at available positions N−2 to N. The allocations described above are exemplary in nature and can vary based on the relative importance of the first retirement criteria 1406 and second retirement criteria 1408. For example, each retirement criteria may be allocated about one-third, about one-fourth, about one-fifth, about one-sixth, about one-eighth, about two-thirds, about three-fourths, about four-fifths, about five-sixths, or about seven-eighths of each list, or between any of the aforementioned values.

In some embodiments, all the algorithms proposed for the single retirement criterion scenario may be executed separately and independently for each independent retirement criteria. FIG. 15 shows an unsorted list that is only partially filled with retired pages, page numbers 604, their relevant retirement statistics and the page RAM rank 610. In some embodiments, until there are no remaining page spares, the retired list 206 is filled using each retirement criteria independently in order of detection of high-risk pages. In some embodiments, no list sorting is needed until the limit of the retired pages is reached.

FIG. 16 illustrates a list wherein the retired page list 206 is completely full of high-risk pages and a first page has been added to the watched list 208. In some embodiments, this corresponds to the moment when the replacement page spares have been completely depleted. In some embodiments, this also corresponds to the moment at which all of the pages on the retired list 206 and the watched list 208 are sorted by risk level based on each retirement criteria.

In some embodiments, the retired list 206 and the watched list 208 are first sorted by the first retirement criterion 1406. FIG. 17 illustrates the list after it has been sorted by the first retirement criteria 1406. As illustrated, Page Number 345, which has a first retirement criteria count 1406 that is lower than Page Number 23455, has been unretired moved to the watched list 208, while Page Number 23455 was moved to the retired list 206. In some embodiments, the unretired page may be classified as belonging to the upper half allocation of the watched list 208 only if the unretired page has exceeded the threshold for the first retirement criteria 1406. In some embodiments, it is possible that the unretired page would belong to the bottom half allocation of the watched list 208 if it were originally retired for exceeding the second retirement criteria 1408.

In the case that the unretired page was originally retired for exceeding the second retirement criteria 1408, the list may be sorted a second time by the second retirement criteria 1408. In other words, the sorting and retirement decisions for the first retirement criteria 1406 have been completed for this iteration and the algorithm may need to make another set of determinations based on the second retirement criteria 1408. However, in some embodiments, even though only the bottom half of the watched list 208 is allocated to pages that have exceeded the retirement threshold for the second retirement criteria 1408, the second sorting may include the entire watched page list 208 to account for pages that were added to the list due to the first retirement criteria 1406 but, over time, have also exceeded the threshold for another criteria, such as the second retirement criteria 1408.

FIG. 18 illustrates the results of the second sorting based on the second retirement criteria 1408. It is noted that both lists are now sorted within their allocated parts of the list in declining order of counts. In other words available positions 1 to 6 are sorted in declining order of the first retirement criteria 1406, while available positions 7 to N−7 are sorted in declining order of the second retirement criteria 1408. At this point, a reliability warning may generated to warn the OS and/or user that memory may be at risk of failure. It can also be noted that page 23455 has been removed from the retired list 206 from the allocation of the first retirement criteria 1406 since its count of 45 was lower than any of the other pages of available positions 1 to 6. In addition, its count for retirement criteria 1408 has increased from 3 to 5 based on CEs, even if it was initially added to the list because of retirement criteria 1406. In some embodiments, every time when any retirement criteria count is increased, the entire list may be re-sorted. In this particular case, page number 23455 nay be deemed less risky than the retired pages by both retirement criteria, even though its counts for both the first retirement criteria 1406 and the second retirement criteria 1408 are equal to or higher than some retired pages. This will not always be the case and may depend on the sorting order and method used by the CTFM.

In some embodiments, if new high-risk pages are detected when the retired list 206 is full, these pages may be first added to the watched list 208 and another sort may be completed. The type of sort may depend on which of the retirement criteria thresholds were exceeded by the high-risk page.

FIG. 19 illustrates the situation in which the retired list 206 and the watched list 208 have been completely filled with high-risk pages and double sorted based on the first retirement criteria 1406 and the second retirement criteria 1408.

Figure 20:
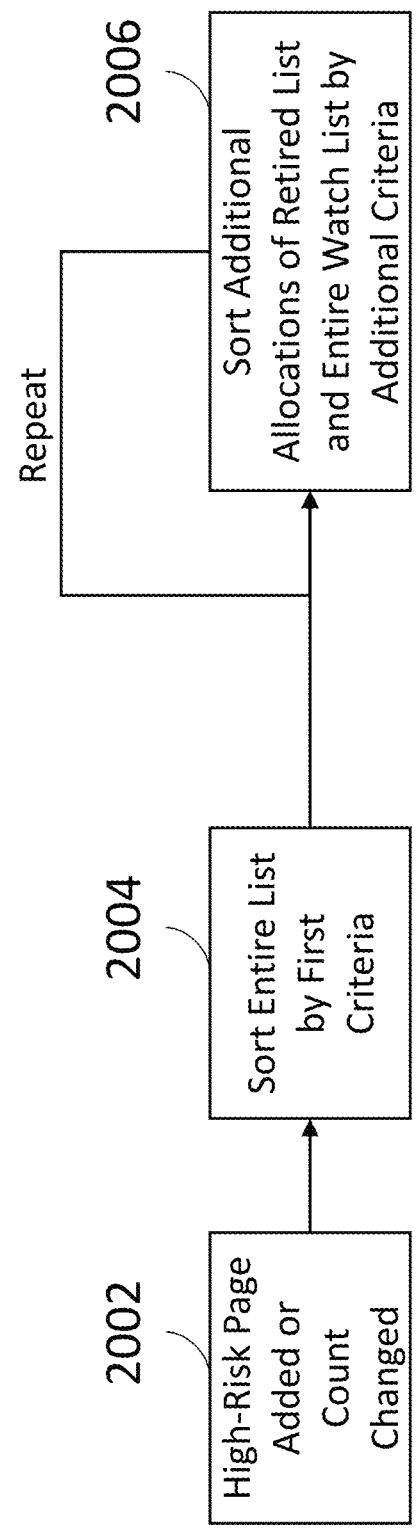
FIG. 20 illustrates an example flowchart of a sorting method for determining memory page watched lists and retired lists according to some embodiments herein.

In some embodiments, the sorting may be completed according to the process illustrated in FIG. 20. In some embodiments, a sort may occur anytime a high-risk page is added to the list or any retirement criteria count is changed at 2002. In some embodiments a first sort may be completed by sorting the entire retired list 206 and watched list 208 by the first retirement criteria 1406 at 2004. In some embodiments, after the first sort, the allocation of the retired list 206 allocated to the second retirement criteria 1408 and the entire watched list 208 may be sorted by the second retirement criteria 1408 at 2006. If more than two retirement criteria are being used, the step of 2006 may be repeated for each additional retirement criteria. Thus, at the end of the sorting, each allocated portion of the retired list 206 may be sorted in declining order to the retirement criteria to which the portion was allocated. In some embodiments, the watch list may be sorted in declining order similarly or by the final retirement criteria in declining order of count. In some embodiments, when a new entry is added to the watched list 208 or any other change is made to the entire list, it may be resorted by all the retirement criteria as described above. In addition, after the table is filled and sorted, if a new high-risk page is detected because of generated CEs, then the retirement criteria count for the newly-detected page may be compared to first retirement criteria 1406 by the lowest value for pages on the watched list 208, and by the second retirement criteria 1408 to the last entry on the sorted watched list 208 (Nth entry). If there are additional retirement criteria, then the newly detected page may be compared to the lowest value for all pages on the watch list for each of the retirement criteria including the second retirement criteria 1408, except the last retirement criteria, which may be compared using the last entry in the table (Nth entry).

In some embodiments, if the retirement criteria count for the newly detected high-risk page is lower in all the comparisons to the watched pages, it may be rejected and ignored. Alternatively, if the count for the newly detected high-risk page is higher than any of the retirement criteria counts of the compared watched pages, it is swapped for the corresponding "lower risk" page in the table. The swapped page is then removed from the list completely and may not be watched further unless it is deemed high-risk again.

In summary, systems and methods are proposed to handle high-risk RAM pages in the case of multiple independent page retirement criteria such as the overall CE count, CE rate, etc. used simultaneously.

Asymmetric RAM Workload Balancing

Conventionally, a cluster of connected servers with shared memory space would allocate the entire available memory space to user applications and treat the space as one large memory pool. However, over time, some of the servers included into this cluster might develop memory errors. Described herein are systems and methods of enhancing server cluster reliability when one or more of the servers show signs of DRAM failure risk. The systems and methods may increase memory reliability of multiple servers that are connected to share their memory and to form a shared memory pool.

A typical memory utilization distribution by pages, DIMMS, or servers may be substantially uniform with equal utilization of the entire available physical memory space.

Figure 21:
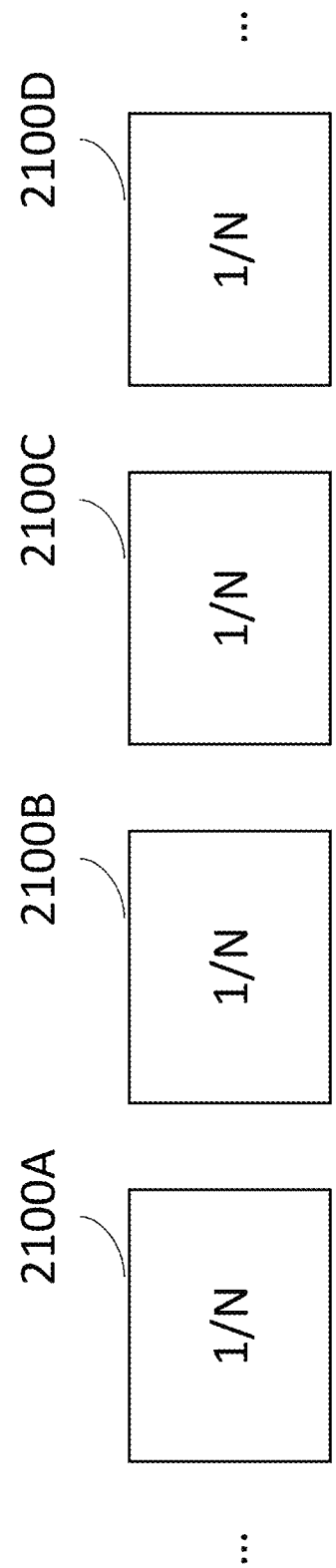
FIG. 21 illustrates a block diagram of an example memory device cluster.

Generally, whenever an application needs a memory allocation, the entire free available memory space could be utilized for this application without bias. This arrangement of memory utilization is illustrated in FIG. 21. FIG. 21 illustrates a block diagram of N memory devices and their utilization in a typical arrangement. In the illustrated embodiments, the utilization priority of each memory device, including memory devices 2100A, 2100B, 2100C, and 2100D is identical. In other, wherein N memory devices are available, each memory device may be allocated such that about 1/N of the total allocated memory is allocated from each memory device. The utilization priority represents some bias that cluster (e.g. shared server state and data) controlling software might have when allocating all the available memory. FIG. 21 illustrates the case of typical cluster with no such bias present.

Described herein are new approaches to distributing memory workload across the combined memory space of a cluster of connected memory devices sharing RAM. The system and methods described herein continually analyze memory health statistics (e.g. error count, error rate, error age, etc.) and dynamically rank memory devices in terms of their health and their risk of memory failures in real-time. Multiple ranking algorithms could be used to rebalance memory load dynamically towards those devices that have healthier RAM and away from servers with worse memory health statistics such as more errors or a higher rate of errors, among others.

Assuming an algorithm is used to rank those connected memory devices in terms of their memory health, the cluster memory utilization priority after some time will vary as some of the devices may generate memory errors. An example of such a ranking is shown in FIG. 22.

Figure 22:
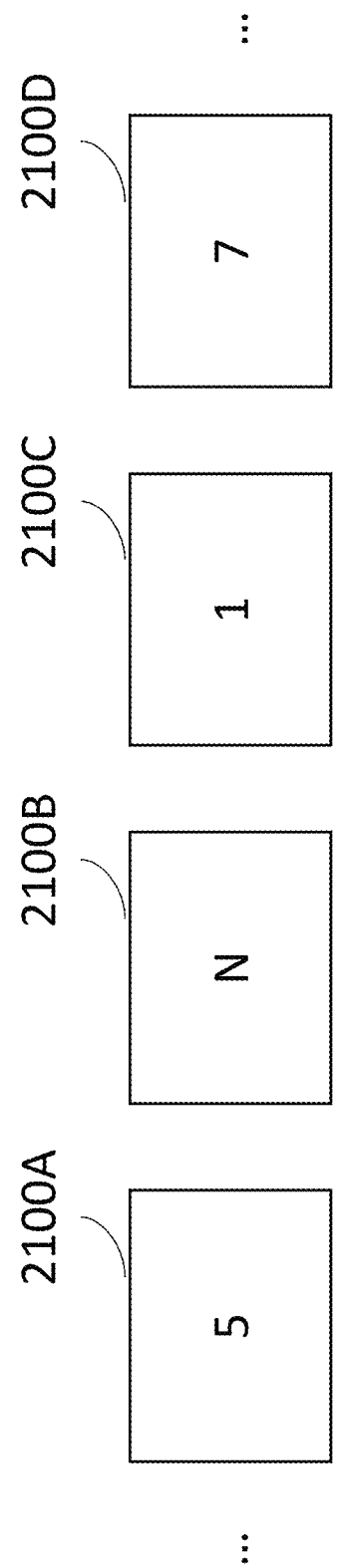
FIG. 22 illustrates a block diagram of an example memory device cluster ranked based on utilization priority.

In the illustrated embodiments of FIG. 22, memory device 2100B of N memory devices has generated the highest number of errors and is ranked the lowest in terms of health. Therefore, it is assigned the lowest utilization priority N (the last rank possible for N devices). On the other hand, device 2100C was the healthiest, and produced the least number of errors, thus receiving the highest utilization priority rank.

With this in mind, this disclosure describes new logic for the memory allocation based on utilization priority ranks. In some embodiments, all memory may be allocated to the highest rank memory device (e.g. Memory Device 2100C) until the highest ranked memory device is full and has no memory available to allocate. The allocation system may then begin allocating memory from the second highest ranked device until that device is also full. This process may continue until all the necessary memory has been allocated to user application.

In some embodiments, it is expected that if the memory utilization of the entire server cluster stays below 100% and is in the range of 80%-95%, which is not unusual for large memory clusters, then those servers that have worse memory health statistics would become exposed to lower application load and, as a result, would gain in reliability. For example, there may a cluster with a size of 5 devices with an original average memory utilization per server of about 90% distributed equally between devices. In this example, each device may be ranked from 1 to 5 based on memory health. In such a case, if the memory load is moved first to device ranked 1, then to the device ranked 2, and so forth, then the device ranked 1 will add up to about 10% of load, the device ranked 2 will add the same, and the last device ranked 5 would be receive a load on the order of about 90%−4*10%=50% only. In other words, each of memory devices ranked 1 to 4 may take up on an extra 10% of workload resulting in a total workload reduction for the lowest-ranking device of about 40%. The lowest ranking device, if used less, would naturally gain in reliability because reliability may be a function of device utilization. In addition, the entire cluster will become more reliable because its weakest components would gain in reliability.

Over time, most memory device generate some number of memory errors. Their relative health may be compared continuously, periodically, or upon being triggered by an event, and the utilization priority-ranking scan be recalculated accordingly. In this case, it is possible that those devices that were receiving the highest workload initially, would produce relatively more errors over time and have their workloads reduced according, It will be understood that other implementations of the asymmetric RAM workload balancing for improved reliability of a cluster of connected devices with shared memory are possible. For example, another approach could be to not to always max the workload for the healthiest devices at any given time but to add some incremental workload to each device in, wherein the increased workload is proportional to the health rank of each device. In some embodiments, those servers that are the healthiest at any given moment would receive an increase in the workload, but may not be loaded to 100% m while those servers that are less healthy would see a smaller increase or a reduction in the workload.

This technique could be used, for example, to produce overall life extension for a given device or for the entire cluster of connected device with a shared memory pool or to reduce device failure risks while memory replacement parts are not available or an immediate maintenance and replacement is not possible and/or feasible In summary, this section addresses systems and methods to increase memory reliability of multiple devices that are connected together to share their memory and to form a shared memory pool. This disclosure proposes a method of enhancing server cluster reliability when some of servers show signs of RAM failure risk. The systems and methods described herein continually analyze device memory health statistics (error count, error rate, error age, etc.) and dynamically rank these devices in terms of their health and their risk of memory failures in real-time. Multiple ranking algorithms could be used. In some embodiments, a device's relative health should be analyzed and compared continuously and the utilization priority ranking should be re-calculated and adjusted constantly, periodically, or when triggered by a condition being met.

Multiple ranking algorithms are possible for the above approach and some embodiments may involve simple sorting of all the available servers in terms of their memory health and assigning each of them the utilization priority rank from 1 (the highest) to N (the lowest). Possible implementations of the balancing algorithms, for example, are described in this application but other algorithms are possible as well.

Synchronous Bad Block Retirement

In some embodiments, the BBR mechanisms described herein may be performed in real-time, continuously, and synchronously with core engine I/O and user activity of the computer system. Real-time performance of BBR may be referred to as Synchronous BBR. In some embodiments, in synchronous BBR, global flag in the core engine may be configured such that a branch to check the blocks synchronously with I/O can be activated.

In some embodiments, for a read path, when the global flag is set, a new read request may check if it is targeting a bad block, which naturally comes from a bad reference indicated by the CFTM. In some embodiments, if the read request is targeting a bad block/reference, the read request will be rerouted to the replaced block in the reserved region through the reroute gateway. In some embodiments, before the read completion, the I/O function will update the bad reference number in the reroute gateway, as well as the VBT entry to point to the replaced block.

In some embodiments, for the write path, the writing function may check the reference counter function initially. In some embodiments, if the new write I/O is duplicated on a normal block, then the bad reference will be corrected concurrently with the write function. In some embodiments, the only difference is that the bad block reference counter will not be changed. Instead, in some embodiments, the reroute gateway will be updated. In some embodiments, if the new write request is targeting a bad block, it may branch to a RTM allocation method, and simultaneously update the reroute gateway.

In some embodiments, for an allocation and recycle path, when the global flag is set, the corresponding procedure will jump over a bad block LBA, based on the bad block identifier of has register.

Asynchronous Bad Block Retirement

In some embodiments, based on the number of bad blocks and bad references, the CFTM may make a decision on whether to activate asynchronous bad block retirement, which refers to a BBR mechanism performed independently of core data path functions.

In some embodiments, the asynchronous bad block retirement method computes on a device or user level. In some embodiments, each virtual device of a system can operate on an asynchronous function based on a kernel thread model. In some embodiments, a gene pool represents the highest-level software encapsulation and abstraction of the backing store of the operating system software. In some embodiments, the asynchronous bad block retirement method will utilize a virtual device feature, executing separate threads to go through each VBT entry. In some embodiments, if the entry is pointing to a bad block, then the VBT entry may be updated based on the reroute gateway automatically.

In some embodiments, it may be difficult to address the concurrency issue described herein while living I/O is occurring. To properly address the issue, the CFTM may notify the user properly and let the user decide if it is possible to halt I/O on the device, then perform the asynchronous bad block retirement procedure safely.

Computer System

In some embodiments, the systems, devices, algorithms, and methods described herein are implemented using a computing system.

Figure 23:
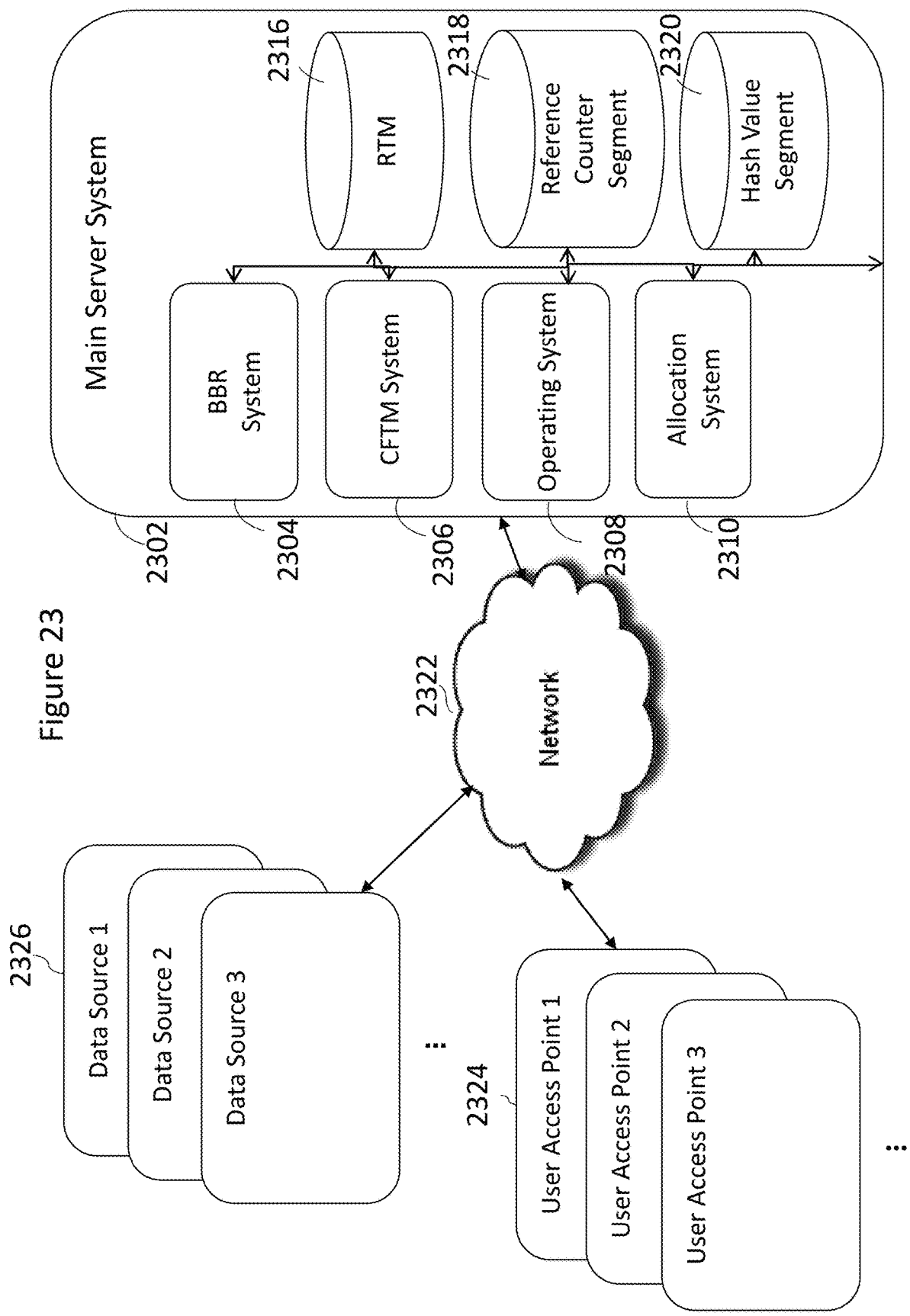
FIG. 23 illustrates a schematic diagram illustrating a bad block retirement system according to some embodiments.

FIG. 23 is a block diagram illustrating an example embodiment of a computer system configured to run software for implementing one or more embodiments of BBR systems and methods disclosed herein. In some embodiments, the various systems, methods, and devices described herein may also be implemented in decentralized systems such as, for example, blockchain applications.

In some embodiments, a main server system 2302 may be comprised BBR system module 2304, a CFTM system module 2306, an OS 2308, an allocation systems module 2310, an RTM 2316, a reference counter segment 2318, and/or a hash value segment 2320. The main server system 2302 can be connected to a network 2322. The network 2322 can be configured to connect the main server system 2302 to one or more data sources 2326 and one or more user access points 2324.

The BBR system module 2304 may perform any of the BBR functions and algorithms described herein. The CFTM system module 2306 may perform the CFTM functions as described herein, including BBR, bad block monitoring and identification, and table sorting functions as described herein. In some embodiments, the OS 2308 may comprise one or more OS's that perform core data engine functions and/or allocate memory from the RTM 2316 to the one or more OS's and user applications. In some embodiments, the allocation system 2310 may assist the OS in allocating memory to user applications and/or to reserved space, reference counter segment 2318, or hash value segment 2320.

In some embodiments, RTM 2316 comprises the fully available, pooled memory space for OS allocation. The RTM 2316 may comprise one or more separate spaces, lists, or segments as described herein. The reference counter segment 2318 and the hash value segment 2320 may comprise portions of RAM reserved for LBA addressing and identification functions.

Figure 24:
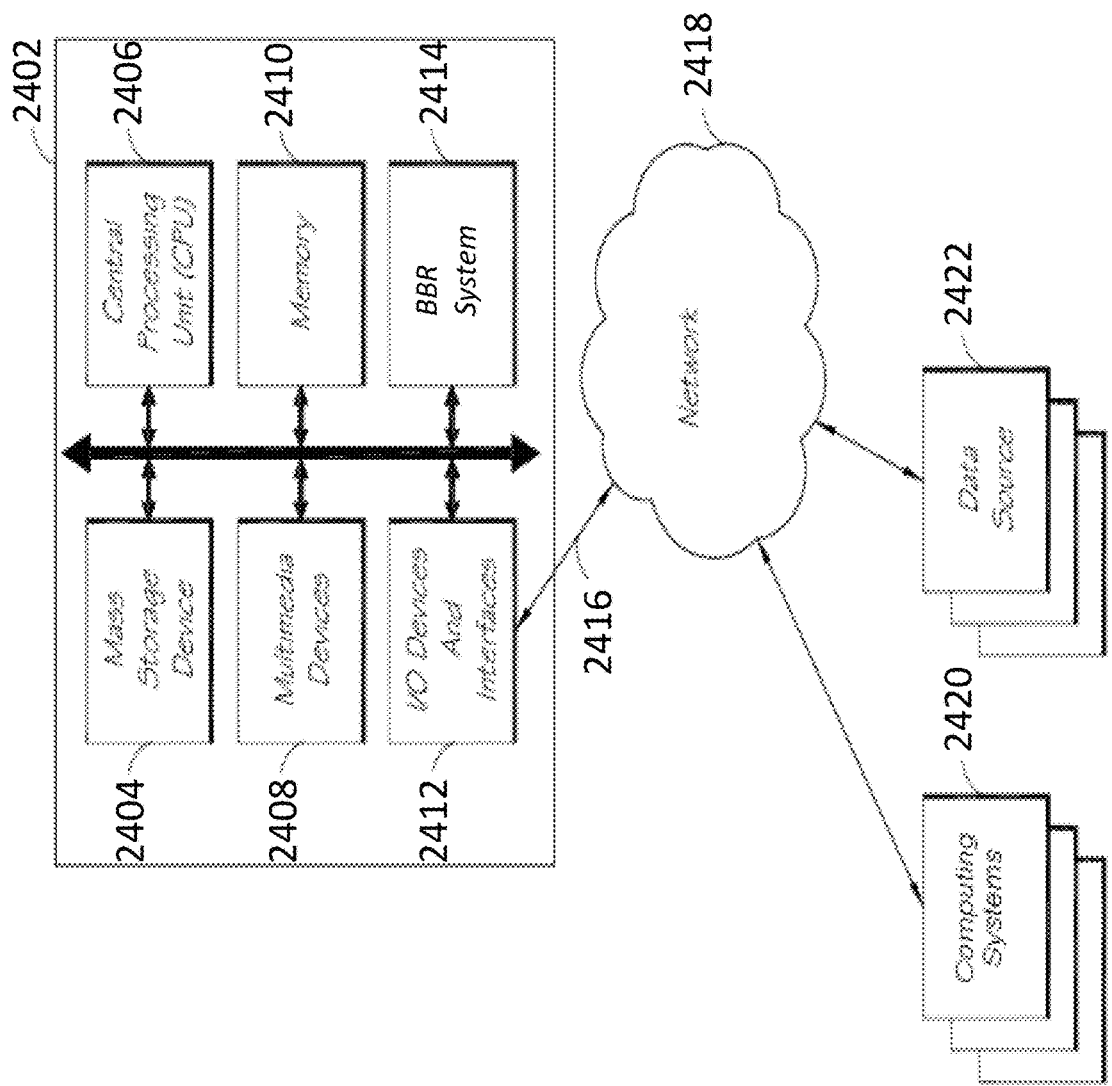
FIG. 24 is a block diagram depicting an embodiment of a computer hardware system configured to run software for implementing one or more embodiments of a bad block retirement system.

FIG. 24 is a block diagram depicting an embodiment of a computer hardware system configured to run software for implementing one or more embodiments of the BBR systems and methods disclosed herein.

In some embodiments, the systems, processes, and methods described herein are implemented using a computing system, such as the one illustrated in FIG. 24. The example computer system 2402 is in communication with one or more computing systems 2420 and/or one or more data sources 2422 via one or more networks 2418. While FIG. 24 illustrates an embodiment of a computing system 2402, it is recognized that the functionality provided for in the components and modules of computer system 2402 may be combined into fewer components and modules, or further separated into additional components and modules.

The computer system 2402 can comprise a control unit 2414 that carries out the functions, methods, acts, and/or processes described herein. The control unit 2414 is executed on the computer system 2402 by a central processing unit 2406 discussed further below. In some embodiments, the control unit 2414 can comprise any and all of the modules described herein.

In general, the word "module," as used herein, refers to logic embodied in hardware or firmware or to a collection of software instructions, having entry and exit points. Modules are written in a program language, such as JAVA, C or C++, PYPHON or the like. Software modules may be compiled or linked into an executable program, installed in a dynamic link library, or may be written in an interpreted language such as BASIC, PERL, LUA, or Python. Software modules may be called from other modules or from themselves, and/or may be invoked in response to detected events or interruptions. Modules implemented in hardware include connected logic units such as gates and flip-flops, and/or may include programmable units, such as programmable gate arrays or processors.

Generally, the modules described herein refer to logical modules that may be combined with other modules or divided into sub-modules despite their physical organization or storage. The modules are executed by one or more computing systems and may be stored on or within any suitable computer readable medium or implemented in whole or in part within special designed hardware or firmware. Not all calculations, analysis, and/or optimization require the use of computer systems, though any of the above-described methods, calculations, processes, or analyses may be facilitated with computers. Further, in some embodiments, process blocks described herein may be altered, rearranged, combined, and/or omitted.

The computer system 2402 includes one or more processing units (CPU) 2406, which may comprise a microprocessor. The computer system 2402 further includes a physical memory 2410, such as random access memory (RAM) for temporary storage of information, a read only memory (ROM) for permanent storage of information, and a mass storage device 2404, such as a backing store, RAM hard drive, rotating magnetic disks, solid state disks (SSD), flash memory, phase-change memory (PCM), 3D XPoint memory, diskette, or optical media storage device. Alternatively, the mass storage device may be implemented in an array of servers. As described herein, the computer system 2402 may comprise a RAM-based computer system. Typically, the components of the computer system 2402 are connected to the computer using a standards-based bus system. The bus system can be implemented using various protocols, such as Peripheral Component Interconnect (PCI), Micro Channel, SCSI, Industrial Standard Architecture (ISA) and Extended ISA (EISA) architectures.

The computer system 2402 includes one or more input/output (I/O) devices and interfaces 2412, such as a keyboard, mouse, touch pad, touchscreen and printer. The I/O devices and interfaces 2412 can include one or more display devices, such as a monitor, that allows the visual presentation of data to a user. More particularly, a display device provides for the presentation of GUIs as application software data, and multi-media presentations, for example. The I/O devices and interfaces 2412 can also provide a communications interface to various external devices. The computer system 2402 may comprise one or more multi-media devices 2408, such as speakers, video cards, graphics accelerators, and microphones, for example.

The computer system 2402 may run on a variety of computing devices, such as a server, a Windows server, a Structure Query Language server, a Unix Server, a personal computer, a laptop computer, and so forth. In other embodiments, the computer system 2402 may run on a cluster computer system, a mainframe computer system and/or other computing system suitable for controlling and/or communicating with large databases, performing high volume transaction processing, and generating reports from large databases. The computing system 2402 is generally controlled and coordinated by an operating system software, such as z/OS, Windows, Linux, UNIX, BSD, SunOS, Solaris, MacOS, or other compatible operating systems, including proprietary operating systems. Operating systems control and schedule computer processes for execution, perform memory management, provide file system, networking, and I/O services, and provide a user interface, such as a graphical user interface (GUI), among other things.

The computer system 2402 illustrated in FIG. 24 is coupled to a network 2418, such as a LAN, WAN, or the Internet via a communication link 2416 (wired, wireless, or a combination thereof). Network 2418 communicates with various computing devices and/or other electronic devices. Network 2418 is communicating with one or more computing systems 2420 and one or more data sources 2422. The control unit 2414 may access or may be accessed by computing systems 2420 and/or data sources 2422 through a web-enabled user access point. Connections may be a direct physical connection, a virtual connection, and other connection type. The web-enabled user access point may comprise a browser module that uses text, graphics, audio, video, and other media to present data and to allow interaction with data via the network 2418. The computer system 2402 can also be connected to other electronic devices, including for example, satellite communications and augmented and/or virtual reality devices (3D or 2D), which may transmit, for example, GPS information.

Access to the control unit 2414 of the computer system 2402 by computing systems 2420 and/or by data sources 2422 may be through a web-enabled user access point such as the computing system's 2420 or data source's 2422 personal computer, cellular phone, smartphone, laptop, tablet computer, e-reader device, audio player, or another device capable of connecting to the network 2418. Such a device may have a browser module that is implemented as a module that uses text, graphics, audio, video, and other media to present data and to allow interaction with data via the network 2418.

The output module may be implemented as a combination of an all-points addressable display such as a cathode ray tube (CRT), a liquid crystal display (LCD), a plasma display, or other types and/or combinations of displays. The output module may be implemented to communicate with input devices 2412 and they also include software with the appropriate interfaces which allow a user to access data through the use of stylized screen elements, such as menus, windows, dialogue boxes, tool bars, and controls (for example, radio buttons, check boxes, sliding scales, and so forth). Furthermore, the output module may communicate with a set of input and output devices to receive signals from the user.

The input device(s) may comprise a keyboard, roller ball, pen and stylus, mouse, trackball, voice recognition system, or pre-designated switches or buttons. The output device(s) may comprise a speaker, a display screen, a printer, or a voice synthesizer. In addition, a touch screen may act as a hybrid input/output device. In another embodiment, a user may interact with the system more directly such as through a system terminal connected to the score generator without communications over the Internet, a WAN, LAN, or similar network.

In some embodiments, the system 2402 may comprise a physical or logical connection established between a remote microprocessor and a mainframe host computer for the express purpose of uploading, downloading, or viewing interactive data and databases online in real time. The remote microprocessor may be operated by an entity operating the computer system 2402, including the client server systems or the main server system, an/or may be operated by one or more of the data sources 2422 and/or one or more of the computing systems 2420. In some embodiments, terminal emulation software may be used on the microprocessor for participating in the micro-mainframe link.

In some embodiments, computing systems 2402 who are internal to an entity operating the computer system 2402 may access the control unit 2414 internally as an application or process run by the CPU 2406.

In some embodiments, one or more features of the systems, methods, and devices described herein can utilize a URL and/or cookies, for example for storing and/or transmitting data or user information. A Uniform Resource Locator (URL) can include a web address and/or a reference to a web resource that is stored on a database and/or a server. The URL can specify the location of the resource on a computer and/or a computer network. The URL can include a mechanism to retrieve the network resource. The source of the network resource can receive a URL, identify the location of the web resource, and transmit the web resource back to the requestor. A URL can be converted to an IP address, and a Domain Name System (DNS) can look up the URL and its corresponding IP address. URLs can be references to web pages, file transfers, emails, database accesses, and other applications. The URLs can include a sequence of characters that identify a path, domain name, a file extension, a host name, a query, a fragment, scheme, a protocol identifier, a port number, a username, a password, a flag, an object, a resource name and/or the like. The systems disclosed herein can generate, receive, transmit, apply, parse, serialize, render, and/or perform an action on a URL.

A cookie, also referred to as an HTTP cookie, a web cookie, an internet cookie, and a browser cookie, can include data sent from a website and/or stored on a user's computer. This data can be stored by a user's web browser while the user is browsing. The cookies can include useful information for websites to remember prior browsing information, such as a shopping cart on an online store, clicking of buttons, login information, and/or records of web pages or network resources visited in the past. Cookies can also include information that the user enters, such as names, addresses, passwords, credit card information, etc. Cookies can also perform computer functions. For example, authentication cookies can be used by applications (for example, a web browser) to identify whether the user is already logged in (for example, to a web site). The cookie data can be encrypted to provide security for the consumer. Tracking cookies can be used to compile historical browsing histories of individuals. Systems disclosed herein can generate and use cookies to access data of an individual. Systems can also generate and use JSON web tokens to store authenticity information, HTTP authentication as authentication protocols, IP addresses to track session or identity information, URLs, and the like.

The computing system 2402 may include one or more internal and/or external data sources (for example, data sources 2422). In some embodiments, one or more of the data repositories and the data sources described above may be implemented using a relational database, such as DB2, Sybase, Oracle, CodeBase, and Microsoft® SQL Server as well as other types of databases such as a flat-file database, an entity relationship database, and object-oriented database, and/or a record-based database.

In addition, the network may communicate with other data sources or other computing devices. The computing system may also comprise one or more internal and/or external data sources. In some embodiments, one or more of the data repositories and the data sources may be implemented using a relational database, such as DB2, Sybase, Oracle, CodeBase and Microsoft® SQL Server as well as other types of databases such as, for example, a flat file database, an entity-relationship database, and object-oriented database, and/or a record-based database.

ADDITIONAL EMBODIMENTS

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than restrictive sense.

Indeed, although this invention has been disclosed in the context of certain embodiments and examples, it will be understood by those skilled in the art that the invention extends beyond the specifically disclosed embodiments to other alternative embodiments and/or uses of the invention and obvious modifications and equivalents thereof. In addition, while several variations of the embodiments of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the embodiments of the disclosed invention. Any methods disclosed herein need not be performed in the order recited. Thus, it is intended that the scope of the invention herein disclosed should not be limited by the particular embodiments described above.

It will be appreciated that the systems and methods of the disclosure each have several innovative aspects, no single one of which is solely responsible or required for the desirable attributes disclosed herein. The various features and processes described above may be used independently of one another, or may be combined in various ways. All possible combinations and subcombinations are intended to fall within the scope of this disclosure.

Certain features that are described in this specification in the context of separate embodiments also may be implemented in combination in a single embodiment. Conversely, various features that are described in the context of a single embodiment also may be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination. No single feature or group of features is necessary or indispensable to each and every embodiment.

It will also be appreciated that conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. In addition, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted may be incorporated in the example methods and processes that are schematically illustrated. For example, one or more additional operations may be performed before, after, simultaneously, or between any of the illustrated operations. Additionally, the operations may be rearranged or reordered in other embodiments. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products. Additionally, other embodiments are within the scope of the following claims. In some cases, the actions recited in the claims may be performed in a different order and still achieve desirable results.

Further, while the methods and devices described herein may be susceptible to various modifications and alternative forms, specific examples thereof have been shown in the drawings and are herein described in detail. It should be understood, however, that the invention is not to be limited to the particular forms or methods disclosed, but, to the contrary, the invention is to cover all modifications, equivalents, and alternatives falling within the spirit and scope of the various implementations described and the appended claims. Further, the disclosure herein of any particular feature, aspect, method, property, characteristic, quality, attribute, element, or the like in connection with an implementation or embodiment can be used in all other implementations or embodiments set forth herein. Any methods disclosed herein need not be performed in the order recited. The methods disclosed herein may include certain actions taken by a practitioner; however, the methods can also include any third-party instruction of those actions, either expressly or by implication. The ranges disclosed herein also encompass any and all overlap, sub-ranges, and combinations thereof. Language such as "up to," "at least," "greater than," "less than," "between," and the like includes the number recited. Numbers preceded by a term such as "about" or "approximately" include the recited numbers and should be interpreted based on the circumstances (e.g., as accurate as reasonably possible under the circumstances, for example ±5%, ±10%, ±15%, etc.). For example, "about 3.5 mm" includes "3.5 mm." Phrases preceded by a term such as "substantially" include the recited phrase and should be interpreted based on the circumstances (e.g., as much as reasonably possible under the circumstances). For example, "substantially constant" includes "constant." Unless stated otherwise, all measurements are at standard conditions including temperature and pressure.

As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain embodiments require at least one of X, at least one of Y, and at least one of Z to each be present. The headings provided herein, if any, are for convenience only and do not necessarily affect the scope or meaning of the devices and methods disclosed herein.

Accordingly, the claims are not intended to be limited to the embodiments shown herein, but are to be accorded the widest scope consistent with this disclosure, the principles and the novel features disclosed herein.

What is claimed is:

1. A computer-implemented method of monitoring and retiring memory pages in random access memory (RAM), the computer implemented method comprising:
    monitoring, by a computer system, correctable error statistics for each of a plurality of memory pages, wherein the correctable error statistics comprise one or more page retirement criteria, wherein the one or more page retirement criteria comprise a correctable error count, correctable error rate, or a time since a most recent correctable error;
    detecting, by the computer system, a high-risk page, wherein detecting the high-risk page comprises determining whether the page retirement criteria of the high-risk page has exceeded a retirement criteria threshold;
    placing, by the computer system, page information associated with the high-risk page on a retired page list, wherein the retired page list has a size corresponding to a number of spare pages stored in a reserved space of RAM;
    storing, by the computer system, identical data to data stored in the high-risk page in a spare page; and
    identifying, by the computer system in a mapping of the plurality of memory pages, the high-risk page such that one or more references to the high-risk page in the mapping are rerouted to the spare page,
    wherein the computer system comprises a processor and the RAM.

2. The computer-implemented method of claim 1, wherein the one or more page retirement criteria comprise a single page retirement criterion.

3. The computer-implemented method of claim 1, wherein the retirement criteria threshold comprises a predetermined, static threshold.

4. The computer-implemented method of claim 1, wherein the retirement criteria threshold comprises a dynamically calculated threshold.

5. The computer-implemented method of claim 4, wherein the dynamically calculated threshold is determined by calculating an outlier value based on a statistical distribution of the one or more page retirement criteria.

6. The computer-implemented method of claim 5, wherein the statistical distribution comprises a normal distribution.

7. The computer-implemented method of claim 5, wherein the outlier value is calculated using a formula comprising a mean and a standard deviation of the one or more page retirement criteria of the plurality of memory pages.

8. The computer-implemented method of claim 7, wherein the outlier value comprises $M+V\sigma$, wherein M comprises the mean, wherein V comprises a variable number, and wherein $\sigma$ comprises the standard deviation.

9. The computer-implemented method of claim 1, wherein the monitoring the correctible error statistics and the detecting a high-risk page are completed by a Central Faults Tolerance Manager (CFTM) of the computer system.

10. The computer-implemented method of claim 1, wherein the one or more page retirement criteria comprises a plurality of page retirement criterion.

11. The computer-implemented method of claim 1, further comprising reserving, by the computer system, the reserved space of RAM.

12. The computer-implemented method of claim 1, wherein the reserved space comprises:
   a spare pages space comprising the spare pages; and
   the retired page list.

13. The computer-implemented method of claim 1, wherein the RAM comprises:
   a watched page list, wherein the page information associated with the high risk page is placed on the watched page list prior to placing the page information on the retired page list.

14. The computer-implemented method of claim 1, wherein the high-risk page is available for data allocation by the computer system prior to placing the page information on the retired page list.

15. The computer-implemented method of claim 1, wherein each of the plurality of pages comprises a 4 KB block of memory.

16. The computer-implemented method of claim 1, wherein the computer system comprises a RAM-based computer system without a hard disk drive or solid state drive.

17. The computer-implemented method of claim 1, wherein after the one or more references to the high-risk page in the mapping are rerouted to the spare page, the high-risk page is moved to the reserved space of RAM.

18. The computer-implemented method of claim 1, wherein the computer system does not allocate data to pages in the reserved space of RAM.

19. The computer-implemented method of claim 1, wherein the spare page is moved to an available space of RAM after the computer system stores the identical data in the spare page.

20. A computing system comprising:
one or more computer readable storage devices configured to store a plurality of computer executable instructions; and
one or more hardware computer processors in communication with the one or more computer readable storage devices and configured to execute the plurality of computer executable instructions in order to cause the system to:
   monitor correctable error statistics for each of a plurality of memory pages, wherein the correctable error statistics comprise one or more page retirement criteria, wherein the one or more page retirement criteria comprise a correctable error count, correctable error rate, or a time since a most recent correctable error;
   detect a high-risk page, wherein detecting the high-risk page comprises determining whether the page retirement criteria of the high-risk page has exceeded a retirement criteria threshold;
   place page information associated with the high-risk page on a retired page list, wherein the retired page list has a size corresponding to a number of spare pages stored in a reserved space of a RAM;
   store identical data to data stored in the high-risk page in a spare page; and
   identify, in a mapping of the plurality of memory pages, the high-risk page such that one or more references to the high-risk page in the mapping are rerouted to the spare page.

* * * * *